(12) United States Patent
Tachi et al.

(10) Patent No.: US 10,739,858 B2
(45) Date of Patent: Aug. 11, 2020

(54) TACTILE INFORMATION CONVERSION DEVICE, TACTILE INFORMATION CONVERSION METHOD, AND TACTILE INFORMATION CONVERSION PROGRAM

(71) Applicant: JAPAN SCIENCE AND TECHNOLOGY AGENCY, Saitama (JP)

(72) Inventors: Susumu Tachi, Tokyo (JP); Masashi Nakatani, Kanagawa (JP); Katsunari Sato, Nara (JP); Kouta Minamizawa, Kanagawa (JP); Hiroyuki Kajimoto, Tokyo (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 0 days.

(21) Appl. No.: 16/152,982

(22) Filed: Oct. 5, 2018

(65) Prior Publication Data
US 2019/0064927 A1 Feb. 28, 2019

Related U.S. Application Data

(63) Continuation of application No. PCT/JP2017/014570, filed on Apr. 7, 2017.

(30) Foreign Application Priority Data

Apr. 7, 2016 (JP) ................................ 2016-077692

(51) Int. Cl.
*G06F 3/01* (2006.01)
*B25J 13/02* (2006.01)
(Continued)

(52) U.S. Cl.
CPC ............. *G06F 3/016* (2013.01); *B25J 13/025* (2013.01); *B25J 13/084* (2013.01); *G06F 3/01* (2013.01);
(Continued)

(58) Field of Classification Search
CPC ........... G06F 3/011; G06F 3/014; G06F 3/016
See application file for complete search history.

(56) References Cited

U.S. PATENT DOCUMENTS 6,016,385 A * 1/2000 Yee ............................ B25J 3/04
700/245
6,126,373 A * 10/2000 Yee .......................... B25J 13/02
414/5
(Continued)

FOREIGN PATENT DOCUMENTS

JP 2010287221 A 12/2010
JP 2011086068 A 4/2011
(Continued)

OTHER PUBLICATIONS

Chikai, Study of a New Haptic Device (Partial English translation), Feb. 2014.*
(Continued)

*Primary Examiner* — Andrew W Bee
(74) *Attorney, Agent, or Firm* — Muncy, Geissler, Olds & Lowe, PC

(57) ABSTRACT

The purpose is to provide a tactile information conversion device, a tactile information conversion method, and a tactile information conversion program, which are usable for general purposes by presenting or sensing an arbitrary tactile feeling. In order to provide tactile information to an output unit capable of outputting physical quantities including electricity, force, temperature, vibration, and/or time and space, at least two or more of the physical quantities are
(Continued)

selected according to a tactile feeling to be presented, tactile information for presenting the predetermined tactile feeling is generated based on the physical quantities that have been selected, and the tactile information that has been generated is output to the output unit.

8 Claims, 28 Drawing Sheets

(51) Int. Cl.
      *B25J 13/08*       (2006.01)
      *G06N 20/00*       (2019.01)
      *G06F 3/0354*     (2013.01)
      *G06F 3/041*       (2006.01)
      *H03K 17/96*       (2006.01)

(52) U.S. Cl.
      CPC .......... *G06F 3/015* (2013.01); *G06F 3/03547* (2013.01); *G06F 3/0414* (2013.01); *G06N 20/00* (2019.01); *H03K 17/9618* (2013.01); *H03K 2217/96062* (2013.01)

(56) References Cited

U.S. PATENT DOCUMENTS

| | | | | |
|---|---|---|---|---|
| 10,292,780 | B2* | 5/2019 | Park | A61B 34/30 |
| 2002/0133264 | A1* | 9/2002 | Maiteh | G05B 19/4097 |
| | | | | 700/182 |
| 2004/0077975 | A1* | 4/2004 | Zimmerman | A61B 5/1116 |
| | | | | 600/595 |
| 2006/0106369 | A1* | 5/2006 | Desai | A61B 34/70 |
| | | | | 606/1 |
| 2010/0073150 | A1* | 3/2010 | Olson | A61B 34/30 |
| | | | | 340/407.1 |
| 2013/0046438 | A1* | 2/2013 | Summer | A61G 5/10 |
| | | | | 701/36 |
| 2013/0103703 | A1* | 4/2013 | Han | H04N 21/4126 |
| | | | | 707/755 |
| 2014/0168073 | A1* | 6/2014 | Chizeck | G06F 3/016 |
| | | | | 345/156 |
| 2014/0333573 | A1* | 11/2014 | Hong | G06F 3/016 |
| | | | | 345/174 |
| 2015/0290795 | A1* | 10/2015 | Oleynik | G05B 19/42 |
| | | | | 700/257 |
| 2017/0144312 | A1* | 5/2017 | Hamdi | B25J 13/025 |
| 2017/0272842 | A1* | 9/2017 | Touma | G08C 17/02 |

FOREIGN PATENT DOCUMENTS

| | | |
|---|---|---|
| JP | 2013091114 A | 5/2013 |
| WO | WO 2012/073733 A1 | 6/2012 |

OTHER PUBLICATIONS

Kajimoto et al. Tactile Feeling Display using Functional Electrical Stimulation. ICAT 99. 1999. 8 pages.

Chikai. Study of a New Haptic Device. Feb. 2014. 113 pages. Nagaoka University of Technology. Nagaoka, Japan.

Ando et al. A study of the Nail Mounted Tactile Display for Augmented Reality System. Augmented Reality.Nov. 2004. pp. 2025-2033. 87-11.

Tachi et al. Electrocutaneous Communication in a Guide Dog Robot (MELDOG). IEEE Transaction on Biomedical Engineering. Jul. 1985. 10 pages. 7.

Tanie et al. Basic Study on Discriminability of Mental Location of Electrocutaneous Phantom Sensation. Sep. 18, 1978. pp. 91-98.

Yamaoka et al. Basic Analysis of Stickiness Sensation for Tactile Displays. EuroHaptics. 2008. pp. 427-436.

Sato and Tachi. Design of Electrotactile Stimulation to Represent Distribution of Force Vectors. IEEE Haptics Symposium 2010. Mar. 25-26, 2010. pp. 121-128.

Mohri. International Preliminary Report on Patentability. Oct. 9, 2018. 5 pages. With English Translation. (11 pages).

WIPO. International Search Report. Jul. 7, 2017. 3 pages. With English translation (5 pages).

\* cited by examiner

FIG. 8A
FIG. 8B
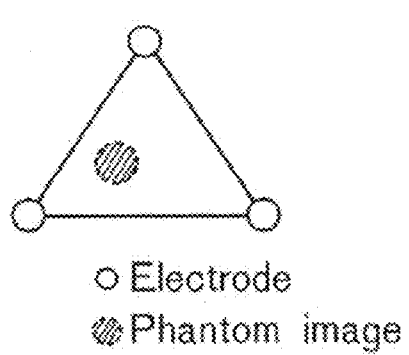
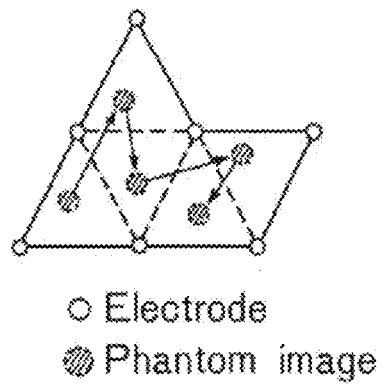
FIG. 9
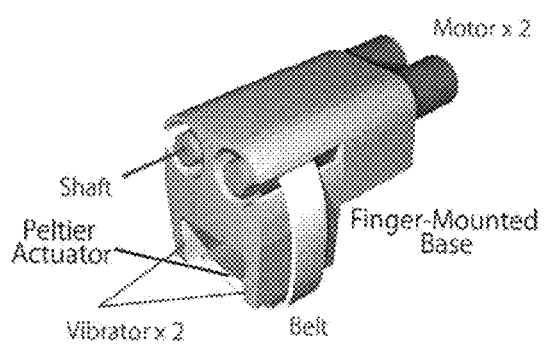

PRESS CONDITION

RELEASE CONDITION

PRESS CONDITION

RELEASE CONDITION

TACTILE INFORMATION CONVERSION DEVICE, TACTILE INFORMATION CONVERSION METHOD, AND TACTILE INFORMATION CONVERSION PROGRAM

BACKGROUND OF THE INVENTION

1. Field of the Invention

The present invention relates to a tactile information conversion device, a tactile information conversion method, and a tactile information conversion program.

2. Description of the Related Art

In the related art, tactile sensation presentation devices have been developed that present a tactile sensation for a real or virtual object to a user.

For example, Patent Document 1 discloses a pen-type force sensation presentation device that presents, by allowing for motions such as a reciprocating motion, a swinging motion, a tilting motion, a rotation, and the like at a movable part where a fingertip touches when a user holds the device, proprioception to the fingertip.

In addition, Non-Patent Document 1 discloses a tactile sensation presentation device that creates a tactile map using pressure, vibration, and temperature as elementary tactile sensations and synthesizes the element tactile sensations so as to present an arbitrary tactile sensation.

In addition, Non-Patent Document 2 discloses that a vibrator provided on the nail side is vibrated at the time of a finger stroking operation in a real environment so as to present a virtual sense of unevenness.

Patent Document 1: Japanese Patent Application Publication No. 2010-287221

Non-Patent Document 1: Chikai, Manabu, "Study on New Tactile Sense Presentation Devices", Nagaoka University of Technology doctoral thesis, Nagaoka University of Technology Nagaoka University of Technology, Mar. 25, 2014, 13102 No. 702, URL: http://hdl.handle.net/10649/719

Non-Patent Document 2: Ando, Hideyuki, Watanabe, Junji, Inami, Masahiko, Sugimoto, Maki, Maeda, Taro, "A Study of the Nail-Mounted Tactile Display for Augmented Reality System", Journal of the Institute of Electronics, Information and Communication Engineers, the Institute of Electronics, Information and Communication Engineers, Nov. 1, 2004, Vol. J87-D2, No. 11, pp. 2025-2033

SUMMARY OF THE INVENTION

However, conventional tactile sensation presentation devices are of ad-hoc technology specialized for presenting each tactile feeling, and there is a problem, e.g., that they cannot select and output an arbitrary tactile feeling expressed by onomatopoeia.

For example, although Patent Document 1 can present proprioception using motions such as a reciprocating motion, a swinging motion, a tilting motion, a rotation, and the like, there is a problem that various cutaneous sensations and tactile feelings cannot be presented using combinations of these motions. In Non-Patent Document 1, a tactile map is created with three axes of pressure, temperature, and vibration so as to present an arbitrary tactile sensation. However, there is a problem that tactile feelings such as a sticky feeling and a sticky and springy feeling cannot be presented in principle using a combination thereof. In Non-patent Document 2, although it is possible to reproduce edge perception of irregularities by generating an appropriate impulse stimulation on a finger pad by applying a vibration stimulus from above the nail at the time of tracing an object with a finger, there is a problem that this is a presentation method specialized in an irregularity sensation among skin tactile information and it is thus impossible to present various tactile feelings.

In this background, the present invention provides a tactile information conversion device, a tactile information conversion method, and a tactile information conversion program, which are usable for general purposes by presenting or sensing an arbitrary tactile feeling.

In order to achieve such a purpose, a tactile information conversion device according to the present invention comprises at least a control unit in order to provide tactile information to an output unit capable of outputting physical quantities including at least electricity and including force, temperature, vibration, and/or time and space, wherein the control unit includes: a generation unit that selects at least two or more of the physical quantities according to a tactile feeling to be presented and also generates tactile information for presenting the predetermined tactile feeling based on the physical quantities that have been selected; and an output control unit that outputs the tactile information generated by the generation unit to the output unit.

The tactile information conversion device according to the present invention is the above tactile information conversion device, wherein the outputting of electricity out of the physical quantities is the presentation of an electrical stimulus to a tactile receptor.

The tactile information conversion device according to the present invention is the above tactile information conversion device, wherein the tactile feeling represents a psychological texture.

The tactile information conversion device according to the present invention is the above tactile information conversion device, wherein, when presenting a tactile feeling due to a temporal change in force, the generation unit selects at least the electricity and time and space physical quantities and generates tactile information for presenting the predetermined tactile feeling based on the physical quantities that have been selected.

The tactile information conversion device according to the present invention is the above tactile information conversion device, wherein the generation unit generates the tactile information such that a stimulus by electricity, force, or vibration that is stronger than that in the case of a hard surface or a stimulus by electricity, force, or vibration in an area wider than that in the case of a hard surface is applied in the process of transition or the process of body displacement from a non-contact state to a contact state, and wherein the output control unit presents a soft psychological texture based on the tactile information generated by the generation unit.

The tactile information conversion device according to the present invention is the above tactile information conversion device, wherein the generation unit generates the tactile information such that a stimulus by electricity, force, or vibration that is stronger than that in the case of a hard surface or a stimulus by electricity, force, or vibration in an area wider than that in the case of a hard surface is applied in the process of transition or the process of body displacement from a contact state to a non-contact state, and wherein the output control unit presents a sticky psychological texture based on the tactile information generated by the generation unit.

The tactile information conversion device according to the present invention is the above tactile information conversion device, wherein the body means a finger.

The tactile information conversion device according to the present invention is the above tactile information conversion device, wherein the psychological texture represents a psychological quantity that is integratedly perceived in the brain based on information obtained by a plurality of different tactile receptors of a human body.

An input device according to the present invention comprises the above tactile information conversion device.

The input device according to the present invention comprises at least: a multipoint distribution type pressure sensation measurement sensor on a surface layer; a warm/cold feeling measurement sensor in an intermediate layer; and a vibration feeling measurement sensor in a lower layer.

A transmission device according to the present invention comprises the above tactile information conversion device.

A storage device according to the present invention comprises the above tactile information conversion device.

A server device according to the present invention comprises the above tactile information conversion device.

A receiving device according to the present invention comprises the above tactile information conversion device.

An output device according to the present invention comprises the above tactile information conversion device.

The output device according to the present invention comprises, in the above output device, at least: a distribution-type pressure presentation unit using a multipoint electrical tactile sensation stimulus on a surface layer; a high-speed driving type warm/cold feeling presentation unit using a Peltier element in an intermediate layer; and a vibration presentation unit of a wide frequency range in a lower layer.

An interaction operation system according to the present invention is an interaction operation system comprising the above tactile information conversion device that teaches motion to a robot by using a robot teaching device operated by an operator, wherein the robot has: a finger portion for holding an object; an object detection unit that detects the object or the characteristics of the object and generates object detection information and that is arranged in the finger portion; and a robot driving device that drives the robot, and wherein the robot teaching device has: an object detection sensation providing unit that provides a corresponding tactile feeling to the operator in accordance with tactile information converted by the tactile information conversion device based on the object detection information transmitted from the robot.

A tactile sensation presentation method according to the present invention is a tactile information conversion method performed in a tactile information conversion device comprising at least a control unit in order to provide tactile information to an output unit capable of outputting physical quantities including at least electricity and including force, temperature, vibration, and/or time and space, comprising: selecting at least two or more of the physical quantities according to a tactile feeling to be presented and also generating tactile information for presenting the predetermined tactile feeling based on the physical quantities that have been selected; and outputting the tactile information generated by, the selecting of at least two or more of the physical quantities and the generating of tactile information, to the output unit, which are performed by the control unit.

A tactile information conversion program according to the present invention comprises, in order to provide tactile information to an output unit capable of outputting physical quantities including at least electricity and including force, temperature, vibration, and/or time and space, computer-implemented modules including: a generation module that selects at least two or more of the physical quantities according to a tactile feeling to be presented and also generates tactile information for presenting the predetermined tactile feeling based on the physical quantities that have been selected; and an output control module that outputs the tactile information generated by the generation module to the output unit.

A tactile information conversion device according to the present invention comprises at least a control unit in order to provide tactile information to an output unit capable of outputting physical quantities including electricity, force, temperature, vibration, and/or time and space, wherein the control unit includes: a generation unit that selects at least one of the physical quantities in accordance with a tactile feeling to be presented and also generates tactile information for presenting the predetermined tactile feeling based on the physical quantities that have been selected; and an output control unit that outputs the tactile information generated by the generation unit to the output unit, wherein the generation unit selects the physical quantity in association with at least two axes among a roughness and smoothness axis according to force, a hardness and softness axis according to vibration, and a dryness and wetness axis according to temperature in accordance with the tactile feeling to be presented.

The tactile information conversion device according to the present invention is the above tactile information conversion device, wherein the generation unit conducts learning by updating the physical quantity detected by the detection unit for a sample with an already-known tactile feeling and the tactile feeling in association with each other on a map of the at least two axes.

The tactile information conversion device according to the present invention is a tactile information conversion device comprising at least a detection unit and a control unit in order to obtain tactile information, wherein the detection unit is capable of detecting physical quantities including force, temperature, vibration, and/or time and space, and wherein the control unit acquires the tactile information for presenting a corresponding tactile feeling by making association with at least two axes among a roughness and smoothness axis according to force, a hardness and softness axis according to vibration, and a dryness and wetness axis according to temperature based on the physical quantities detected by the detection unit.

The tactile information conversion device according to the present invention is the above tactile information conversion device, wherein the control unit conducts learning by updating a map of the at least two axes in which the physical quantity detected by the detection unit for a sample with an already-known tactile feeling and the tactile feeling are associated with each other.

The present invention achieves an effect of presenting an arbitrary tactile feeling and being able to be used for general purposes since tactile information is generated based on physical quantities including at least electricity and including force, temperature, vibration, and/or time and space in accordance with a tactile feeling to be presented and the tactile information that has been generated is output in order to provide the tactile information to an output unit capable of outputting the tactile information. In particular, the present invention achieves an effect of being able to present cutaneous sensations that cannot be reproduced using a reciprocating motion, a rotational movement, or the like by a driving unit and various tactile feelings such as psychological texture, e.g., a sticky and springy feeling and a sticky feeling that cannot be reproduced using pressure, temperature, and vibration.

Further, according to the present invention, in the case of generating tactile information using, as bases, physical quantities including electricity, force, temperature, vibration, and/or time and space in accordance with a tactile feeling intended to be presented, a physical quantity is selected in association with at least two axes among a roughness and smoothness axis according to force, a hardness and softness axis according to vibration, and a dryness and wetness axis according to temperature in accordance with the tactile feeling intended to be presented in order to provide the tactile information to an output unit capable of outputting the tactile information. Thus, the present invention achieves an effect of, for example, presenting various arbitrary tactile feelings on an onomatopoeia map and being able to be used for general purposes. In contrast, by switching the output and the input and making association with at least two axes among the roughness and smoothness axis according to force, the hardness and softness axis according to vibration, and the dryness and wetness axis according to temperature based on a physical quantity obtained by a detection unit, for example, it is also possible to sense various tactile feelings on the onomatopoeia map.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which:

FIGS. 8A and 8B are diagrams showing perceptual points due to phantom sensation illusion;

FIG. 9 is a diagram showing the appearance of a finger-mounted sensor/actuator of a tele-existence robot called TELESAR V developed by the present inventors;

DETAILED DESCRIPTION OF THE INVENTION

Figure 1:
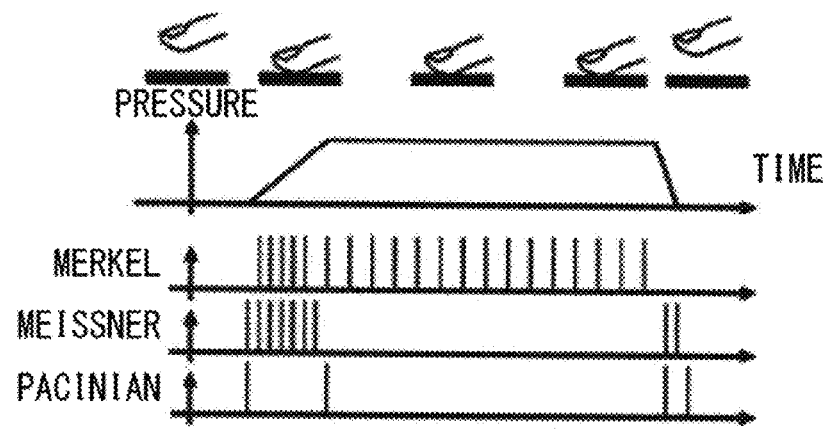
FIG. 1 is a schematic diagram showing the reaction of each cell when a finger is brought into contact with the object and slid on the object or released after being kept still.

Embodiments of a tactile information conversion device, a tactile information conversion method, a tactile information conversion program, and a recording medium according to the present embodiment of the present invention will be described in detail in the following with reference to the figures. It should be noted that the present invention is not limited by these embodiment. For example, although an example in which a feature of the tactile information conversion device according to the present invention is connected to an input unit such as a sensor or an output unit that outputs a tactile stimulus or the like may be described in the following embodiments, the present invention is not limited to this, and the feature may be formed as a feature of an independent server device or the like that is not directly connected to the input unit or the output unit. In addition, the present invention may be formed as a part of an input device, a transmitter, a memory device, a receiver, an output device, or the like, or as a converter installed between these devices.

Overview of the Present Embodiment

In the following, for the purpose of explaining the outline of the embodiment of the present invention, a background and an outline leading to the devising of the embodiment of the present invention will be described first, and then the details of the configuration, processes, etc., of the present embodiment will be described in detail. It should be noted that the outline of the present embodiment shows the background and the outline leading to the devising of the embodiment of the present invention and does not limit the present invention.

As the background in which the embodiment of the present invention has been devised, it has been known that human sensation can be divided into a "specific sensation" and a "somatic sensation". A specific sensation refers to a sensation for which there exists a corresponding special sensory organ, such as an eye for a visual sensation, an ear for an auditory sensation, and the like. For example, an "acceleration" sensation is classified as a special sensation in the sense that the sensation corresponds to an ear, in particular, sensory organs such as semicircular canals, a utricle, and a saccule, which serve as a vestibule inside the ear.

On the other hand, a somatic sensation means a body segmental sensation and is roughly divided into a cutaneous sensation, which comes from the skin, and a proprioception sensation, which is a sensation relating to postures and movements that come from internal muscles and tendons. A proprioception sensation is also called a proprioceptive sensation.

The term "tactile sensation" in a broad sense means the entire somatic sensations, which includes cutaneous sensations and proprioception sensations, and the term "tactile sensation" used in the present embodiment means a tactile sensation in the broad sense. Meanwhile, the term "tactile sensation" in a narrow sense means only a touch sensation and a pressure sensation among cutaneous sensations, which include various sensations such as warmth, coldness, pain, etc. These touch sensation and pressure sensation correspond to sensory organs such as Merkel cells, Meissner's corpuscles, Pacinian corpuscles, and Ruffini endings in the skin. When the entire skin is dented or pulled, the skin's deformation and vibration are transmitted to the sensory organs, and a sensation occurs.

Further, there is also a comprehensive sensation with a proprioception sensation that occurs due to stimulation of not only the skin but also the sensory receptors such as the muscle spindle of a muscle, the Golgi receptor of a tendon, and the like caused by touching as a result of moving the body, which is referred to as active touch. Therefore, a tactile sensation in a broad sense can be considered to be the integration of a wide variety of sensations including not only a simple sensation indicating whether or not something is touching, which corresponds to one sensory organ, but also proprioception sensations. As an example, an explanation will be given of a process in which a person recognizes a certain object, e.g., an iron ball through the tactile sensation in the broad sense. First, a person learns the shape through touching. However, even when a person touches an iron ball through thick gloves that are put on the fingers instead of directly touching the iron ball with the fingers, the person can predict that the iron ball is a "sphere" based on information indicating how the joints of the arms, the hands, and the fingers have moved and what kind of shape has been obtained. As is also predictable from this, the recognition of a rough shape is made not through the skin but through proprioception of muscle spindles, Golgi receptors, etc. In addition to a rough shape, feeling hardness or spring-like repulsive force and sensation for, e.g., resistance that occurs when moving an arm in water also come from proprioception.

Cutaneous sensation is for recognizing a finer shape pattern of a surface called "texture". This sensation does not occur when thick gloves are on, and it is important to touch directly with the skin. This sensation is further improved in recognition accuracy through active touch described above. This tactile sensation, in which the proprioception sensation and the cutaneous sensation come together, accompanied with movements is referred to as haptic perception or haptics. The ball cannot be recognized to be of iron just by holding and touching the ball. However, cutaneous sensation for feeling warmth and coldness in addition to the texture greatly contributes to the recognition that the ball is of a metal. In the following description of the present embodiment, tactile sensation may particularly indicate cutaneous sensation. However, tactile sensation is not limited to this and may also include proprioception sensation.

In order to convey a sensation obtained when a person directly touches a certain object with the surface of the finger, it is difficult to treat a tactile sensation as a medium if an object that is completely the same as the actual object is not reproduced on the surface of the person's finger. For example, in the case of visual sensation, even if the color of an object is different from that of the actual spectrum, since a person can see the same color as long as the pyramidal cells respectively being in charge of the three primary colors of RGB of the person fire in the same manner, this principle is applied to the current TV sets, color photos, and color prints.

The inventors of the present invention consider that tactile sensation should be able to be used as an information medium in the same way as in the visual sensation as long as there exist haptic primary colors for the tactile sensation just like the three primary colors of light. One of the facts that supports the existence of the haptic primary colors is the fact that there are distinctly different types of cutaneous sensory organs in the tactile sensation of a person. In other words, similar to the RGB pyramidal cells corresponding to the three primary colors, there exist Merkel cells, Meissner's corpuscles, Pacinian corpuscles, Ruffini endings, etc., which correspond to haptic primary colors also in tactile sensation. There also exit free nerve endings that react to warmth, coldness, and pain. As a result of conventional neurophysiology study, it is known that Merkel cells and Ruffini endings detect pressure and shear force, that Meissner's corpuscles detect low frequency vibration, and that Pacinian corpuscles detect high frequency vibration. FIG. 1 is a schematic diagram showing the reaction of each cell when a finger is brought into contact with an object and slid on the object or released after being kept still. The horizontal axis represents time, and the vertical axis indicates the excitation state of each cell.

As shown in FIG. 1, when coming into contact with an object, Merkel cells detect pressure, Meissner's corpuscles detect low frequency vibration, and Pacinian corpuscles detect high frequency vibration, and thereby the pressure, the low frequency vibration, and the high frequency vibration can be perceived by giving meanings to the displacement, the velocity, and the acceleration by the Merkel cells, the Meissner's corpuscles, and the Pacinian corpuscles, respectively. Not limited to a flat surface as shown in the figure, real objects have many physical properties such as concavo-convex shape, friction, heat, and elasticity. Considering a situation where a cutaneous sensation occurs, when touching an object, force, vibration, temperature change, etc., occur on the skin surface and are transmitted to the inside of the skin, and the above-stated sensory organs react, causing a tactile sensation. Therefore, the inventors of the present invention consider that, if it is possible to cause each sensory organ to have a reaction that is the same as the reaction occurring when touching the object, the person has the same tactile sensation as if the person were touching the actual object, regardless of the physical properties of the object such as concavo-convex shape, friction, heat, and elasticity. In other words, the inventors of the present invention consider that, if it is possible to react cells that correspond to the haptic primary colors in a tactile sensation in the same manner as in a visual sensation, only the tactile sensation can be reproduced and used as an information medium just like a visual sensation without reproducing and presenting the actual object.

In this case, there are roughly two ways to cause the sensory organs to fire in the same manner. The first method is to find bases in the physiological space and then selectively cause the sensory organs, which serve as the bases, to fire through electrical stimulation. In the present embodiment, the term "base" means a constituent unit or an element. Since an invasive method where electrodes are implanted at the locations of all the sensory organs so as to provide stimulation is not practical, one possible option is a method where transcutaneous electrostimulation through the skin surface is used and where the sensory organs (e.g., tactile receptors) are selectively stimulated (see, for example, Japanese Patent No. 3543097 by the present inventor). This method was developed by the inventors of the present application, and, for example, it allows only Meissner's corpuscles to be selectively stimulated through an anodal stimulus and allows Merkel cells to be stimulated via skin electrodes through electrical stimulation of the cathode such that a sensation similar to a pressure sensation can be transmitted. However, there is a problem that selective stimulation cannot be made for the Pacinian corpuscles and selective stimulation cannot be made for warmth and coldness, either. Further, even a stimulus that does not originally generate a pain sensation may cause a pain sensation due to an electrical stimulus. Therefore, the first method has not reached the point where general stimulation can be provided as a method of directly and selectively stimulating the cells serving the bases of a physiological space.

Figure 2:
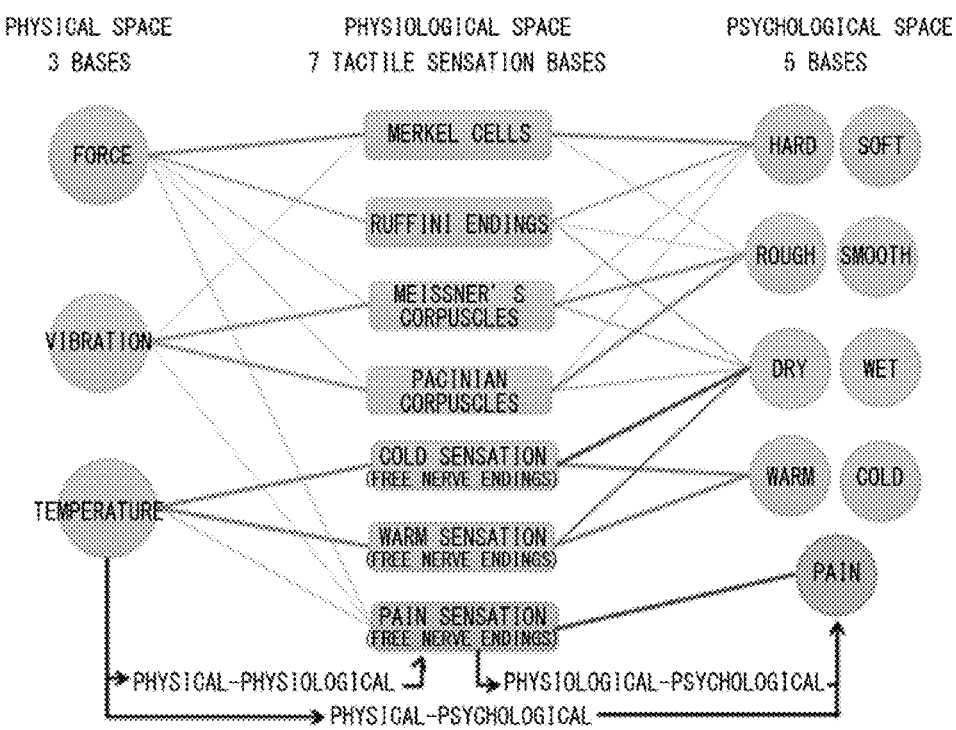
FIG. 2 is a diagram schematically showing a second method for synthesizing three bases "force", "vibration", and "temperature" so as to stimulate seven tactile sensation bases in a physiological space.

The second method is a method of selecting bases in a physical space by a method that is equivalent to a method where RGB in visual sensation are used as bases. FIG. 2 is a diagram schematically showing the second method for synthesizing three bases "force", "vibration", and "temperature" so as to stimulate seven tactile sensation bases in a physiological space. Merkel cells and Ruffini endings respond to pressure and shear force, Meissner's corpuscles respond to low frequency vibrations, Pacinian corpuscles respond to high frequency vibrations, and free nerve endings respond to warmth, coldness, and pain. Thus, a person ends up obtaining a feeling that is the same as the actual feeling as long as the pressure and shear force, i.e., "force" serving as a vector force, "vibration" of from a low frequency to a high frequency, and "temperature" at the skin surface of the person obtained when touching the actual object can be presented in the same way even when the person is not actually touching the object. Forces and vibrations often change due to active movements of the person. However, in that case, the forces and vibrations need to be reproduced while following the movements of the person. This method is considered to be similar to a method where, in visual sensation, not all spectra of light are reproduced and only spectra corresponding to RGB are used as bases such that almost all visual information is reproduced by synthesis based on those bases. In other words, the inventors of the present application consider that, instead of reproducing all physical properties such as concavo-convex shape, friction, heat, and elasticity of an object, it is only necessary to record and transmit, using as bases only the three physical quantities of "force", "vibration", and "temperature" that occur on the skin surface due to contact with the object and that are captured by receptor cells, temporal changes of the bases and perform synthesis based on these bases. In other words, the inventors of the present application have proceeded with the development of this second method as a basic form of the haptic primary color principle.

Figure 3:
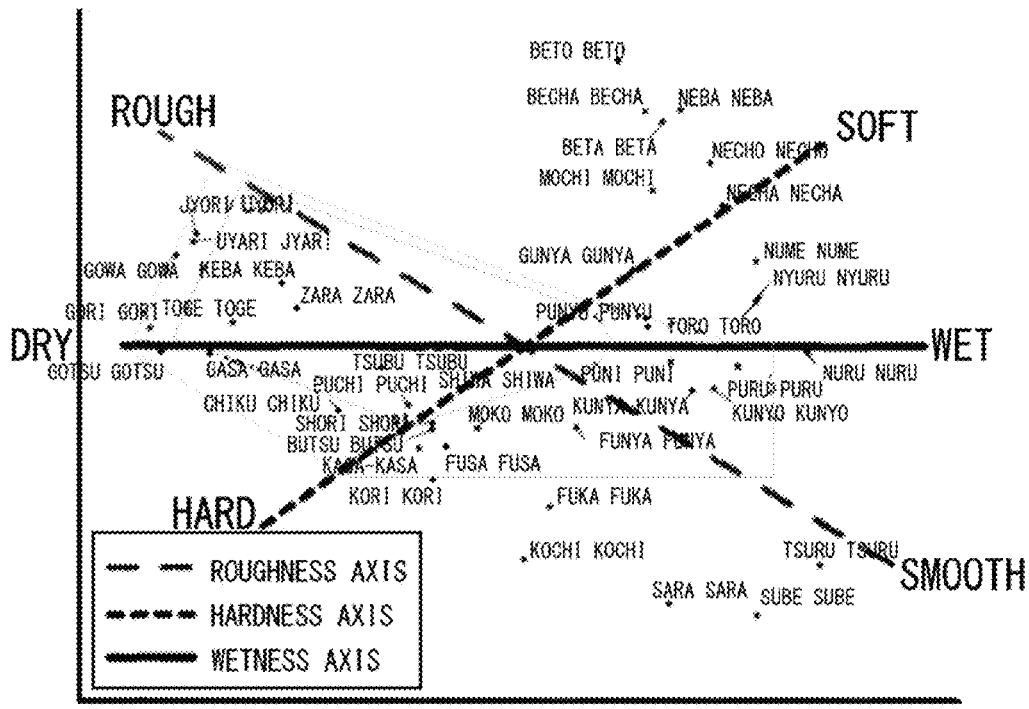
FIG. 3 is a diagram showing an example of a psychological texture map in which various onomatopoeias are positioned on a map with three axes: a roughness axis; a hardness axis; and a wetness axis.

The inventors of the present application consider that there remain problems toward miniaturization in the method based on "force", "vibration", and "temperature" and that even more intensive study is necessary. In other words, for the presentation of "force", it is necessary to prepare a fixed place (ground) for exerting a force at a location different from a point where the force is applied, due to the characteristics of the force physical quantity. For example, in order to apply force to the finger pad, grounding needs to be done at a part such as the back side of the finger, and the force needs to be applied from there. In this case, when preparing a presentation device itself, the device cannot be put only in the vicinity of a stimulation site thereof. Therefore, a comparatively large space is inevitably required, which is a huge restriction in miniaturizing the device. Also, in general force presentation to the skin surface, there remains the problem that, even though pressure in the pushing direction can be presented, force in the pulling direction cannot be presented. If the force in the pulling direction cannot be presented, for example, it is difficult to present a variety of psychological textures expressed by onomatopoeia such as a necho-necho feeling (a sticky and wet feeling). FIG. 3 is a diagram showing an example of a psychological texture map in which various onomatopoeias are positioned on a map with three axes: a roughness axis; a hardness axis; and a wetness axis.

Figure 4:
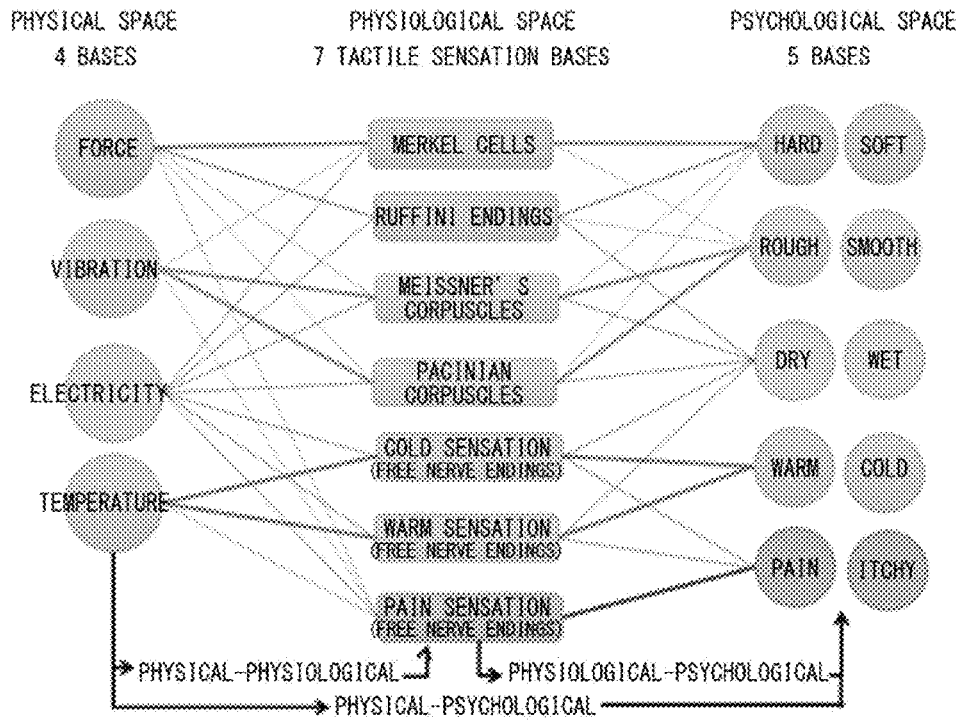
FIG. 4 is a diagram schematically showing a method according to the present embodiment for performing synthesis based on four bases: "force"; "vibration"; "temperature"; and "electricity", in a physical space so as to reproduce various tactile feelings in a psychological space.

An embodiment according to the present invention has been devised as a result of intensive study by the inventors of the present application in view of the various problems described above, and the problems are to be overcome by including "electricity" as a base in addition to the three bases: "force", "vibration"; and "temperature". That is, the first method and the second method are combined so as to compensate for each other's disadvantages. FIG. 4 is a diagram schematically showing a method according to the present embodiment for performing synthesis based on four bases: "force"; "vibration"; "temperature"; and "electricity", in a physical space so as to reproduce various tactile feelings in a psychological space.

In the present embodiment, all the "force" may be replaced with "electricity" so that synthesis is performed based on the three bases while having zero involvement of "force" among the four bases. Further, the present embodiment is not limited to this, and a spatiotemporal element of "time" and/or "space" may be further added to the bases. Electricity is not generated during the contact with the actual normal object except for a special case where static electricity is felt. However, since electricity is an obvious physical quantity, electricity is a base in the physical space.

Since this electrical stimulus causes a pressure sensation, a vibration sensation, and even a pain sensation, etc., it is a major feature of the present embodiment that the electrical stimulus has an effect on tactile feelings based on the five bases in the psychological space depending on the way the electrical stimulus is applied. In other words, instead of proving an approach of stimulating tactile sensation according to the seven bases in the physiological space based on the bases in the physical space, this embodiment provides an approach of combining a plurality of bases in the physical space including electricity so as to reproduce a variety of tactile feelings based on the five bases in the psychological space. For example, by appropriately selecting a plurality of bases in the physical space including electricity and creating tactile information for presenting a predetermined tactile feeling based on the selected physical quantity, it is possible to reproduce a psychological texture that is expressed by onomatopoeia, in other words, a psychological quantity integratedly perceived in the brain from the information obtained by a plurality of different tactile receptors of a human body. This makes it possible to present a tactile feeling that works on tactile ability based on multimodal (multi-sensory type), unlike conventional techniques that simply stimulate tactile sensation. A specific technique of presenting a psychological texture that is expressed by onomatopoeia will be described later.

According to an embodiment of the present invention, the range of feelings that can be presented only by conventional force, vibration, and temperature can be greatly widened, in particular, by providing feelings such as hardness and softness, dryness and wetness, and the like. Further, when it is difficult to present the force, it is possible to substitute electricity for the presentation of force. Thus, it is possible to create a miniaturized multimodal (multi-sensory type) device. One of the major features of the present embodiment is to present a tactile feeling by performing syntheses based on a plurality of bases in the physical space including electricity.

As another embodiment of the present invention, it is not always necessary to use electricity. In other words, according to another embodiment of the present invention, in the case of generating tactile information using, as bases, physical quantities including electricity, force, temperature, vibration, and/or time and space (for example, temporal and/or spatial changes in electricity, force, temperature, and vibration) in accordance with a tactile feeling intended to be presented, a physical quantity is selected in association with at least two axes of a roughness and smoothness axis according to force, a hardness and softness axis according to vibration, and a dryness and wetness axis according to temperature in accordance with the tactile feeling intended to be presented in order to provide the tactile information to an output unit capable of outputting the tactile information. With this, for example, various arbitrary psychological tactile feelings on the onomatopoeic map can be reproduced. By using a map on at least two axes among the roughness and smoothness axis according to force, the hardness and softness axis according to vibration, and the dryness and wetness axis according to temperature, it is possible to sense corresponding psychological tactile feelings based on physical quantities such as force, vibration, temperature, etc., detected by the detection unit.

Described above is the outline of the present embodiment. Next, a detailed example of the configurations of devices and processes for realizing the above-described embodiment of the present invention will be described in detail in the following.

Configuration of Tactile Feeling Presentation System

Figure 5:
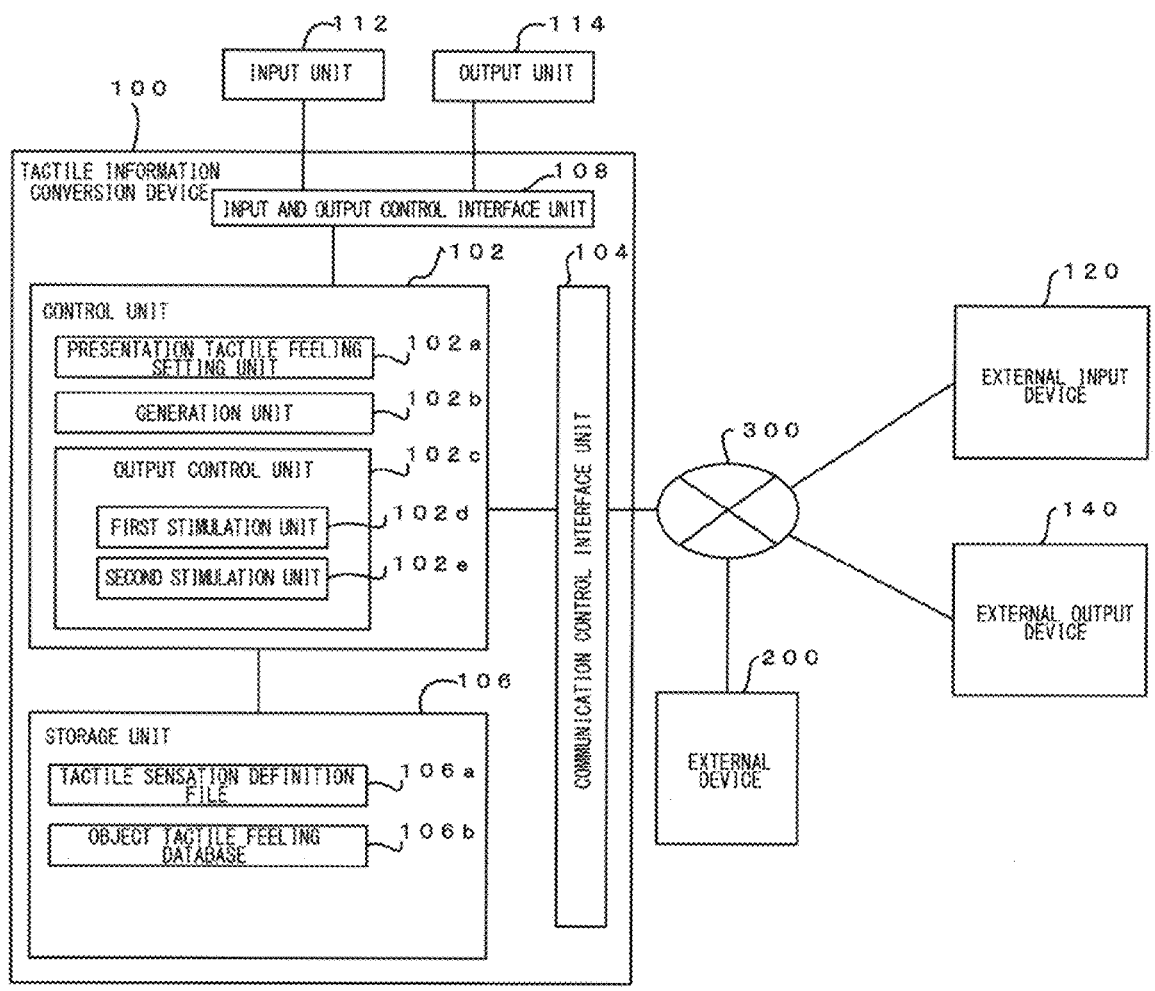
FIG. 5 is a block diagram showing an example of the configuration of a tactile feeling presentation system including a tactile information conversion device according to an embodiment of the present invention.

The configuration of a tactile feeling presentation system including a tactile information conversion device will be described with reference to the figures. FIG. 5 is a block diagram showing an example of the configuration of the tactile feeling presentation system including the tactile information conversion device according to the embodiment of the present invention and conceptually shows only parts of the configuration that are related to the present invention.

As shown in FIG. 5, in the present embodiment, the tactile feeling presentation system includes a tactile information conversion device 100, an external input device 120 such as various sensors, an external output device 140 capable of outputting a physical quantity, and an external device 200 such as a server, which are connected via a network 300. In FIG. 5, an example is shown where the tactile information conversion device 100, the external input device 120, the external output device 140, and the external device 200 are provided, one of each, in the tactile feeling presentation system. However, the tactile feeling presentation system is not limited to this and may include a plurality of each of the devices. The tactile information conversion device 100 is a personal computer, a computer for a server, a portable information terminal (a tablet type computer, etc.), or the like. The network 300 has a function of mutually connecting the tactile information conversion device 100, the external input device 120, the external output device 140, and the external device 200 and is, for example, a wired or wireless LAN, the Internet, or the like.

In FIG. 5, the external input device 120 is an input means such as various sensors. For example, the external input device 120 may be a force sensor, a vibration sensor, or a temperature sensor and may be even a concavo-convex sensor, a surface roughness sensor, a pull-off sensor, a friction sensor, a wetness sensor, a heat conduction sensor, a viscoelastic sensor, an acceleration sensor, or the like. The reason for this is that an object has physical properties such as concavo-convex shape, surface roughness, friction, thermal conductivity, viscosity, elasticity, inertia, wetness, and the like. However, what human cutaneous sensory organs perceive are basically force (deformation of the skin), vibrations, and temperature changes that are generated on the hand or the like when the person touches an object by moving the hand or the like, and thereby tactile feelings are obtained. Therefore, the optimum sensors are force sensors, vibration sensors, and temperature sensors that directly sense these factors. However, robot hands may not necessarily have those sensors. In that case, for example, conversion from the acceleration sensor to force information or vibration information, conversion from the surface roughness sensor to vibration information, or conversion to force, vibration, and temperature through calculation according to a combination of various sensors may be performed. It is best to perform these transformations on the sensor side and use standard communication. However, tactile information conversion may be performed while performing communication without any change.

The external input device 120 may be a recognition device, such as a camera, a touch panel, a motion sensor, or the like, for recognizing a user's movement or an object. More specifically, the external input device 120 may recognize the body movement of a person by an arbitrary detection means such as a camera, a pressure sensor, or the like. For example, the external input device 120 may detect the body movement of the user by using a publicly-known gesture recognition technique, a publicly-known motion sensor, or the like. A gesture can be obtained based on the position and movement of the user in the physical space and can include an arbitrary movement of the user, which is dynamic or static, such as the movement of the arm or the leg or a stationary posture.

As an example of the present embodiment, in the external input device 120, a capture device such as a camera may capture user image data and recognize the user's gesture(s) based on this user image data. More specifically, the external input device 120 may recognize and analyze the gesture(s) made by the user in the user's three-dimensional physical space using a computer environment and transmit motion data of the user that has been interpreted, raw data before the analysis, etc., to the tactile information conversion device 100. As an example, the external input device 120 may be a wearable-type sensor that detects the shape of a finger, the posture of a body, a contact place, a contact area, pressure, vibration, and the like. For example, a sensing technique such as a glove-type sensor of the TELESAR system may be used, which is a tele-existence system capable of transmitting reaction force and temperature to a fingertip developed by the inventors of the present application. The external input device 120 may be provided with a plurality of two-dimensionally arranged force detection sensors, a vibration generation source, a vibration detection sensor, a temperature sensor, a timer, and the like as in an integrated-type tactile measurement module or the like described later. As an example of publicly-known motion recognition means, a Kinect sensor manufactured by Microsoft Corporation, a RealSense sensor manufactured by Intel Corporation, or the like may be used. According to these publicly-known sensing techniques, motion data such as skeleton motion data of a whole body and/or fingers, contact data, etc., can be obtained. In publicly-known motion sensors, the movement of a person is analyzed by using a control means built in the sensors, or the movement and attributes of a person are analyzed by a control means of a computer that is connected. In the present embodiment, either way may be employed, and, for example, these analysis functions may be realized by a control means (processor or the like) of the external input device 120, a control means of the tactile information conversion device 100 that has received the raw data before analysis, or the control means of both in a decentralized manner. In addition, a publicly-known film pressure sensor or the like described in Non-patent Document 2 or the like may be used.

Figure 6:
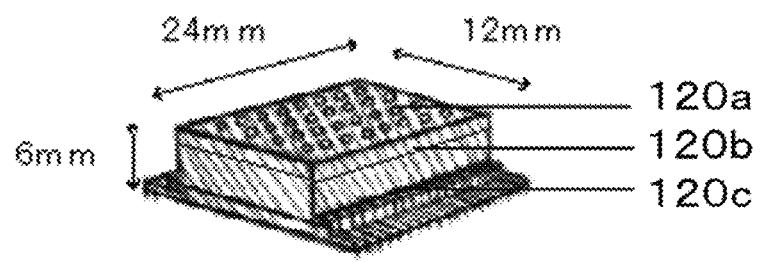
FIG. 6 is a perspective view showing the structure of an integrated-type tactile measurement module based on the haptic primary color principle.
Figure 7:
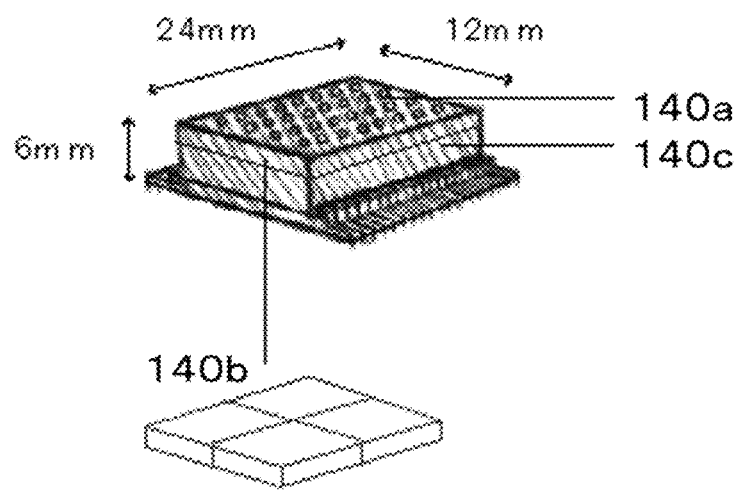
FIG. 7 is a perspective view showing the structure of an integrated-type tactile transmission module based on the haptic primary color principle.

As described above, the external input device 120 may be used to recognize an object from an image captured by a camera or the like and present a tactile feeling according to the object that has been recognized; alternatively, the external input device 120 may be used to present a tactile stimulus at an appropriate timing in accordance with the posture and movement of the body of the user. In addition, the external input device 120 may be used to detect physical quantities such as force, vibration, temperature, the amount of spatiotemporal variations including temporal changes and spatial distribution thereof, a tactile sensation, or a tactile feeling and present a tactile feeling recognized based on a learning result from the physical quantities or the tactile feeling that have been detected or tactile information that has been detected, or may be used as basic data for compensating an error from a sensation quantity so as to present the detected tactile sensation and/or the actual tactile feeling based on the tactile sensation. FIG. 6 is a perspective view showing the structure of an integrated-type tactile measurement module based on the haptic primary color principle. FIG. 7 is a perspective view showing the structure of an integrated-type tactile transmission module based on the haptic primary color principle.

In the haptic primary color principle, tactile sensation is considered as a synthesis of elements: a pressure sensation/a shear force (perceived by Merkel cells and Ruffini endings)/a low frequency vibration sensation (perceived by Meissner's corpuscles)/a high frequency vibration sensation (perceived by Pacinian corpuscles)/a cold sensation/a warmth sensation/a pain sensation (each perceived by free nerve endings), based on spatiotemporal relationships between the elements so as to achieve decomposition and synthesis of the tactile sensation. As shown in FIG. 6 and FIG. 7, the inventors of the present invention have developed modules capable of integrally acquiring and presenting each of elements: force, a vibration sensation, and a coldness and warmth sensation, based on this haptic primary color principle. Both modules have a length of 24 mm, a width of 12 mm, and a height of 6 mm, which are suitable for contact with the finger pad.

In the integrated-type tactile measurement module shown as an example of the external input device 120 in FIG. 6, a 32-point distribution-type pressure sensation measurement sensor 120a is disposed on a surface layer, a warm/cold feeling measurement sensor 120b having a body temperature presentation function is disposed in an intermediate layer below the surface layer, and a vibration feeling measurement sensor 120c in a wide frequency range is disposed in a further lower layer.

In an integrated-type tactile presentation module shown as an example of the external output device 140 in FIG. 7, a distribution-type pressure presentation unit 140a based on 32-point electrical tactile stimulation is disposed on a surface layer and a high-speed driving-type warm/cold feeling presentation unit 140b formed of a matrix of four Peltier elements is disposed in an intermediate layer below the surface layer. A vibration presentation unit 140c of a wide frequency range (HiFi) is disposed in a further lower layer.

Thereby, force, vibration, and temperature that have been considered as individual physical properties thus far and whose transmission have required the combining of a large number of elements can be integrated in a spatiotemporal manner, and the transmission of a tactile sensation with high presence can be achieved. In the related art, there exist several technological problems in realizing a compact tactile transmission module. First, in the related art, in order to present a pressure sensation and a low frequency vibration sensation, an actuator such as a motor or air pressure is generally used to generate a physical force on the skin. However, with such a method, miniaturization of a certain level or more cannot be expected. Therefore, in the present embodiment, by using selective stimulation of a tactile receptor through percutaneous electrical stimulation so as to electrically stimulate nerves connected to Merkel cells, which perceive a pressure sensation, and Meissner's corpuscles, which perceive a low frequency vibration sensation, through the skin, a pressure sensation and a low frequency vibration sensation can be freely generated without any physical stimulation. It is shown that, by changing the stimulation pattern, each of the pressure sensation and the low frequency vibration sensation can be selectively stimulated. For a stimulating electrode, a thin-type high density electric tactile display that uses a flexible printed substrate is used.

It is shown that, due to the human's tactile perception characteristic, 2 mm pitch is enough even for fingertips, which have the smallest two-point discrimination threshold, with respect to pressure sensation presentation. In the integrated-type tactile measurement module according to the present embodiment, by using a flexible substrate and using a thin pressure sensation sensor that allows for multi-point measurement corresponding to the electric tactile display of the integrated-type tactile measurement module, a thin sensor and a display are formed that acquire and present a high density and multi-point pressure sensation. In other words, the distribution-type pressure sensation measurement sensor 120a and the distribution-type pressure presentation unit 140a can realize highly accurate pressure sensation presentation and pressure sensation measurement at 32 points of four rows and eight columns at intervals of 3 mm or less. This module can be applied not only to fingertips but also to any part of a human body surface by making the module compact and integrated. In addition, since the encoding is performed based on the principle of haptic primary colors, general-purpose use is possible.

Regarding the presentation of a high frequency vibration sensation, many vibration actuators have been developed in the past, most of which are designed by setting the resonance frequency in the frequency band of around 200 Hz, which is most easily perceived by people. This is effective in presenting strong stimulation with low power consumption. However, on the other hand, there is a problem that it is not suitable for presenting a delicate tactile feeling including various vibration frequencies generated in a natural touch motion. Therefore, in the vibration presentation unit 140c of the integrated-type tactile presentation module, in order to realize a vibration actuator optimum for vibration sensation presentation, a small vibration actuator capable of presenting a vibration sensation with flat characteristics is used in a wide vibration frequency band of 1 Hz to 1000 Hz. As physiological knowledge of a tactile sensation, it is known that Pacinian corpuscles, which mainly perceive high frequency vibrations, have a large receptive field of about 1 to 2 $cm^2$, and, based on this, the size of the vibration actuator is designed to be 2 $cm^2$. As for the acquisition of a vibration sensation by a vibration feeling measurement unit 120c, a technique for acquiring vibration in a wide frequency band using a vibration microphone has been established, and this technique is applied.

Regarding the presentation of a coldness and warmth sensation, it is known that it is necessary to reproduce the heat transfer between the human skin and the contact object instead of reproducing the absolute temperature in the haptic primary color principle. Therefore, the warm/cold feeling measurement sensor 120b and the warm/cold feeling presentation unit 140b have bidirectionality in the acquisition and presentation of a coldness and warmth sensation, that is, the sensor that acquires a coldness and warmth sensation has a function as a display for reproducing a body temperature equivalent to that of a human. Also, in conventional coldness and warmth sensation transmission, low time responsiveness is considered to be a problem. However, by a high-speed coldness and warmth sensation presentation technique that allows for a temperature change of around 1 Hz by utilizing the coldness and warmth sensation perception characteristic of a human being and arranging and controlling a plurality of temperature presentation elements in a matrix form, the transmission of a warm/cold feeling that changes in a spatiotemporal manner can be realized.

Referring back to FIG. 5 again, the external output device 140 is not limited to the above-described integrated-type tactile presentation module and is an output unit that can output physical quantities including electricity, force, temperature, vibration, time and space, and the like. For example, the external output device 140 may be an output device in which an electric stimulator, a force presentation actuator, a Peltier element, a vibration element, etc., are arranged in a matrix form that is capable of spatiotemporally outputting the physical quantities. The vibrator may be a voice coil type vibrator, a piezo element, or a vibration motor. In addition, the external output device 140 may output the above-mentioned physical quantities using publicly-known electric output means, force presentation means, temperature presentation means, vibration presentation means, or spatiotemporal arrangement means. As an example, the external output device 140 may be provided with a plurality of two-dimensionally arranged pressing means, a vibration generating means, a heat generating means, a timer, a receiving device, and the like as in the integrated-type tactile presentation module described above. For example, an object detection sensation providing technique of the TELESAR system may be used, which is a tele-existence system capable of transmitting reaction force and temperature to a fingertip developed by the inventors of the present application (see, for example, Japanese Patent Application Publication No. 2013-91114).

If the tactile information conversion device 100 does not perform the inputting or outputting of a tactile sensation or the like in real time with the external input device 120 or the external output device 140, the tactile information conversion device 100 does not need to be connected to the network 300 all the time. For example, when the connection is established, the tactile information conversion device 100 may acquire input data stored in the external input device 120 and input data stored in the external device 200 or the like such as a server from the external input device 120. In the same way, when performing tactile presentation, the external output device 140 may be connected to the tactile information conversion device 100 or the external device 200, to which tactile information has been uploaded, to acquire tactile information.

Configuration of Tactile Information Conversion Device 100

Next, the configuration of the tactile information conversion device 100 according to the present embodiment will be described in detail. Referring back to FIG. 5, the illustration shows a block diagram showing an example of the configuration of the tactile information conversion device 100 to which the present embodiment is applied and conceptually shows mainly parts of the configuration that are related to the present invention. In the present embodiment, an example is explained where the tactile information conversion device 100 includes the input unit 112, the output unit 114, and the like. However, the present invention is not limited to this example, and the tactile information conversion device 100, without including the input unit 112, the output unit 114, or the like, may function as a server or the like that generates tactile information and outputs and transmits the tactile information according to a request from the outside.

In FIG. 5, the tactile information conversion device 100 roughly includes a control unit 102 such as a processor (e.g., a CPU) that comprehensively controls the entire tactile information conversion device 100, a communication control interface unit 104 that is connected to a communication device (not shown) such as a router or the like connected to a communication line or the like, an input and output control interface unit 108 connected to the input unit 112 and the output unit 114, and a storage unit 106 for storing various types of databases, tables, and the like, and these units are communicably connected via an arbitrary communication path. The units may be configured to be temporarily connected to be able to communicate via the arbitrary communication path in accordance with a need for inputting and/or outputting by the input unit 112 and the output unit 114. For example, the units may be configured such that the units can temporarily exchange tactile information using a recording medium such as a USB memory or the like.

Various types of databases and tables (for example, a tactile sensation definition file 106a, an object tactile feeling database 106b, etc.) stored in the storage unit 106 are storage means for a small capacity high-speed memory (for example, cache memory) or the like configured using static random access memory (SRAM), a fixed disk drive or the like such as a hard disk drive (HDD) or a solid state drive (SSD), or the like and store various types of programs, tables, files, databases, web pages, etc., used for various types of processes.

Of these, the tactile sensation definition file 106a is a tactile sensation definition means for defining the types of two or more tactile stimuli to be presented. The tactile sensation definition file 106a may store a temporal and/or spatial threshold value with respect to a first stimulation point. For example, the tactile sensation definition file 106a may define a first type of tactile stimulus and a second type of tactile stimulus. More specifically, the tactile sensation definition file 106a may define, as the second type of tactile stimulus, a type of tactile stimulus that is more difficult to physiologically discriminate temporally or spatially than the first type of tactile stimulus. This allows the second type of tactile stimulus to be perceived at the first stimulation point through the processes performed by the output control unit 102c described later. The tactile sensation definition file 106a may define, as the first type of tactile stimulus, a type of tactile stimulus that is more difficult to physiologically discriminate temporally or spatially than the second type of tactile stimulus. This allows the first type of tactile stimulus to be perceived at a second stimulation point through the processes performed by the output control unit 102c described later. In general, it is considered that discrimination becomes more difficult spatiotemporally in the order of the following: force (especially pressure), electricity, vibration, and temperature.

As an example, the tactile sensation definition file 106a may define force presentation as the first type of tactile stimulus and define one or a plurality of stimuli among vibration, temperature, and an electrical stimulus as the second type of tactile stimulus. This allows the vibration, the temperature, and/or the electrical stimulus to be perceived while being positioned at the stimulation point for the force presentation. The same effect can be obtained when the tactile sensation definition file 106a defines one or a plurality of stimuli among vibration, temperature, and electrical stimuli as the first type of tactile stimulus and defines force presentation as the second type of tactile stimulus.

As another example, the tactile sensation definition file 106a may define vibration presentation as the first type of tactile stimulus and define a temperature stimulus as the second type of tactile stimulus. This allows the temperature stimulus to be perceived while being positioned at a stimulation point for the vibration presentation. The same effect can be obtained when the tactile sensation definition file 106a defines the temperature stimulus as the first type of tactile stimulus and defines the vibration presentation as the second type of tactile stimulus.

As another example, the tactile sensation definition file 106a may define electrical stimulus presentation as the first type of tactile stimulus and define vibration and/or temperature as the second type of tactile stimulus. This allows the vibration and/or the temperature stimulus to be perceived while being positioned at the stimulation point for the force presentation. The same effect can be obtained when the tactile sensation definition file 106a defines the vibration, and/or the temperature as the first type of tactile stimulus and defines the electrical stimulus presentation as the second type of tactile stimulus.

The object tactile feeling database 106b is an object tactile feeling accumulation means storing an object and a tactile feeling in association with each other. For example, when an object is recognized in the real world by a publicly-known object recognition technique, or for a virtual object in an extended reality space or a virtual space, the object tactile feeling database 106b defines a tactile feeling to be presented according to the object. As the tactile feeling to be presented, the object tactile feeling database 106b may define a psychological tactile feeling as a psychological quantity or the like that is integratedly perceived in the brain based on information obtained by a plurality of different tactile receptors of the human body. As in a psychological tactile feeling map (onomatopoeic map) shown in FIG. 3 described above, the object tactile feeling database 106b may define a tactile feeling corresponding to an object or a material using a map in which the material, the object, etc., are positioned on a predetermined quantitative axis.

As an example, as shown in the following table, the object tactile feeling database 106b may store a conversion table for converting, in accordance with an object and a tactile feeling, tactile information for input that does not include electricity as a base to tactile information for output that includes electricity as a base. By using this conversion table, for example, a problem that, although pressure in the pushing direction can be presented, force in the pulling direction cannot be presented in general force presentation to a skin surface can be overcome, and the force in the pulling direction can be reproduced by the presentation of a stimulus including electricity such that various psychological textures expressed by onomatopoeia such as, for example, a necho-necho feeling (a sticky and wet feeling) can be presented.

dryness and wetness axis according to temperature. For example, the object tactile feeling database 106b may store a physical space map or the like where a tactile feeling is associated on a map formed of two or three axes among the roughness and smoothness axis according to force, the hardness and softness axis according to vibration, and the dryness and wetness axis according to temperature. The relationship between a tactile feeling and a physical quantity defined by the object tactile feeling database 106b may be stored in advance or may be newly created or updated by a generation unit 102b or the like. For example, the object tactile feeling database 106b may store a map that is updated in which a physical quantity detected by the input unit 112 for a sample with an already-known tactile feeling and the tactile feeling are associated with each other on the above-described map of at least two axes through a learning process of the generation unit 102b. When the correspondence relationship between an object and the tactile feeling of the object is stored in the above-stated object tactile feeling database 106b, the tactile feeling of the sample may be used for learning or the like as teaching data of the tactile feeling of the sample on the assumption that the tactile feeling of the sample is already known.

Information stored in the tactile sensation definition file 106a, the object tactile feeling database 106b, and the like may be downloaded periodically or each time from the external device 200 or the like, and the storage unit 106 may store, in a temporary or non-temporary manner, the information that has been downloaded.

In FIG. 5, the input and output control interface unit 108 controls the input unit 112 such as various types of sensors and the output unit 114 such as an output unit capable of outputting physical quantities or the like. The input unit 112 such as various types of sensors may have the same function as that of the above-described external input device 120. The output unit 114 such as an output unit capable of outputting physical quantities or the like may have the same function as that of the above-described external output device 140. In addition, as the output unit 114, a monitor (including a home TV, a touch screen monitor, etc.), or the like can be used. As the input unit 112, a touch panel, an audio microphone, a keyboard, or the like can be used. As an example, the input unit 112 and the output unit 114 may be an input and output means such as a touch panel in which an output unit 114 such as a liquid crystal panel and an input unit 112 such as a touch position input device are combined. Further, the input and output control interface unit may be connected to a record-

TABLE 1

| | INPUT | | | | OUTPUT | | | |
|---|---|---|---|---|---|---|---|---|
| OBJECT | FORCE | TEMPER-ATURE | VIBRATION | ONOMATOPOEIA | ELECTRICITY | FORCE | TEMPER-ATURE | VIBRATION |
| TOFU | Δ | ◉ | X | FUNYA-FUNYA (SOFT AND FLABBY FEELING) | ○ | Δ | ◉ | X |
| RICE CRACKER | ◉ | X | ◉ | KOCHI-KOCHI (DRY AND HARD FEELING) | ◉ | ◉ | X | ◉ |
| KONNYAKU | ○ | ○ | ○ | PURU-PURU (BOUNCING FEELING) | ○ | ○ | ○ | ○ |
| NATTO | ◉ | Δ | ○ | NEBA-NEBA (STICKY FEELING) | ◉ | ○ | Δ | ○ |

Furthermore, the object tactile feeling database 106b may store a tactile feeling such as a psychological tactile feeling by onomatopoeia in correspondence with parameters on the roughness and smoothness axis according to force, the hardness and softness axis according to vibration, and/or the ing medium such as a USB memory so as to perform data exchange control. In the following embodiment, either the input unit 112 or the external input device 120 may be used as an input means, and in this case, the input units are collectively referred to as input means 112 and 120 in some cases. Similarly, either the output unit 114 or the external output device 140 may be used as an output means, and the output units are collectively referred to as output means 114 and 140 or output units 114 and 140 in some cases.

Further, in FIG. 5, the control unit 102 has a control program such as an OS (Operating System), a program prescribing various processing procedures and the like, and an internal memory for storing required data and is a processor such as a CPU that performs information processing for executing various processes by these programs and the like. The control unit 102 is formed being provided with a presentation tactile feeling setting unit 102a, generation unit 102b, and an output control unit 102c in a functionally conceptual manner.

Of these, the presentation tactile feeling setting unit 102a is a presentation tactile feeling setting means for setting a tactile feeling to be presented. For example, the presentation tactile feeling setting unit 102a may set a predetermined tactile feeling as a tactile feeling to be presented. As another example, the presentation tactile feeling setting unit 102a may set a tactile feeling corresponding to the movement of the body as a tactile feeling to be presented, based on motion data obtained from the external input device 120 and the input unit 112. Further, based on information on an object or a virtual object recognized by the object recognition of the actual object obtained from the external input device 120 or the input unit 112, the presentation tactile feeling setting unit 102a may set a tactile feeling to be presented by acquiring a tactile feeling that corresponds to the object from the object tactile feeling database 106b. Moreover, the presentation tactile feeling setting unit 102a may allow the user to set a tactile feeling to be presented, via the external input device 120, the input unit 112, or the like. As an example, the presentation tactile feeling setting unit 102a may perform multipoint measurement on the time axis using flexible substrates of the input means 120 and 112 as described above and determine a tactile feeling such as a sticky sensation, a sticky and springy feeling, or the like based on changes, etc., in the contact area and the pressure distribution in consideration of this time axis. Regarding the conversion from the tactile feeling that has been determined to the tactile information to be presented, the conversion may be performed by the control unit 102 using a conversion table such as the table described above.

The presentation tactile feeling setting unit 102a may acquire information from a tactile sensor (input means 120 and 112 such as a force sensor, a vibration sensor, a temperature sensor, etc.) of a finger portion of a robot such as the TELESAR system described above, classify the information into tactile feeling-related category information such as a plurality of onomatopoeias by a method such as machine learning or the like, and store a tactile feeling expressed by the category information and a spatiotemporal combination from a tactile display (output means 140 and 114 for presenting stimuli such as force, electricity, vibration, temperature, etc.) in the object tactile feeling database 106b in association with each other. Thereby, the tactile feeling of an object located at a remote place can be estimated based on information from the tactile sensor, and the estimated tactile feeling can be presented in a multi-sensory form to the user located in a different place. As an example, the presentation tactile feeling setting unit 102a may detect a corresponding tactile feeling (psychological tactile feeling, etc.) by making association with at least two axes among the roughness and smoothness axis according to force, the hardness and softness axis according to vibration, and the dryness and wetness axis according to temperature based on a physical quantity detected by the input unit 112 or the external input device 120.

The presentation tactile feeling setting unit 102a may perform calibration of the input means 120 and 112 and the output means 140 and 114 by a publicly-known technique or the like.

For example, the presentation tactile feeling setting unit 102a may perform various types of calibration by transmitting an initial operation signal to the external output device 140, followed by outputting according to the initial operation signal by the external output device 140.

Further, the generation unit 102b selects at least two or more physical quantities according to the tactile feeling to be presented and also generates tactile information for presenting a predetermined tactile feeling based on the physical quantities that have been selected. In the present embodiment, as an example, in order to synthesize a plurality of physical quantities as bases, the generation unit 102b may select at least two or more physical quantities according to the tactile feeling to be presented and generate tactile information for presenting a predetermined tactile feeling based on the physical quantities that have been selected. As an example, physical quantities include at least electricity and include force, temperature, vibration, and/or spatiotemporal changes of the electricity, force, temperature, vibration, and the like, and the generation unit 102b may select, out of the physical quantities, at least two or more physical quantities and generate tactile information. As another example, the generation unit 102b may select physical quantities by making association with at least two axes among the roughness and smoothness axis according to force, the hardness and softness axis according to vibration, and the dryness and wetness axis according to temperature in accordance with the tactile feeling to be presented. When presenting a tactile feeling due to a temporal change in force, the generation unit 102b may select at least electrical and spatiotemporal physical quantities so as to generate tactile information. The generation unit 102b may select the first and second types of tactile stimuli defined in the tactile sensation definition file 106a as the plurality of physical quantities. The generation unit 102b may select a plurality of physical quantities and generate tactile information for the purpose of presenting a tactile feeling set by the above-described presentation tactile feeling setting unit 102a. As an example, referring to the object tactile feeling database 106b, the generation unit 102b may determine a tactile feeling corresponding to information from the tactile sensor obtained from the input means 120 and 112 and generate tactile information based on a plurality of physical quantities such as an electrical stimulus and the like in order to present the tactile feeling.

An explanation will be given now regarding encoding accompanied by the synthesis of a plurality of physical quantities performed by the generation unit 102b. For example, when presenting a "soft" tactile feeling to a hand, there is no tactile signal capable of presenting "softness" by the above-described tactile presentation module alone, and it is necessary to spatiotemporally change a tactile signal that is presented in each tactile element of the haptic primary colors in accordance with motion information (motion data, etc.) indicating how much the hand has pushed the object. In addition, the user's body movements do not always match completely in a situation where a physical experience is recorded by the external input device 120 or the input unit 112 and in a situation where the physical experience is experienced by means of the external output device 140 and the output unit 114, and, if the same tactile sensation control signal is presented under different movement situations, different tactile feelings will be perceived. Therefore, it is important that, instead of simply presenting the recorded tactile information without any change, the tactile information conversion device 100 performs appropriate conversion according to the difference in body movements.

As described above with reference to FIG. 4, a tactile feeling a person sensitively feels is defined as a psychological space for tactile sensation, a physiological element such as a tactile receptor, which generates a nerve pulse that constitutes the tactile feeling, is defined as a physiological space for tactile sensation, and a physical stimulus that activates tactile receptors is defined as a physical space for tactile sensation. Tactile transmission modules 120 and 112 according to the present embodiment are considered as a hybrid structure for stimulation in the physiological space of Merkel cells and Meissner's corpuscles by electrical stimulation and stimulation in the physical space of vibration and temperature. Therefore, in order to present an arbitrary tactile feeling using the tactile transmission modules 120 and 112, it is necessary to construct an algorithm for breaking down an arbitrary "tactile feeling" on the psychological space into each sensory element of tactile presentation modules 140 and 114, interactively selecting the sensory element according to body movements, and generating tactile information for presenting the predetermined tactile feeling based on a selected physical quantity and a software environment in which the algorithm can be executed by the tactile information conversion device 100. Thus, the control unit 102 of the tactile information conversion device 100 edits and processes the information recorded based on the real world through the processes of the generation unit 102*b*, the output control unit 102*c*, and the like so as to create arbitrary tactile information, executes an algorithm that converts the tactile information into an appropriate tactile sensation control signal in accordance with a body movement that is being experienced and an algorithm that converts the tactile information recorded based on the real world into new tactile information that corresponds to a different body movement, and functions as a haptic primary color encoder.

Referring back to FIG. 5, a specific algorithm for combining a plurality of physical quantities by the generation unit 102*b* will be described. For example, when presenting a soft psychological texture, in other words, when presenting a "sticky and springy feeling", the generation unit 102*b* may synthesize the texture by a plurality of physical quantities such that a stimulus by electricity, force, or vibration that is stronger than that in the case of a hard surface or a stimulus by electricity, force, or vibration in an area wider than that in the case of a hard surface is applied in the process of transition or the process of body displacement from a non-contact state to a contact state. As an example, the generation unit 102*b* may apply an electrical stimulus, force, or a vibration stimulus that is stronger than the strength of a tactile stimulus received when a finger or the like is brought into contact with a hard surface. Further, the generation unit 102*b* may generate tactile information for applying a stimulus by electricity, force, or vibration that is in an area wider than a contact area of a tactile stimulus received when a finger or the like is brought into contact with a hard surface. A transition process of a finger or the like from a non-contact state to a contact state and a body displacement process of the movement can be determined based on motion data received by the external input device 120 and the input unit 112 described above.

As another example, when presenting a sticky psychological texture, in other words, when presenting a "sticky feeling", the generation unit 102*b* may synthesize the texture by a plurality of physical quantities such that a stimulus by electricity, force, or vibration that is stronger than that in the case of a hard surface or a stimulus by electricity, force, or vibration in an area wider than that in the case of a hard surface is applied in the process of transition or the process of body displacement from a contact state to a non-contact state. As an example, the generation unit 102*b* may apply an electrical stimulus, force, or a vibration stimulus that is stronger than the strength of a tactile stimulus received when a finger or the like in a contact state is removed from a hard surface under the same pressure. Further, the generation unit 102*b* may generate tactile information for applying an electricity stimulus, a force stimulus, or a vibration stimulus in an area wider than a contact area of a tactile stimulus received when a finger or the like is removed from a hard surface through the same movement of the finger or the like. A transition process of a finger or the like from a contact state to a non-contact state and a body displacement process of the movement can be determined based on motion data received by the external input device 120 and the input unit 112 described above.

The generation unit 102*b* may perform, not limited to the conversion of a tactile feeling into a physical quantity, but also a process of converting a physical quantity into a tactile feeling. For example, in the above description, the generation unit 102*b* is described to select a physical quantity by making association with at least two axes among the roughness and smoothness axis according to force, the hardness and softness axis according to vibration, and the dryness and wetness axis according to temperature in accordance with a tactile feeling to be presented. The generation unit 102*b* may perform, not limited to this process, but also a process that is reverse to this. In other words, the generation unit 102*b* may obtain a corresponding tactile feeling by making association with at least two axes among the roughness and smoothness axis according to force, the hardness and softness axis according to vibration, and the dryness and wetness axis according to temperature based on a physical quantity detected by the input unit 112 or the like. That is, as long as a conversion table or the like between the physical quantity and the tactile feeling is stored in the storage unit 106, the generation unit 102*b* can perform conversion between the two from either side.

The output control unit 102*c* is an output control means that outputs tactile information to the output unit of the external output device 140, the output unit 114, and the like. More specifically, the output control unit 102*c* outputs tactile information generated by the generation unit 102*b* to the output means 140 and 114 side. For example, the output control unit 102*c* may transmit the tactile information to the external output device 140 or may output the tactile information to the output unit 114 via the input and output control interface unit 108. As shown in FIG. 5, the output control unit 102*c* may further include a first stimulation unit 102*d* and a second stimulation unit 102*e*.

The first stimulation unit 102*d* is a first stimulation means that determines a first stimulation point at which a first type of tactile stimulus is generated or generates a first type of tactile stimulus at a first stimulation point via the output units 140 and 114. In other words, the first stimulation unit 102*d* may actively generate the first type of tactile stimulus at the first stimulation point via the output units 140 and 114 or determine the first stimulus point of the first type of tactile stimulus generated by the user moving relatively with respect to the object. The stimulation point means a time point in time and/or a position point in space (a position on a one-dimensional line, a position on a two-dimensional plane, a position in three-dimensional space, and the like). On the other hand, the second stimulation unit 102e is a second stimulation means that generates a second type of tactile stimulus via the output units 140 and 114 at a second stimulation point separated within a temporally and/or spatially predetermined threshold value from the first stimulation point of the first type of tactile stimulus, which is determined or generated by the first stimulation unit 102d. The predetermined temporal threshold value and the predetermined spatial threshold value vary depending on a tactile stimulus to be presented and may be stored in the storage unit 106 (tactile sensation definition file 106a, etc.) in advance. A publicly-known two-point discrimination threshold (a spatial two-point discrimination threshold, a temporal two-point discrimination threshold, or the like) may be used as the temporally and/or spatially predetermined threshold value.

In the case where another stimulus is perceived while being positioned at a stimulation point for force presentation, as an example, the first stimulation unit 102d may determine or cause the force presentation as the first type of tactile stimulus, and the second stimulation unit 102e may generate one or a plurality of stimuli among vibration, temperature, and an electrical stimulus at the second stimulation point as the second type of tactile stimulus. As another example, the same effect can be achieved by the first stimulation unit 102d determining or generating one or a plurality of stimuli among vibration, temperature, and an electrical stimulus as the first type of tactile stimulus and the second stimulation unit 102e causing the force presentation as the second type of tactile stimulus at the second stimulation point.

In the case where another stimulus is perceived while being positioned at a stimulation point for vibration presentation, as an example, the first stimulation unit 102d may determine or cause the vibration presentation as the first type of tactile stimulus, and the second stimulation unit 102e may generate a temperature stimulus at the second stimulation point as the second type of tactile stimulus. As another example, the same effect can be achieved by the first stimulation unit 102d determining or generating a temperature stimulus as the first type of tactile stimulus and the second stimulation unit 102e generating a vibration stimulus as the second type of tactile stimulus at the second stimulation point.

In the case where another stimulus is perceived while being positioned at a stimulation point for electrical stimulus presentation, the first stimulation unit 102d may determine or cause the electrical stimulus presentation as the first type of tactile stimulus, and the second stimulation unit 102e may generate vibration and/or temperature at the second stimulation point as the second type of tactile stimulus. As another example, the same effect can be achieved by the first stimulation unit 102d determining or generating vibration and/or temperature as the first type of tactile stimulus and the second stimulation unit 102e causing the electrical stimulus presentation as the second type of tactile stimulus at the second stimulation point.

The stimulation points of the first stimulation point and the second stimulation point may be perceptual points due to phantom sensation illusion. FIGS. 8A and 8B are diagrams showing perceptual points due to phantom sensation illusion. When a person actually touches an object in the real world with the pad of a finger, the points of application for four stimuli of force, vibration, and temperature applied to the skin surface of the pad of the finger are the same. However, in a tactile sensation presentation device for presentation to a person, it is generally difficult to have the same points of application for force, vibration, temperature, and electricity due to the arrangement of various elements.

On the other hand, examining human sensation, the same sensation can be generated even when the points of application are different. A sensation can be also generated at a place different from the point of application. A good example of the latter is phantom sensation. White circles in FIG. 8 represent stimulation sites, and circles with hatched lines represent perceptual points caused by phantom sensation. Phantom sensation is a phenomenon of cutaneous sensation confirmed by von Bekesy that is similar to the sound localization by binaural hearing. In phantom sensation, by applying stimuli to two sites under certain conditions, a stimulation image can be provided to a site different from the stimulation sites between the two sites. Moreover, as shown in FIG. 8A, by applying stimuli to three or more sites, a stimulation image can be localized inside the sites. Furthermore, as shown in FIG. 8B, the position of the image can be controlled by differences in stimulation strength at the plurality of stimulation sites. It is known that this also occurs for vibration stimuli and electrical stimuli (see Kazuo Tanie, Susumu Tachi, Kiyoshi Komoriya, Minoru Abe, "Basic Study on Discriminability of Mental Location of Electrocutaneous Phantom Sensation", Transactions of the Society of Instrument and Control Engineers, Vol. 15, No. 4, p. 505-512 (1979. 8), and Susumu Tachi, Kazuo Tanie, Kiyoshi Komoriya and Minoru Abe: Electrocutaneous Communication in a Guide Dog Robot (MELDOG), IEEE Transactions on Biomedical Engineering, Vol. BME-32, No. 7, pp. 461-469 (1985).

Figure 10:
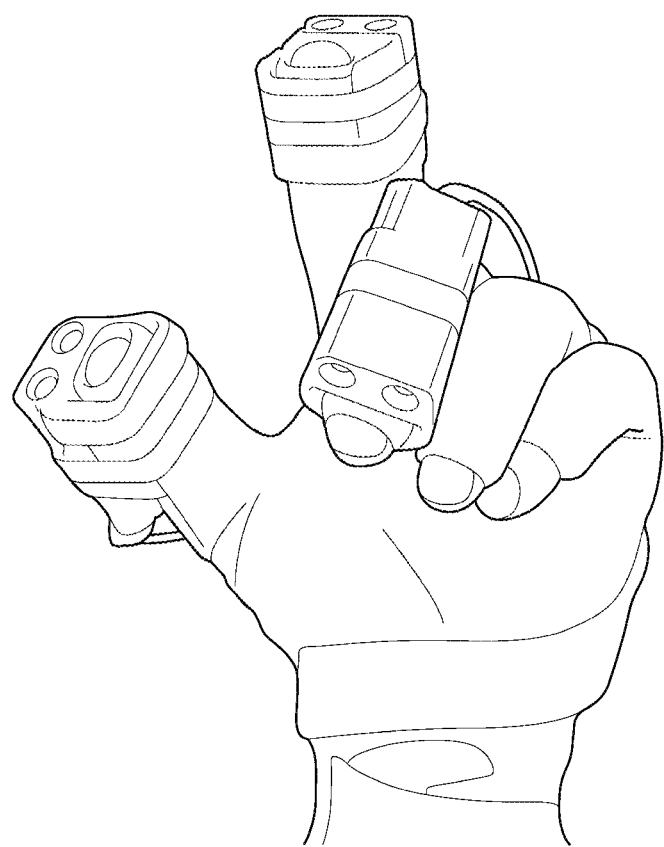
FIG. 10 is a diagram showing the appearance of the above-described finger-mounted type sensor/actuator of the tele-existence robot called TELESAR V developed by the present inventors when the finger-mounted type sensor/actuator is worn.

The existence of this phantom sensation phenomenon means that a vibration stimulus can be felt at a site that is different from a directly stimulated site. FIGS. 9 and 10 are diagrams showing the above-described finger-mounted type sensor/actuator of the tele-existence robot called TELESAR V developed by the present inventors and the appearance thereof when the finger-mounted type sensor/actuator is worn on a finger (for the details of the device configuration and the like, see Japanese Patent Application Publication No. 2013-91114). When presenting, using the illustrated presentation device set in a glove, pressure sensation information and vibration information measured with a hand of this TELESAR V, pressure and shearing force were applied to a finger pad, and vibration was presented from both sides of the finger. As a result, it was confirmed that a vibration stimulus was also felt on the finger pad where a pressure sensation was felt. It can be considered that the vibration stimulus was felt in the center by phantom sensation. Furthermore, it seems that there was also an effect where a part to which the pressure sensation was applied was susceptible to stimuli. Also in the verification experiment described later, examination is done by (1) comparing a site where a stimulus is felt between the case where both sides of the site are stimulated at the same time and the case where only one side of the site is stimulated and (2) comparing a site where a vibration stimulus is generated between when only a vibration stimulus is applied without applying pressure and when a vibration stimulus is applied while applying pressure.

Therefore, an electrical stimulus is applied at the force presentation part instead, a vibration stimulus can be presented at an electrically stimulated part by phantom sensation in the same way. Further, a phantom sensation image is more clearly localized by the electrical stimulus. Therefore, by phantom sensation, for example, a vibration stimulus can be localized at a site stimulated by force and a site stimulated by electricity, and a phantom sensation image by the vibration stimulus can be clearly localized at a site where force or an electrical stimulus is presented by force presentation or electricity presentation.

Regarding temperature presentation, when a temperature stimulus is applied from the side, the stimulus is not localized on the finger pad if the stimulus is applied only on one side; however, when a vibration stimulus is presented to the finger pad, the stimulus is localized at that site. Whether the phantom sensation localized at the center when the stimulus is applied from both left and right sides also exists in this case was verified through experiments. In the case of temperature, the presentation is delayed due to the characteristics of the element and the nature of the heat. In order to correct this delay, a non-contact temperature sensor can be incorporated in addition to a contact type temperature sensor in the sensor.

In addition to the external input device 120 and the external output device 140, the tactile information conversion device 100 may be formed being communicably connected, via the network 300, to the external device 200 for providing a database for storing tactile information, threshold values, etc., and an external program or the like such as a tactile information conversion program. Further, this tactile information conversion device 100 may be communicably connected to the network 300 via a communication device such as a router and a wired or wireless communication line such as a dedicated line.

In FIG. 5, the communication control interface unit 104 is a device that performs communication control between the tactile information conversion device 100 and the network 300 (or a communication device such as a router). In other words, the communication control interface unit 104 has a function of communicating data with another terminal or station via a communication line (regardless of whether the line is wired or wireless). In the present embodiment, the communication control interface unit 104 performs communication control with the external input device 120, the external output device 140, the external device 200, and the like.

The external device 200 is mutually connected to the tactile information conversion device 100, the external input device 120, and the external output device 140 via the network 300 and has a function of providing an external database relating to calibration in addition to threshold values, conversion tables, etc., stored in a tactile feeling definition file, an object tactile feeling database, and the like and a website for executing an external program or the like such as a tactile information conversion program and an encoding program, for each terminal.

The external device 200 may be realized, for example, by hardware elements such as a personal computer, a server computer and software elements such as an operating system, an application program, and other data. For example, the external device 200 may be configured as a WEB server, an ASP server, or the like, and the hardware configuration thereof may be configured by an information processing device such as a commercially available workstation, a personal computer, etc., and accessory devices of the information processing device. Further, each function of the external device 200 is realized by a processor such as a CPU, a disk device, a memory device, an input device, an output device, a communication control device, and the like in the hardware configuration of the external device 200, a program for controlling these processor and devices, and the like.

Described above is the explanation of each configuration of the tactile feeling presentation system according to the present embodiment. In the configuration example described above, an explanation has been given regarding an example in which the tactile information conversion device 100 is configured as a housing different from the input units 120 and 112, the output units 140 and 114, and the external devices 200 such as a server. However, the preset embodiment is not limited thereto. For example, the tactile information conversion device 100 may be configured integrally with an input device, may be configured integrally with a transmission device, may be configured integrally with a storage device, may be configured integrally with a server device, may be configured integrally with a receiving device, or may be configured integrally with an output device.

Processes of Tactile Feeling Presentation System

Next, an example of the processes of the tactile feeling presentation system according to the present embodiment thus configured will be described in detail with reference to FIGS. 11 to 13 in the following.

Tactile Feeling Presentation Process

Figure 11:
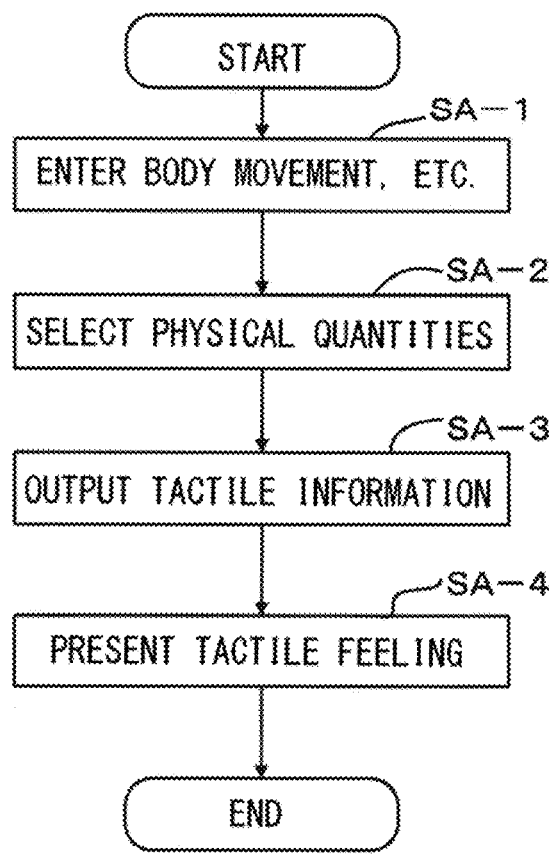
FIG. 11 is a flowchart showing an example of a tactile information conversion process in the tactile feeling presentation system according to the present embodiment.

FIG. 11 is a flowchart showing an example of a tactile information conversion process in the tactile feeling presentation system according to the present embodiment.

As shown in FIG. 11, first, the input units 120 and 112 of the present tactile feeling presentation system detect the body movement of the user, and the tactile information conversion device 100 acquires body movement information such as motion data through the process of the generation unit 102b (Step SA-1). As an example, the input units 120 and 112 may perform touch detection, may detect the contact area, or may detect the displacement of a finger. If the external output device 120 acquires, for example, the body movement information, the body movement information is transmitted to the tactile information conversion device 100, and the tactile information conversion device 100 receives the body movement information.

Through the process of the generation unit 102b, the tactile information conversion device 100 of the present tactile feeling presentation system selects at least two or more physical quantities out of electrical, force, temperature, and spatiotemporal physical quantities in accordance with a tactile feeling to be presented and also generates tactile information for presenting a predetermined tactile feeling based on the physical quantities that have been selected (Step SA-2). For example, when presenting a tactile feeling due to a temporal change in force, the generation unit 102b may synthesize the tactile information based on at least electrical and spatiotemporal physical quantities. When the first and second types of tactile stimuli are defined in the tactile sensation definition file 106a, the generation unit 102b may synthesize the tactile information as the plurality of physical quantities based on the first and second types of tactile stimuli.

The tactile information conversion device 100 of the present tactile feeling presentation system outputs the tactile information to the output unit of the external output device 140, the output unit 114, or the like (Step SA-3). More specifically, the output control unit 102c outputs the tactile information generated by the generation unit 102b to the output units 140 and 114 side. In the case where the output destination is the external output device 140, the tactile information conversion device 100 transmits the tactile information to the external output device 140 under the control of the output control unit 102c. In this case, the output control unit 102c may execute processes performed by the first stimulation unit 102d and the second stimulation unit 102e (the processes will be described later).

Then, the output units 140 and 114 of the present tactile presentation system perform multimodal (multi-sensory type) output from the output units 140 and 114 based on the tactile information and present a tactile feeling that works on the tactile ability of the user (Step SA-4).

The above is an example of the tactile feeling presentation process of the present tactile feeling presentation system. Next, an explanation will be given regarding an example of a multipoint stimulation process of the present tactile feeling presentation system in the following.

Multipoint Stimulation Process

Figure 12:
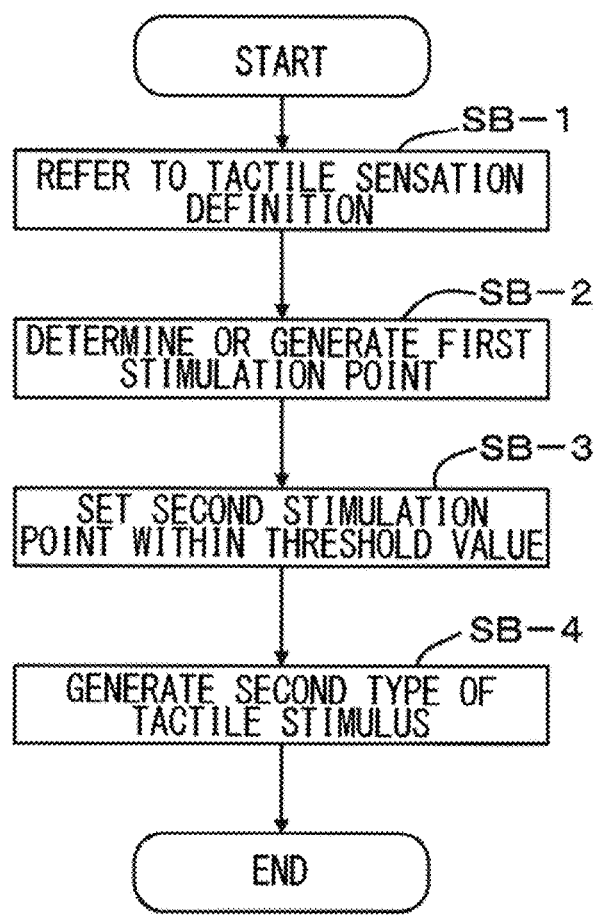
FIG. 12 is a flowchart showing an example of a multipoint stimulation process in a tactile information conversion device 100 of the tactile feeling presentation system according to the present embodiment.

FIG. 12 is a flowchart showing an example of the multipoint stimulation process in the tactile information conversion device 100 of the tactile feeling presentation system according to the present embodiment.

As shown in FIG. 12, the output control unit 102c of the tactile information conversion device 100 first refers to the tactile sensation definition file 106a and sets a first type tactile stimulus and a second type of tactile stimulus that are defined (Step SB-1).

Then, the output control unit 102c of the tactile information conversion device 100 determines a first stimulation point at which the first type of tactile stimulus is generated by the process of the first stimulation unit 102d (Step SB-2). More specifically, the output control unit 102c may determine the point of time, the position point, and the like of the first type of tactile stimulus generated by the user, for example, coming into contact with the object. Alternatively, the output control unit 102c may output stimulation information for causing the first type of tactile stimulus to be generated at the first stimulation point via the output units 140 and 114 by the process of the first stimulation unit 102d.

Then, by the process of the second stimulation unit 102e, the output control unit 102c of the tactile information conversion device 100 sets a second stimulation point that is separated within a temporally and/or spatially predetermined threshold value from the first stimulation point of the first type of tactile stimulus, which is determined or generated by the first stimulation unit 102d (Step SB-3). In this case, by the process of the second stimulation unit 102e, the output control unit 102c may set the second stimulation point by referring to the threshold value stored in advance in the tactile sensation definition file 106a.

Then, by the process of the second stimulation unit 102e, the output control unit 102c of the tactile information conversion device 100 outputs tactile information for generating the second type of tactile stimulus via the output units 140 and 114 at the second stimulation point set in Step SB-3 (Step SB-4).

The above processes allow a tactile feeling to be presented such that stimulation is felt at a single part while arranging the presentation elements of all of electricity, force, temperature, vibration, or an arbitrary combination thereof on different sites on the human skin. As an example of the means thereof, by using a presentation method using phantom sensation or another method, a sensation can be felt at a single location even through the presentation elements are physically arranged at different locations.

For example, by arranging force presentation at the point of application of a stimulus and arranging a stimulator for any one of vibration, temperature, and an electrical stimulus or an arbitrary combination thereof at a place that is physically apart, the sensation for the stimulus can be localized at the point of application of force by phantom sensation. Further, clarification of an image localized by phantom sensation through the presentation of force allows the presentation sites for the haptic primary colors of force, electricity, vibration, and temperature to coincide with one another.

As another specific example, by arranging force presentation at the point of application of a stimulus and arranging an stimulator for either one of vibration and temperature or the combination thereof at a place that is physically apart, the sensation for the stimulus can be localized at the point of application of force by phantom sensation, and clarification of an image localized by phantom sensation through the presentation of force allows the presentation sites for the haptic primary colors of force, vibration, and temperature to coincide with one another.

Further, according to the present embodiment, by arranging electrical stimulus presentation at the point of application of a stimulus and arranging either one of vibration and temperature or both at a place that is physically apart, the sensation for the stimulus can be localized at the point of application of force by phantom sensation. Further, clarification of an image localized by phantom sensation through the presentation of an electrical stimulus also allows the presentation sites for the haptic primary colors of force, vibration, and temperature to coincide with one another.

Further, according to the present embodiment, by arranging vibration presentation at the point of application of a stimulus and arranging temperature at a place that is physically apart, the sensation for the stimulus can be localized at the point of application of vibration by phantom sensation. Further, clarification of an image localized by phantom sensation through the presentation of vibration allows the presentation sites for the haptic primary colors of vibration and temperature to coincide with one another.

Remote Tactile Feeling Transmission Process

Figure 13:
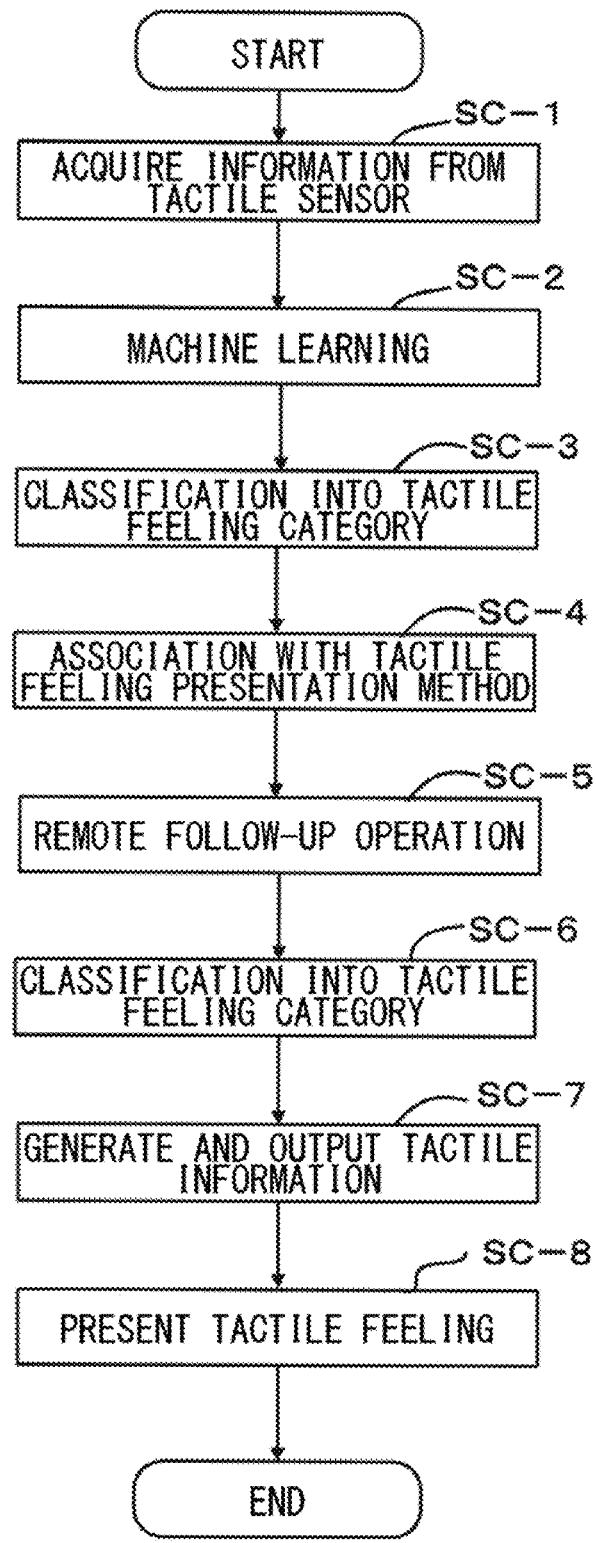
FIG. 13 is a flowchart showing an example of a remote tactile feeling transmission process in the tactile feeling presentation system according to the present embodiment.

FIG. 13 is a flowchart showing an example of a remote tactile feeling transmission process in the tactile feeling presentation system according to the present embodiment. As a part of the functions of the tactile feeling presentation system, the TELESAR system described above may be used (see, for example, Japanese Patent Application Publication No. 2013-91114).

As shown in FIG. 13, first, in the present tactile feeling presentation system, the presentation tactile feeling setting unit 102a acquires information from a tactile sensor (input means 120 and 112 such as a force sensor, a vibration sensor, a temperature sensor, or the like) of a finger portion of a robot such as the TELESAR system described above (Step SC-1).

Subsequently, the presentation tactile feeling setting unit 102a of the present tactile feeling presentation system performs machine learning based on information from the tactile sensor and teaching data on the tactile feeling of the object recognized by a camera or the like (Step SC-2). The operator of the tactile information conversion device 100 may input the teaching data on the object and the tactile feeling via the input unit 112 such as a keyboard.

Then, the presentation tactile feeling setting unit 102a of the present tactile feeling presentation system classifies the characteristics (spatiotemporal variation pattern, etc.) of the information from the tactile sensor into tactile feeling category information (onomatopoeia map, etc.) such as onomatopoeia as a result of the machine learning and the like (Step SC-3).

Then, the presentation tactile feeling setting unit 102a of the present tactile feeling presentation system stores the tactile feeling category information into which the characteristics have been classified and a tactile feeling presentation technique according to the present embodiment in the object tactile feeling database 106b in association with each other (Step SC-5). The tactile feeling category information and the tactile feeling presentation technique may be stored in the object tactile feeling database 106b in association with a spatiotemporal combination from a tactile display (external output means 140 for presenting stimuli such as force, electricity, vibration, temperature, etc.). The processes in the above Steps SC-1 through SC-4 may be performed in advance as preprocessing, and the results of the processes may be stored in the storage unit 106 in advance.

Subsequently, in the present tactile feeling presentation system, using the TELESAR system or the like, a finger portion of the robot is moved following the movement of the hand of the user of a robot teaching device in real time, and tactile sensor information obtained through the interaction with the object is acquired and classified, in reference to the object tactile feeling database 106b, into a corresponding tactile feeling category (Step SC-6). The robot-side finger portion and an object detection unit of the TELESAR system can be considered as the external output device 140 and the external input device 120. Further, a detection means for the movement of a hand and a tactile stimulation means that are on the robot teaching device side of the TELESAR system can be considered as the input unit 112 and the output unit 114.

Then, the generation unit 102b and the output control unit 102c of the present tactile feeling presentation system select a plurality of physical quantities, generate tactile information, and output the tactile information to the output unit 114 in accordance with a tactile category (Step SC-7).

Thereby, the tactile feeling of an object located at a remote place can be estimated based on information from the tactile sensor, and the estimated tactile feeling can be presented in a multi-sensory form such as an electrical stimulus to the user (Step SC-8).

Figure 14:
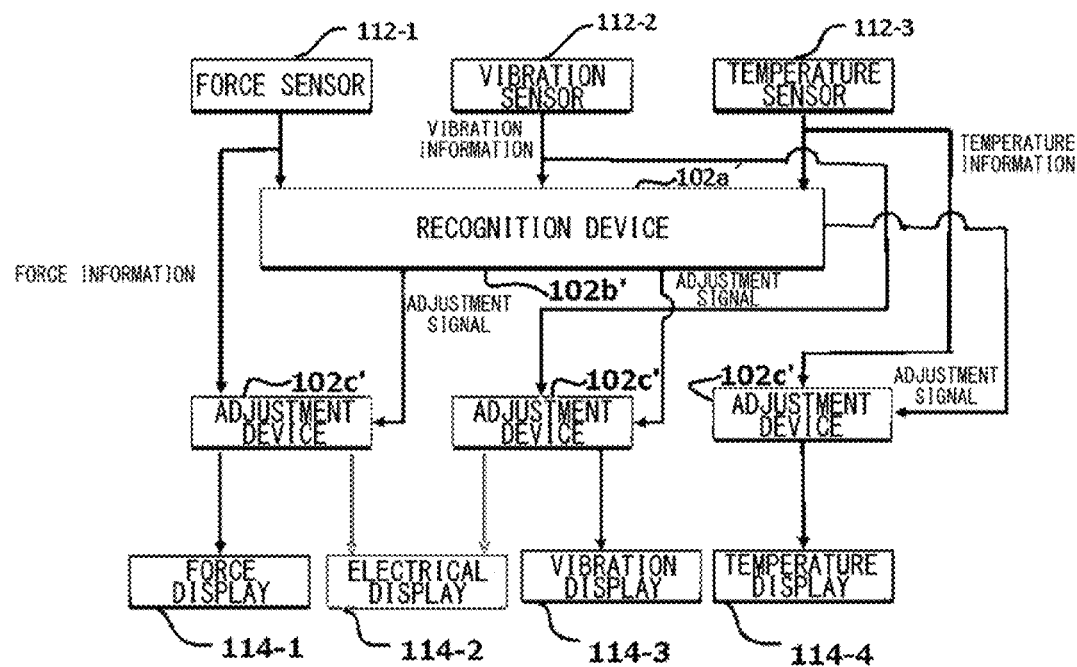
FIG. 14 is a diagram showing a function conceptual configuration for a case when input information of a sensor or the like is classified into tactile feeling category information based on a conversion table or the like of category information acquired by machine learning or the like and a plurality of physical quantities are synthesized and then presented and output based on the classified tactile feeling category information.

Described above is the explanation of the processes of the tactile feeling presentation system according to the present embodiment. As described above, the presentation tactile feeling setting unit 102a may acquire information from a tactile sensor (input means 120 and 112 such as a force sensor, a vibration sensor, a temperature sensor, etc.) of the finger portion of a robot such as the TELESAR system, classify the information into tactile feeling-related category information such as a plurality of onomatopoeias by a method such as machine learning or the like, and store a tactile feeling expressed by the category information and a spatiotemporal combination from a tactile display (output means 140 and 114 for presenting stimuli such as force, electricity, vibration, temperature, etc.) in the object tactile feeling database 106b in association with each other. A signal that is furthest from each other at the center of the category may be registered as a representative signal of the category and used for tactile feeling presentation. FIG. 14 is a diagram showing a function conceptual configuration for a case when input information of a sensor or the like is classified into tactile feeling category information based on a conversion table or the like of category information acquired by machine learning or the like and a plurality of physical quantities are synthesized and then presented and output based on the classified tactile feeling category information.

As shown in FIG. 13, using a method such as machine learning, the tactile information conversion device 100 constructs a conversion table or the like and ensures that information from tactile sensors (a force sensor 112-1, a vibration sensor 112-2, and a temperature sensor 112-3) arranged in the hand or the like of the robot can be classified into category information such as a plurality of onomatopoeias. Other than the tactile sensor in the figure, it is also possible to convert the information from a sensor for other physical quantities into the sensor information. Regarding the learning, for example, deep learning may be conducted using a stacked auto-encoder or the like used in character recognition, etc., by performing short-time Fourier transformation on vibration sensor information, while having frequency information being assigned to the vertical axis and the horizontal axis being assigned for time, and converting temperature and force in the same manner such that a two-dimensional image is obtained. At this time, a sample for which an onomatopoeia is known may be used as a teacher signal.

Then, the tactile information conversion device 100 classifies the information into category information of a tactile feeling such as onomatopoeia using a conversion table or the like, which is a learning result, based on various tactile signals (force information, vibration information, temperature information, etc.) from the tactile sensors (the force sensor 112-1, the vibration sensor 112-2, and the temperature sensor 112-3) through the process by a recognition device 102b'.

Then, through the processes by the recognition device 102b' and an adjustment device 102c', the tactile information conversion device 100 processes the tactile feeling category information, into which the tactile signals have been classified, into an adjustment signal using a correspondence table of tactile feelings and physical quantities. For example, in the case of vibration, this is realized by changing the frequency characteristic by a filter or changing the frequency in a Markov process. Regarding the learning for obtaining the correspondence table of tactile feelings and physical quantities, for example, in deep learning, a signal output from the adjustment device 102c' may be classified, and the adjustment device 102c' may learn such that the correct answer rate is higher than that before passing through the adjustment device 102c'. More specifically, the recognition device 102b' may learn such that the optimal physical quantity is selected by making association with at least two axes among the roughness and smoothness axis according to force, the hardness and softness axis according to vibration, and the dryness and wetness axis according to temperature in accordance with the tactile feeling to be presented.

As described above, the tactile information conversion device 100 can create a mechanism where information from the force sensor 112-1, the vibration sensor 112-2, the temperature sensor 112-3, and the like that has been input is processed to represent a tactile feeling expressed by category information such as onomatopoeia using a method such as machine learning. Thereby, once the above learning is completed, the tactile information conversion device 100 can move the hand or the like of the robot in real time in accordance with the movement of the user's hand or the like and present, based on tactile feeling sensor information obtained by the interaction with the object at that time, signals from various sensor on corresponding tactile displays (a force display 114-1, an electrical display 114-2, a vibration display 114-3114-3, and a temperature display 114-4) via the recognition device 102a' through the adjustment device 102c' in real time, respectively. At the same time, the tactile information conversion device 100 can input the same signals to the recognition device 102*a* and process, for example, a tactile feeling such as repulsive force that is difficult to be presented on the force display 114-2 into an adjustment signal such that the tactile feeling is presented using the electrical display 114-2. In addition to this, the tactile information conversion device 100 may convert both force information and vibration information or just vibration into electricity by encoding.

In the present embodiment, the adjustment device 102*c*' does not output anything and outputs information from the tactile sensors 112-1 to 112-3 without change until the recognition devices 102*a*' and 102*b*' recognize the tactile feeling. When the tactile feeling is recognized by the recognition devices 102*a*' and 102*b*', the adjustment device 102*c*' processes the signal according to the classification of the tactile feeling obtained as the recognition result, and the user can obtain a more easily understandable tactile feeling based on the actual condition. In other words, by converting tactile information into tactile feeling information, a tactile feeling represented by category information such as onomatopoeia can be obtained in real time.

First Exemplary Embodiment (Axis 1)

The first exemplary embodiment demonstrating the effect of the tactile feeling presentation system according to the present embodiment will be explained in the following. In the first exemplary embodiment, it was confirmed experimentally that the presentation of a tactile feeling that normally requires suction force, such as sticky feeling, was able to be presented by alternatively using an electronic stimulus.

Conventionally, many tactile feeling presentation devices have been developed. However, no practical technique has been proposed for presenting the feeling of stickiness represented by an onomatopoeia such as "neba-neba (sticky)". Thus far, there is a report indicating, based on the observation of the skin when touching the actual sticky substance, that the relationship between force and a contact area during pushing motion is unrelated to the presence or absence of stickiness but there is a large difference observed at the time of peeling off (Masaaki Yamaoka, Akio Yamamoto, Toshiro Higuchi "Basic Analysis of Stickiness Sensation for Tactile Displays" EuroHaptics 2008 (Japanese: Yamaoka VRSJ2007, VRSJ2008) URL: http://link.springer.com/chapter/10.1007/978-3-540-69057-3_56).

Further, a device "Vacuum Touch" that presents a sticky feeling by suction from an air suction hole has been developed (http://dl.acm.org/citation.cfm?id=2557252). However, in either case, suction and suction force are physically generated by using the air, and this is an ad hoc technology specialized for presenting a specific tactile feeling and lacks practicality.

Figure 15:
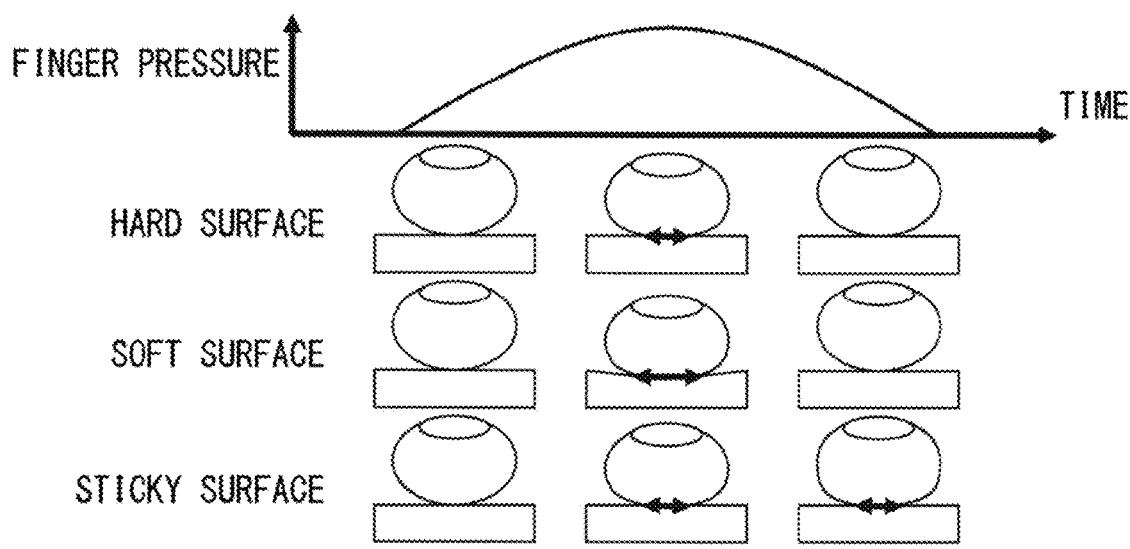
FIG. 15 is a diagram schematically showing changes in a contact surface and pressure in the case of touching a hard surface, a soft surface, or a sticky surface.

Therefore, the purpose of the first exemplary embodiment of the present embodiment is to present a tactile feeling such as sticky feeling or the like by the combination with electrical tactile sensation or machine presentation. FIG. 15 is a diagram schematically showing changes in a contact surface and pressure in the case of touching a hard surface, a soft surface, or a sticky surface. The figure shows a case where a finger is seen in the body axis direction from the fingertip side, and a two-way arrow shows the width of a contact surface.

As shown in FIG. 15, when pressing down the soft surface, the finger comes into contact with an area that is larger than that in the case of the hard surface. Therefore, the inventors of the present invention consider that it is possible to present a soft tactile feeling by applying a stimulus that is stronger than that in the case of a hard surface or a stimulus in an area that is larger than that for a hard surface at the time of the pressing down. Generally, in the case of a soft surface, it is often assumed that the stimulation will be reduced during pressing down. This is true for the same displacement of the finger; however, this is not true for the same force thereof.

Figure 16:
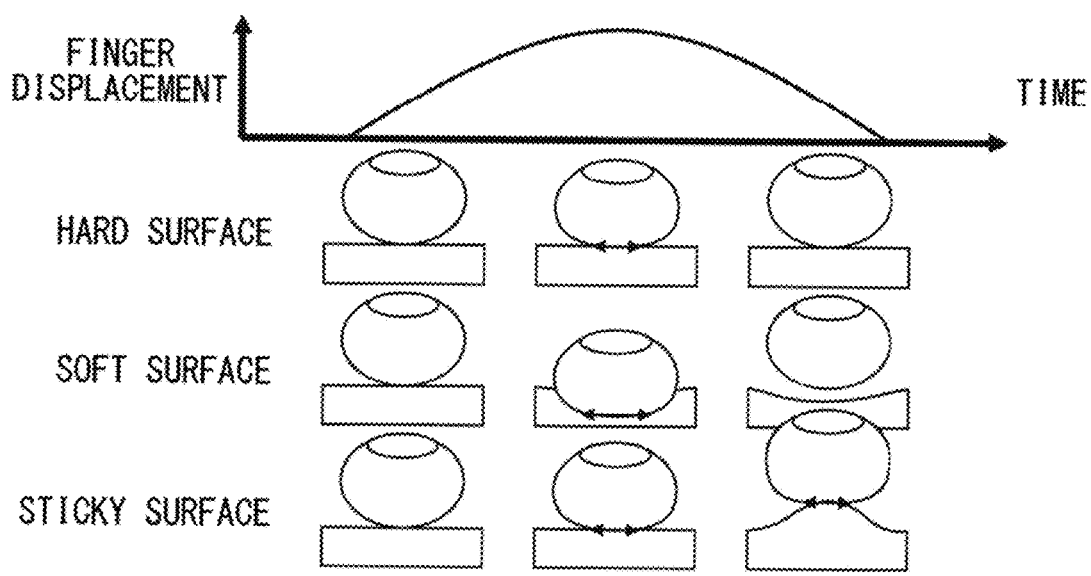
FIG. 16 is a diagram schematically showing changes in a contact surface and pressure in the case where large deformation occurs when touching the hard surface, the soft surface, or the sticky surface.

Further, as shown in FIG. 15, when lifting the finger from the sticky surface, the finger comes into contact with an area that is larger than that in the case of the hard surface. Therefore, the inventors of the present invention consider that it is possible to present a sticky feeling by applying a stimulus that is stronger than that in the case of the hard surface or a stimulus in an area that is larger than that for the hard surface at the time of the lifting. FIG. 15 shows a case where the deformation is minute. A case where the deformation is larger is now taken into consideration. FIG. 16 is a diagram schematically showing changes in a contact surface and pressure in the case where large deformation occurs when touching the hard surface, the soft surface, or the sticky surface.

As shown in FIG. 16, when the soft surface is largely deformed, in many cases, the surface plastically deforms and does not return completely to the original shape. Therefore, the inventors of the present invention have built a hypothesis that providing hysteresis when lifting the finger after pressing down the surface once allows the softness to be felt. Further, in the case of the sticky surface, when lifting the finger, the finger comes into contact with an area that is larger than that in the case of the hard surface. Therefore, the inventors of the present invention have built a hypothesis that providing hysteresis when lifting the finger after pressing down the surface once allows the stickiness to be felt.

That is, in Experiment 1 in the present exemplary embodiment, an experiment was conducted as to whether it was possible to present the stickiness by changing a stimulus with respect to the "force" at the fingertip. For example, since the finger comes into contact with the soft surface in an area larger than that in the case of the hard surface at the time of the pressing down, the inventors built a hypothesis that softness was felt by applying a stronger stimulus at the time of the pressing down and conducted an experiment. On the other hand, since the finger comes into contact with the sticky surface in an area larger than that in the case of the hard surface at the time of the lifting, an experiment was conducted as to whether a sticky feeling could be presented by applying a stronger stimulus.

Figure 17:
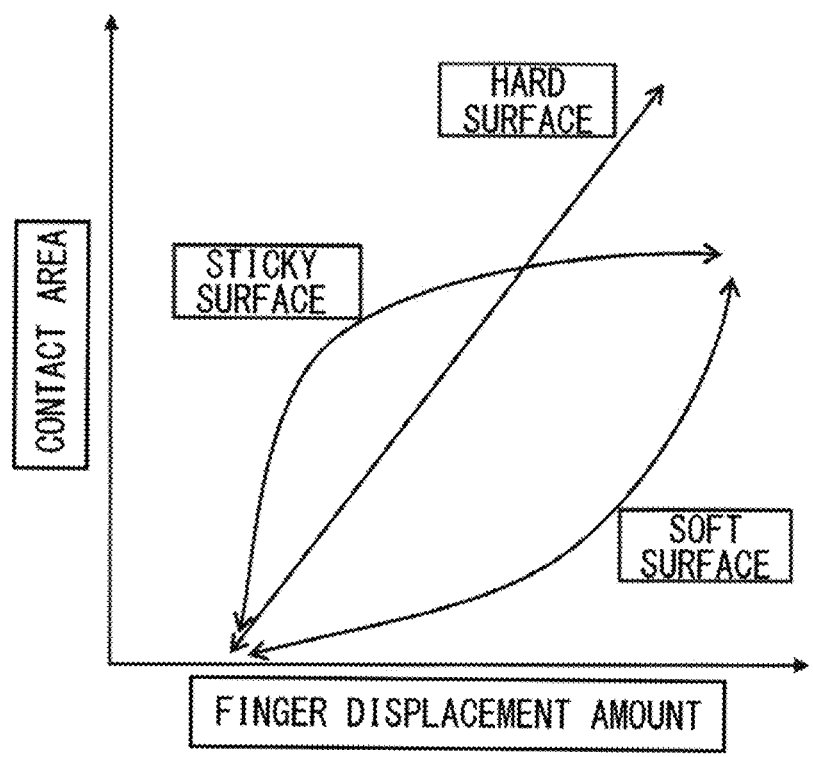
FIG. 17 is a diagram showing changes in the respective contact areas of the hard surface, the soft surface, and the sticky surface with respect to the amount of displacement of the finger.
Figure 18:
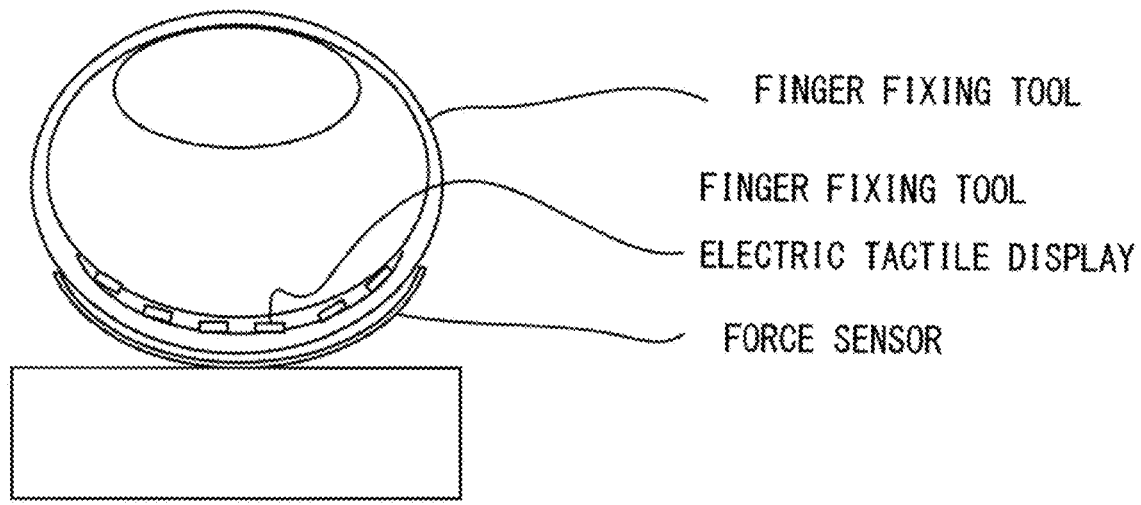
FIG. 18 is a diagram schematically showing, from the fingertip side, the configuration of an experimental device used in Experiment 1 according to the first exemplary embodiment.
Figure 19:
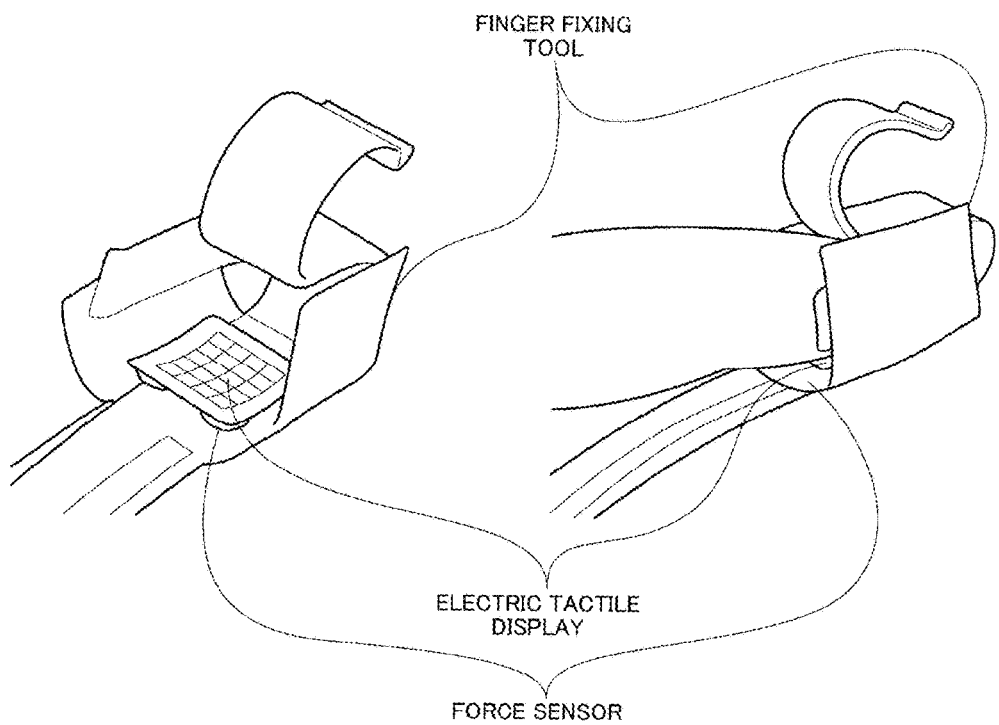
FIG. 19 is a photo diagram showing a state before the experimental device used in Experiment 1 according to the first exemplary embodiment is worn on the finger and a state after the experimental device is worn.

In Experiment 2 in the present exemplary embodiment, an experiment was conducted as to whether it was possible to present the stickiness by changing a stimulus with respect to the "displacement" at the fingertip. FIG. 17 is a diagram showing changes in the respective contact areas of the hard surface, the soft surface, and the sticky surface with respect to the amount of displacement of the finger. For example, on the soft surface, in many cases, a largely deformed soft plane is plastically deformed, and the contact area is decreased. An experiment was conducted as to whether providing hysteresis when lifting the finger after pressing down the surface once allows the softness to be felt. Since the finger comes into contact with the sticky surface in an area larger than that in the case of the hard surface at the time of the lifting, an experiment was conducted as to whether the stickiness was felt by applying hysteresis when lifting the finger after pressing down the surface once. FIG. 18 is a diagram schematically showing, from the fingertip side, the configuration of an experimental device used in Experiment 1 according to the first exemplary embodiment. FIG. 19 is a photo diagram showing a state before the experimental device used in Experiment 1 according to the first exemplary embodiment is worn on the finger and a state after the experimental device is worn.

Figure 20:
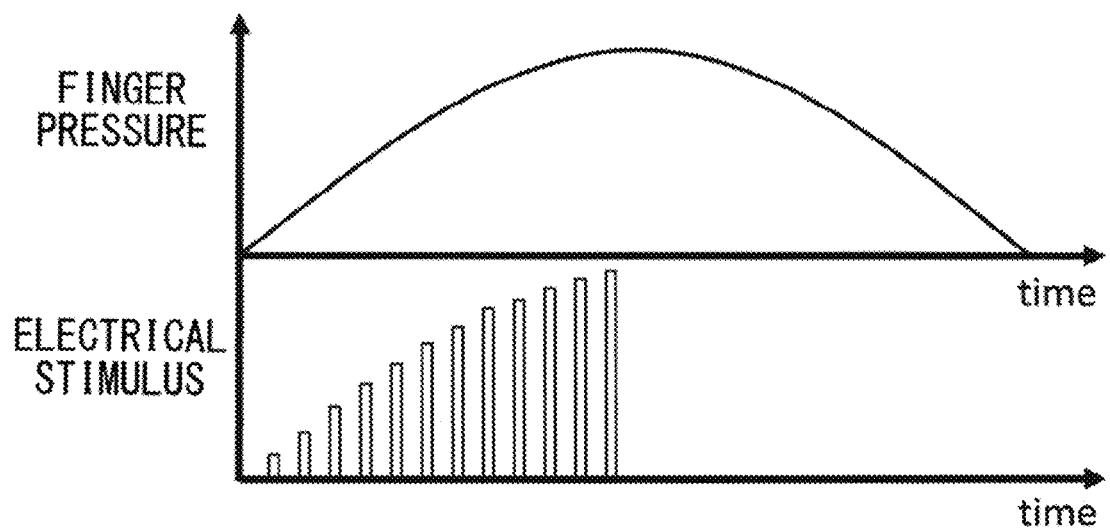
FIG. 20 is a diagram showing an experimental condition (Press condition) used for presenting a soft feeling in Experiment 1 according to the first exemplary embodiment.
Figure 21:
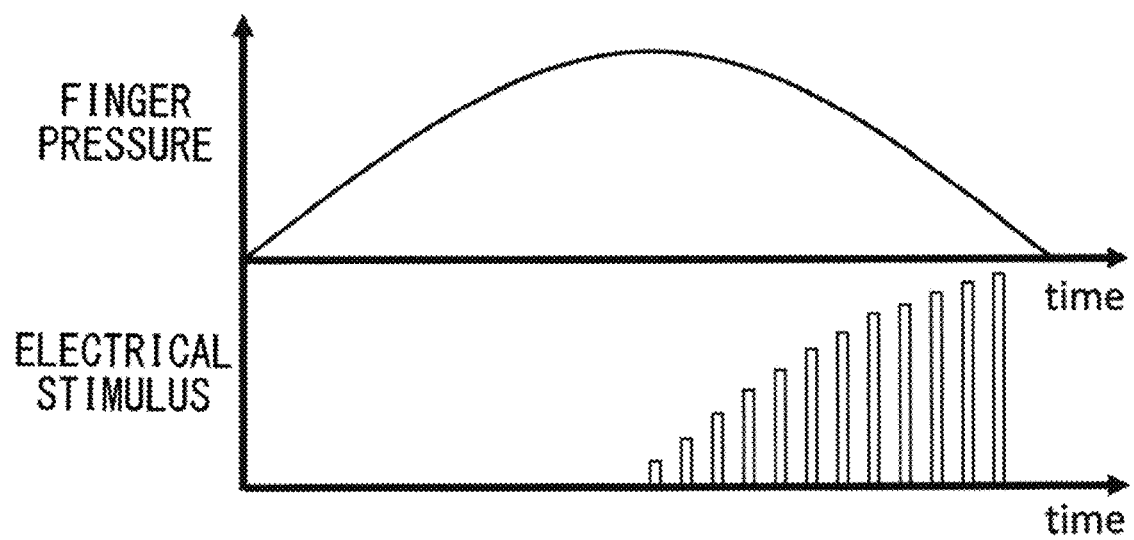
FIG. 21 is a diagram showing an experimental condition (Release condition) used for presenting a sticky feeling in Experiment 1 according to the first exemplary embodiment.

As shown in FIGS. 18 and 19, in Experiment 1 according to the first exemplary embodiment, a film-like force sensor was used as the input unit 112. As the output unit 114, an electrical tactile display having a diameter of 1.4 mm was used in which electric stimulators were arranged in a 4 by 5 matrix at intervals of 2 mm. As shown in the figure, a finger fixing tool was used to maintain contact between an electrode for electrical stimulation and the skin. In the present experiment, unless otherwise specified, cathodal stimulation was used for the polarity of all the electrical stimulation. Further, all twenty electrodes were stimulated one at a time with a pulse period of 60 pps (pulses per sec). FIG. 20 is a diagram showing an experimental condition (Press condition) used for presenting a soft feeling in Experiment 1 according to the first exemplary embodiment. FIG. 21 is a diagram showing an experimental condition (Release condition) used for presenting a sticky feeling in Experiment 1 according to the first exemplary embodiment.

Figure 22:
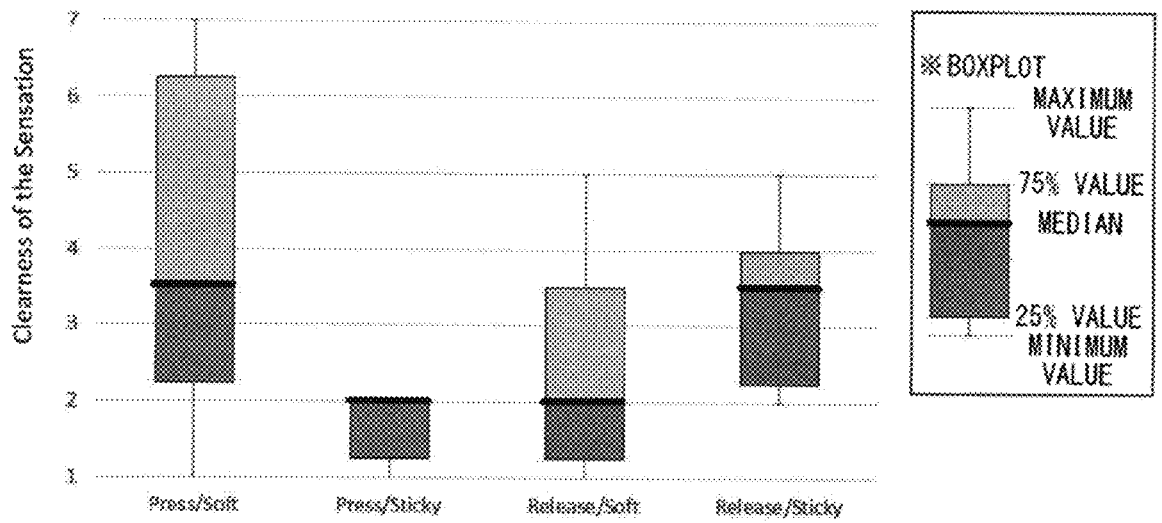
FIG. 22 is a diagram showing subjective evaluation experimental results according to Experiment 1 according to the first exemplary embodiment.

In order to confirm that desired tactile feeling presentation can be realized, seven levels of subjective evaluation experiments were conducted. The target pressing down pressure was changed sinusoidally between 0 g and 500 g at 1 Hz. The target pressing down pressure and the current pressing down pressure were displayed on a screen, and subjects were asked to change the force for pressing the finger against a plate according to these pressures such that the force was adjusted so as to clearly feel the stimulation from the electric stimulation. The subjects were asked to provide an answer indicating the soft feeling felt at this time in the seven subjective levels from "not feeling at all" to "feeling clearly". In the same manner, the subjects were asked to provide an answer indicating the sticky feeling in the seven subjective levels. There were six subjects. FIG. 22 is a diagram showing subjective evaluation experimental results according to Experiment 1 according to the first exemplary embodiment. The vertical axis shows numerical values for the seven levels of subjective evaluation. Further, the horizontal axis indicates, starting from the left, a subjective evaluation result of a soft feeling under the Press condition, a subjective evaluation result of a sticky feeling under the Press condition, a subjective evaluation result of a soft feeling under the Release condition, and a subjective evaluation result of a sticky feeling under the Release condition.

As shown in FIG. 22, under the Press condition, a soft feeling was able to be clearly presented as expected, and no sticky feeling was generated. Under the Release condition, a result was obtained indicating that a sticky feeling was felt more than a soft feeling. A result was obtained indicating that a soft feeling was felt more under the Press condition than the Release condition and that a sticky feeling was felt more under the Release condition than the Press condition. Therefore, it was shown that both the soft feeling and the sticky feeling were able to be presented by the presentation of cutaneous sensation by electric stimulation according to the pressing down force. In other words, in Experiment 1, with regard to the hypothesis of whether it was possible to present stickiness by changing stimulation with respect to the force at the fingertip, it was confirmed that stickiness was able to be presented by changing stimulation with respect to the "force" at the fingertip.

Figure 23:
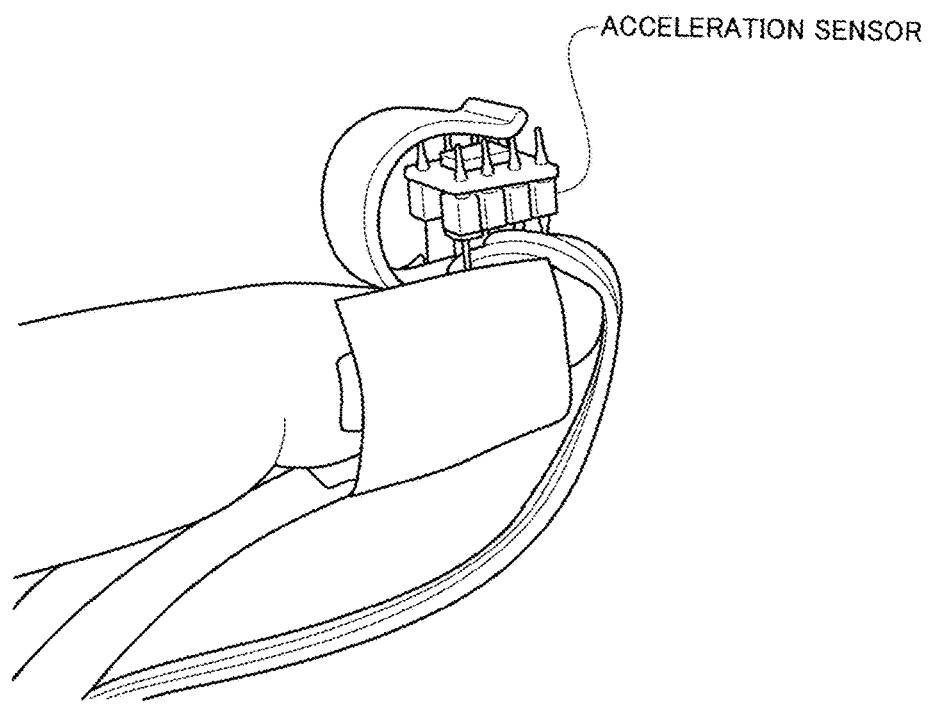
FIG. 23 is a photo diagram showing a state where an experimental device used in Experiment 2 according to the first exemplary embodiment is worn on the finger.
Figure 24:
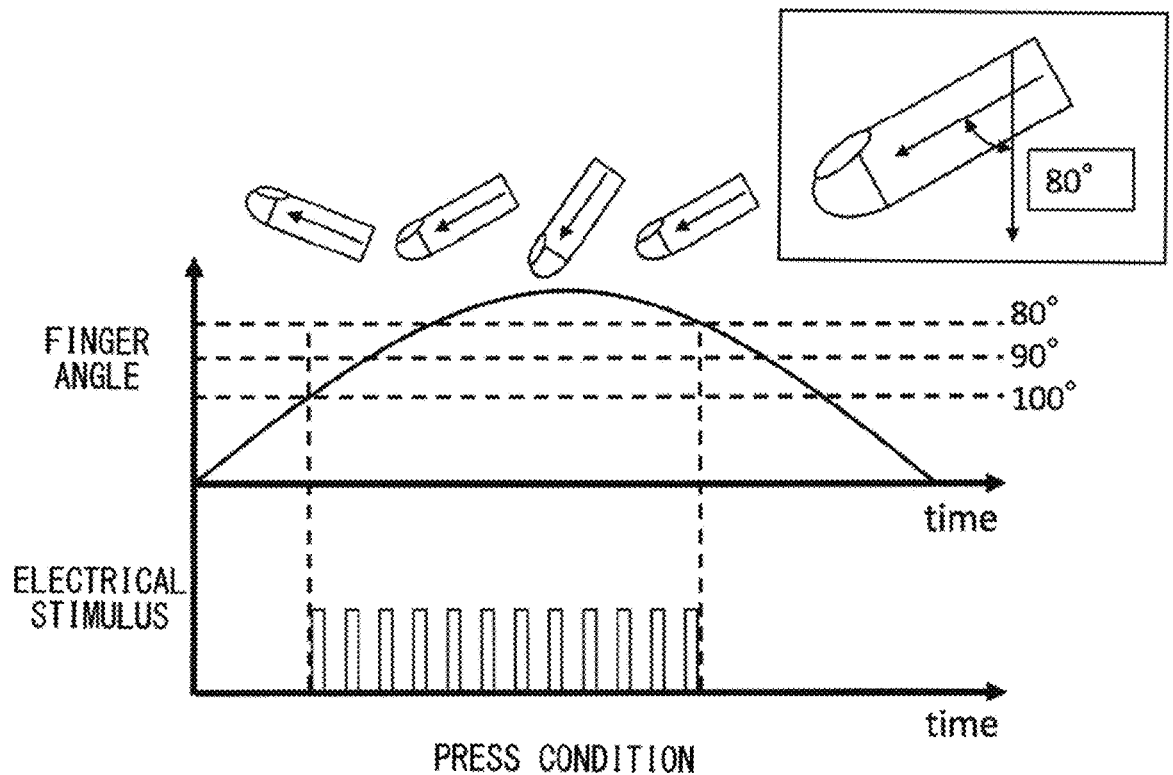
FIG. 24 is a diagram showing an experimental condition (Press condition) of Experiment 2 according to the first exemplary embodiment.
Figure 25:
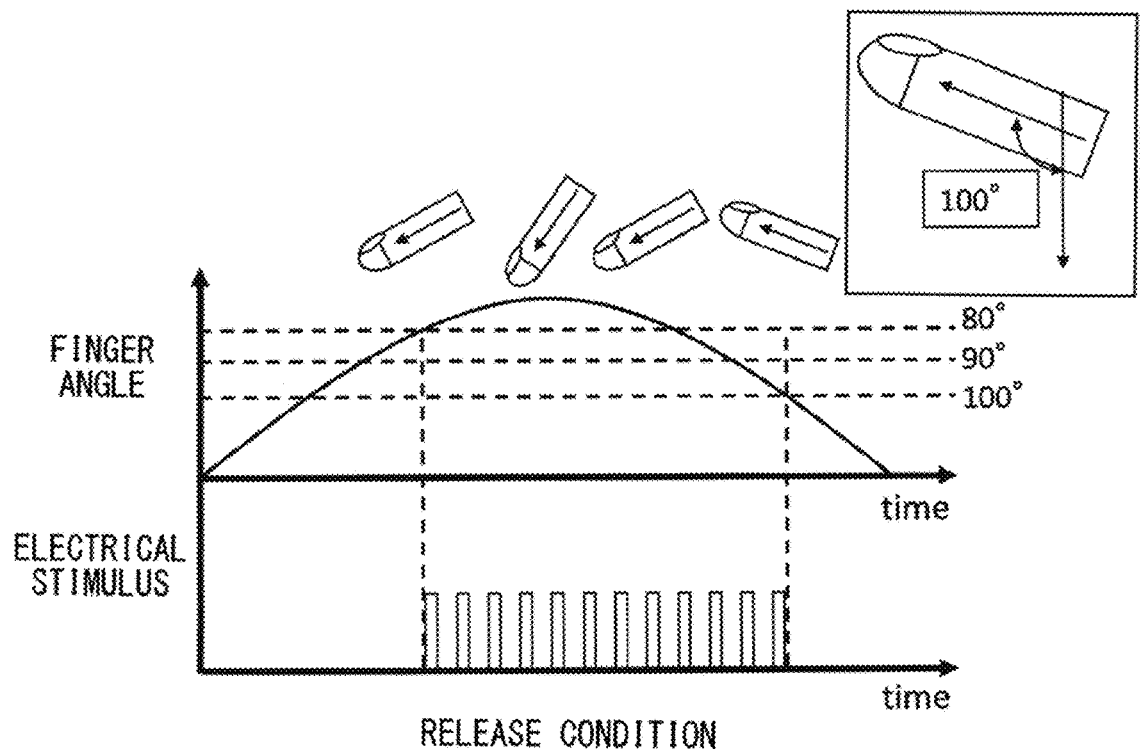
FIG. 25 is a diagram showing an experimental condition (Release condition) of Experiment example 2 according to the first exemplary embodiment.

Subsequently, in Experiment 2 in the present exemplary embodiment, an experiment was conducted as to whether it was possible to present stickiness by changing stimulation with respect to the "displacement" at the fingertip. FIG. 23 is a photo diagram showing a state where an experimental device used in Experiment 2 according to the first exemplary embodiment is worn on the finger. As shown in FIG. 23, unlike the device configuration in Experiment 1, an acceleration sensor is provided. Thereby, the tilt of the finger can be measured, and the stimulation can be changed according to the movement of the finger in the air. The desk and the pressure sensor of Experiment 1 are not used. FIG. 24 is a diagram showing an experimental condition (Press condition) of Experiment 2 according to the first exemplary embodiment. FIG. 25 is a diagram showing an experimental condition (Release condition) of Experiment example 2 according to the first exemplary embodiment.

As shown in FIG. 24, under the Press condition, at the time of a pushing motion, a lifting up motion was performed at an angle of 100 degrees or less from the vertically downward direction, and stimulation was provided at a constant current value adjusted by a volume at an angle of 80 degrees or more. On the other hand, as shown in FIG. 25, under the Release condition, stimulation was provided at a constant current value adjusted by a volume at an angle of 100 degrees or less from the vertically downward direction at the time of a pushing motion and at an angle of 80 degrees or more at the time of a lifting up motion. As a result, under the Press condition, the stimulation range at the time of the pushing motion became larger than that at the time of the lifting up motion, and under the Release condition, on the contrary, the stimulation range at the time of the lifting up motion became larger than that at the time of the pushing operation. Thus, it can be considered that the hysteresis characteristic was simulated.

Figure 26:
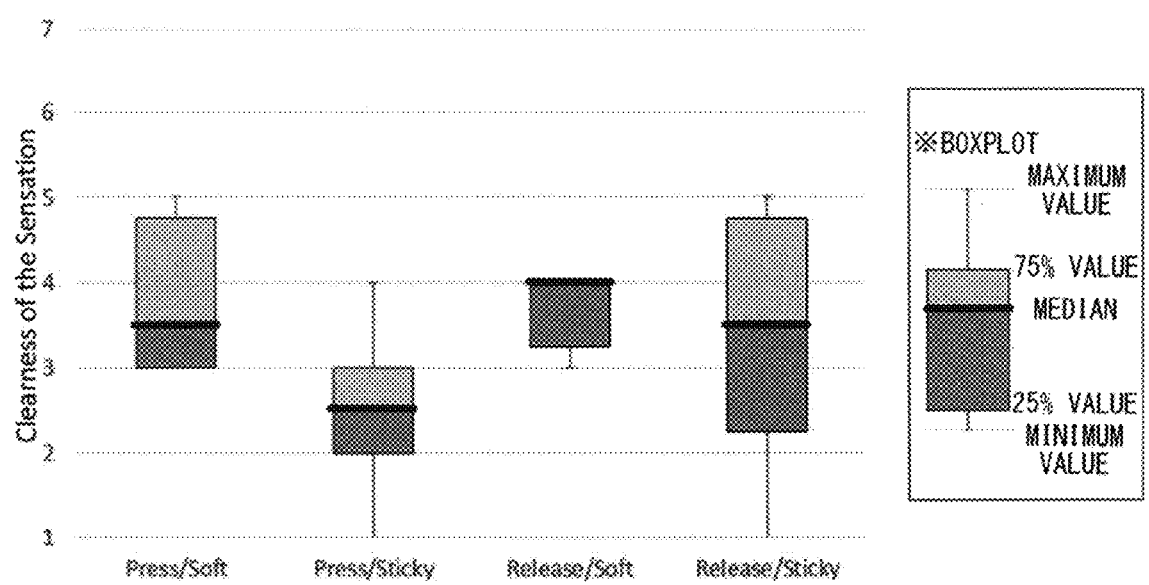
FIG. 26 is a diagram showing subjective evaluation experimental results according to Experiment 2 according to the first exemplary embodiment.

In order to confirm that desired tactile feeling presentation can be realized, seven levels of subjective evaluation experiments were conducted. The angle of the finger was changed sinusoidally between 60 degrees and 120 degrees every 1.5 seconds. The target pressing down pressure and the current pressing down pressure were displayed on a screen, and subjects were asked to move their fingers according to these pressures so as to make adjustment to clearly feel the stimulation from the electric stimulation. The subjects were asked to provide an answer indicating the soft feeling felt at this time in the seven subjective levels from "not feeling at all" to "feeling clearly". In the same manner, the subjects were asked to provide an answer indicating the sticky feeling in the seven subjective levels. There were six subjects. FIG. 26 is a diagram showing subjective evaluation experimental results according to Experiment 2 according to the first exemplary embodiment. The vertical axis shows numerical values for the seven levels of subjective evaluation. Further, the horizontal axis indicates, starting from the left, a subjective evaluation result of a soft feeling under the Press condition, a subjective evaluation result of a sticky feeling under the Press condition, a subjective evaluation result of a soft feeling under the Release condition, and a subjective evaluation result of a sticky feeling under the Release condition.

As shown in FIG. 26, a result was obtained indicating that, under the Press condition, a soft feeling was clearly felt and a sticky feeling was not felt. Under the Release condition, there was almost no difference between a soft feeling and a sticky feeling. A result was obtained indicating that a sticky feeling was felt more under the Release condition than the Press condition. In conclusion, it was confirmed that, by providing hysteresis to the stimulation with respect to the motion through electrical stimulation in the movement in the air, a sticky feeling was able to be presented.

As described above, in the first exemplary embodiment, a soft feeling was able to be presented by applying stronger stimulation at the time of the pressing down, using a technique of changing electrical stimulation with respect to the force at the fingertip in a situation where the fingertip is pressed against the object in Experiment 1. Further, it was found that it is possible to present a sticky feeling by applying stronger stimulation at the time of the lifting. Further, in Experiment 2, it was confirmed that a sticky feeling was able to be presented by providing hysteresis of applying stimulation that was longer at the time of the pressing down than that at the time of the lifting, using a technique of changing electrical stimulation with respect to the displacement of the fingertip in a situation where the fingertip was moved in the air.

Advantages of electrical stimulation being better than stimulation by a mechanical pin matrix or the like include the following. When there is stickiness, it is normally necessary to reproduce a situation where pressure sensation is generated although the finger is being lifted upward. However, the reproduction of the situation is difficult with mechanical stimulation. In the case of a stationary (desk-top) tactile display, there is a problem that the total amount of stimulation cannot be changed since the total amount of reaction force from each pin to the skin is always equal to the pressing down force of the finger in the case of stimulation by a pin matrix, which moves up and down. By using electrical stimulation, the total amount of stimulation can be changed independently of the pressing down force of the finger, and the problem with mechanical stimulation can be overcome. Further, in the case of a wearable tactile display, there is a problem that, since reaction force is generated inside the fingerstall being put on due to the total amount of the reaction force from each pin to the skin in the case of stimulation by a pin matrix, which moves up and down, counter force is generated on the backside of the finger even when the stimulation is desired to be applied only to the finger pad. By using electrical stimulation, stimulation can be applied independently to the finger pad.

Figure 27:
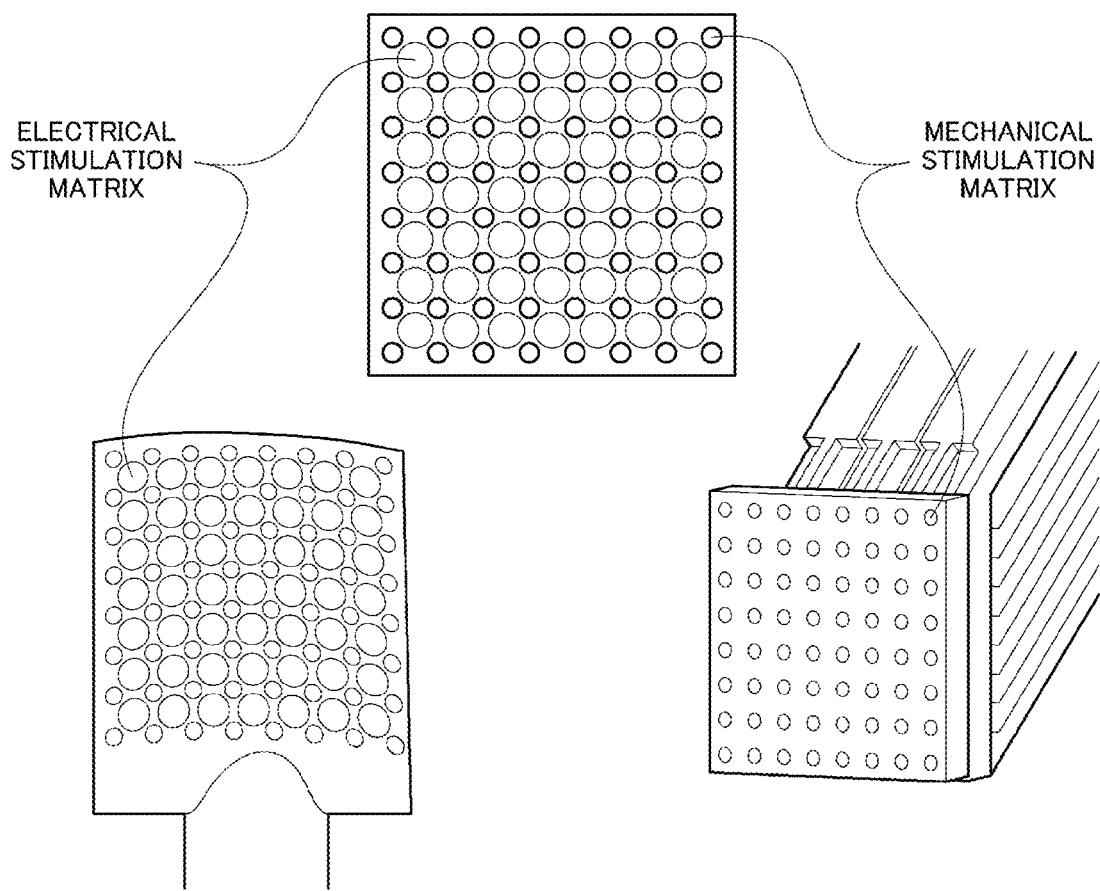
FIG. 27 is a diagram showing a configuration example of a high-density presentation device in which an electrical stimulation matrix and a mechanical stimulation matrix are combined.
Figure 28:
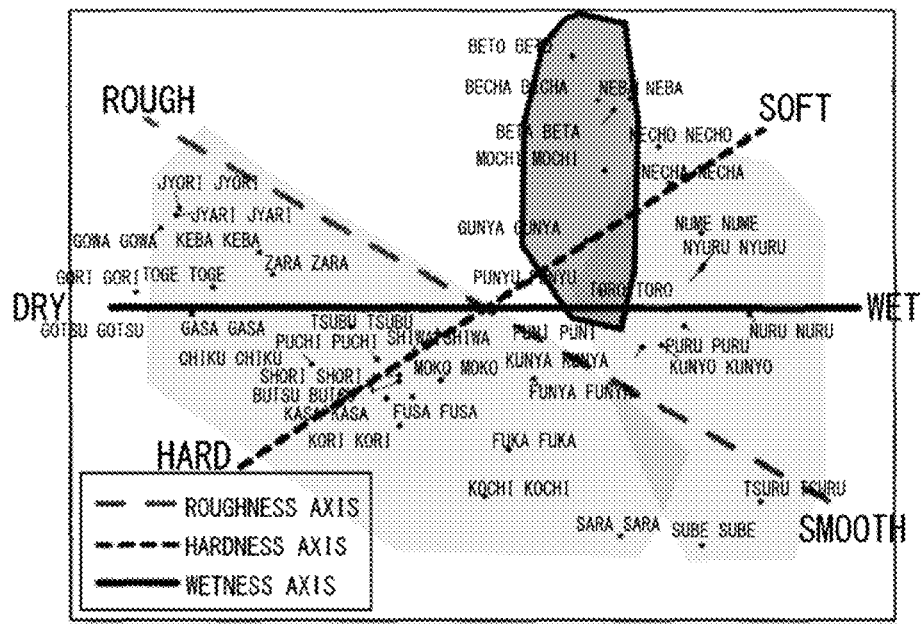
FIG. 28 is a diagram showing the range of Example 1 (axis 1) in the above-described onomatopoeia map (FIG. 3)

Instead of choosing between mechanical stimulation and electrical stimulation, an output device that makes use of the characteristics of both may be constructed. FIG. 27 is a diagram showing a configuration example of a high-density presentation device in which an electrical stimulation matrix and a mechanical stimulation matrix are combined. In the case of electrical stimulation, there are problems related to sensation stability and sensation quality with prolonged stimulation. However, electrical stimulation also has an advantage of providing a very natural sensation in the case of brief pulse presentation. In addition, electrical stimulation has an advantage of being able to output stimulation with high temporal resolution (such as vibration sensation). Mechanical stimulation, on the other hand, comes with a problem that time responsiveness is poor especially when the stimulation is made smaller as in matrix presentation. In addition, in the case of increasing time responsiveness, there is a problem that presentation can be achieved only at a certain frequency since a design where resonance is generated is employed. However, there are also advantages that it is easy to continue presenting a certain pressure and that pressure sensation presentation is easy. Therefore, as shown in FIG. 27, it is possible, by combining the gains and losses of both, to use a technique of presenting a variation component of tactile sensation using an electrical tactile display and presenting a pressure distribution component of tactile sensation using mechanical stimulation. In the present configuration example, the mechanical stimulation matrix and the electrical stimulation matrix were set at intervals of 3 mm each, and for the mechanical stimulation matrix, a dot matrix display manufactured by KGS corporation was used. The electrode size is 2.4 mm in diameter. FIG. 28 is a diagram showing the range of Example 1 (axis 1) in the above-described onomatopoeia map (FIG. 3).

Figure 29:
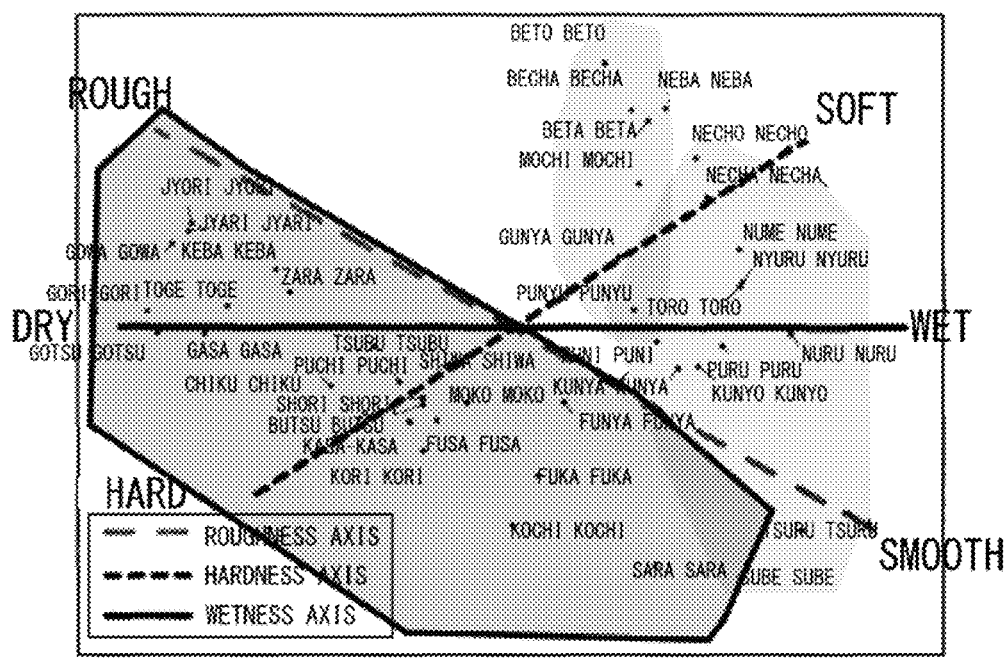
FIG. 29 is a diagram showing the range of a tactile feeling expression indicated by resistance force in the horizontal direction.

According to the above exemplary embodiment, it is shown that expression by force in the vertical direction can be done as shown in the thick-framed range in FIG. 28. This region can be considered to be a region that can be expressed by the duration of the force in the vertical direction. In other words, this region can be expressed by presenting vertical force for a longer period of time toward the upward direction during the "push-in and lifting" motion of the finger. For example, a "mochi-mochi (sticky and springy)" tactile feeling and a "beta-beta (sticky)" tactile feeling on the onomatopoeic map can be expressed in a distinguishing manner by the duration of the force in the vertical direction. In the above-described exemplary embodiment, the force in the vertical direction is shown; however, by applying the prior knowledge of the present inventors (Kajimoto et al. 1999), pressure sensation can be selectively caused by a cathodic electrical stimulus, and the sensation can be felt as force in the horizontal direction by presenting the cathodic electrical stimulus (pressure sensation presentation) in a wide range and strengthening the stimulation while horizontally moving the stimulus (Sato et al. 2010). For example, it is also possible to express the resistance force (frictional force) when the finger slides in the horizontal direction. FIG. 29 is a diagram showing the range of a tactile feeling expression indicated by resistance force in the horizontal direction.

In order to present the rough side onomatopoeia on this roughness and smoothness axis, it is necessary to present resistance force (for example, a difference between a zara-zara feeling (rough feeling) and a kasa-kasa feeling (dry feeling). Although most resistance force is horizontal force, vertical force is involved in some onomatopoeia as described above.

The region on the lower left side of the roughness-smoothness axis shown in FIG. 29 can be mainly expressed by a combination of resistance force and vibration. However, it is considered that temperature is involved in a part of the lower right region (sube sube (smooth), tsuru tsuru (slippery), etc.). It is considered that this region can be expressed by presenting stronger resistance force toward the upper left direction in the figure and presenting vibration with a lower center frequency toward the lower left direction. For example, "zara-zara (rough)", "gotsu-gotsu (rugged)", and "kasa-kasa (dry)" can be expressed while being distinguished by the strength of resistance force and the component of vibration. It is considered that gotsu-gotsu (rugged) can be expressed at a frequency that is lower than that for zara-zara (rough) and that kasa-kasa (dry) can be expressed by a resistance force that is weaker than that for zara-zara (rough).

Figure 30:
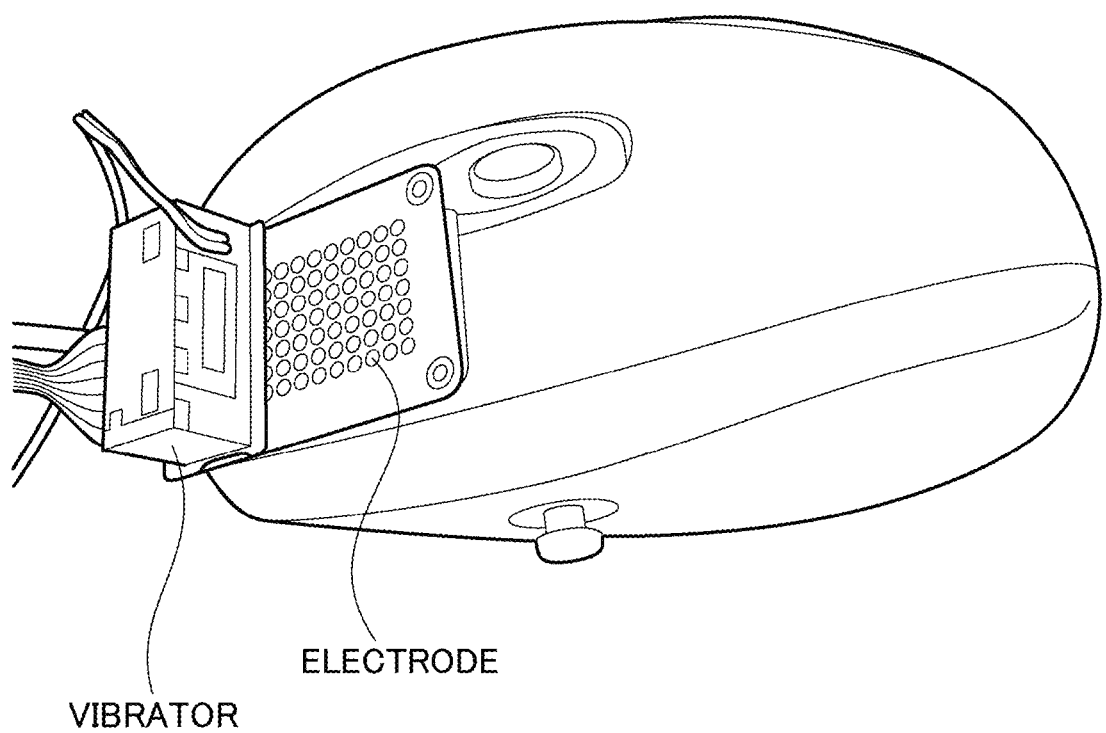
FIG. 30 is a diagram showing a device used for an experiment (see prior knowledge (Kajimoto, et al. 1999, Sato et al. 2010) for details of the experimental device etc.)

Therefore, an experiment was conducted to find out whether a distinction among "zara-zara (rough)", "gotsu-gotsu (rugged)", and "kasa-kasa (dry)" was able to be expressed by combining the expression of horizontal force by electricity and vibration. FIG. 30 is a diagram showing a device used for the experiment. For details of the experimental device, etc., see prior knowledge (Kajimoto, et al. 1999, Sato et al. 2010).

Figure 31:
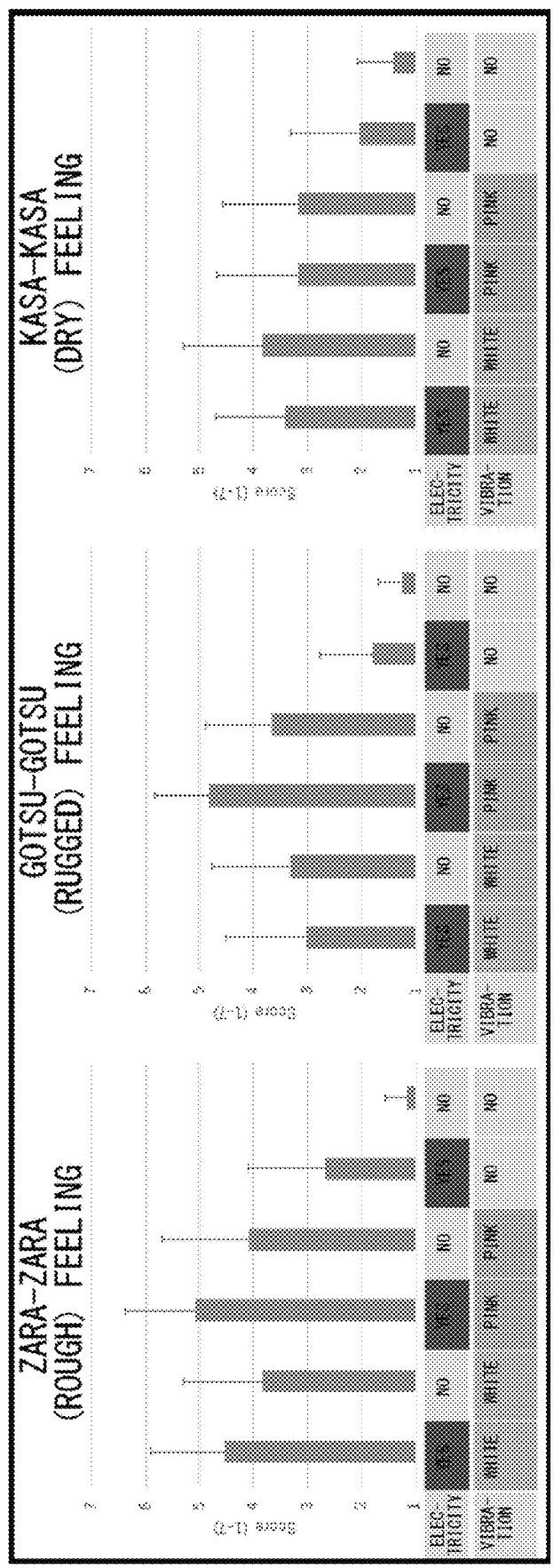
FIG. 31 is a diagram showing the results of an experiment of reproducing "zara-zara (rough) feeling", "gotsu-gotsu (rugged) feeling", and "kasa-kasa (dry) feeling"

As experimental conditions, there were two conditions: yes/no, for the presentation of horizontal force by electrical stimulation, and there were three conditions: white noise (high); pink noise (low), and no, for the presentation method for a vibration stimulus. Then, twelve subjects answered the realness of "zara-zara (rough) feeling", "gotsu-gotsu (rugged) feeling", and "kasa-kasa (dry) feeling" for each condition. FIG. 31 is a diagram showing the results of the experiment of reproducing "zara-zara (rough) feeling", "gotsu-gotsu (rugged) feeling", and "kasa-kasa (dry) feeling".

As shown in FIG. 31, it was found that a zara-zara (rough) feeling occurred in the whole vibration, a gotsu-gotsu (rugged) feeling occurred in the pink noise, and a kasa-kasa (dry) feeling occurred in the white noise. Further, it was found that the realness of the zara-zara (rough) feeling and the realness of the gotsu-gotsu (rugged) feeling increased by electrical stimulation (horizontal force expression). On the contrary, the kasa-kasa (dry) feeling was felt more real when there was no electrical stimulation (horizontal force expression). Based on the above results, it was proved that zara-zara (rough), gotsu-gotsu (rugged), and kasa-kasa (dry) were able to be expressed in a distinguishing manner in a vibration-force plane.

Figure 32:
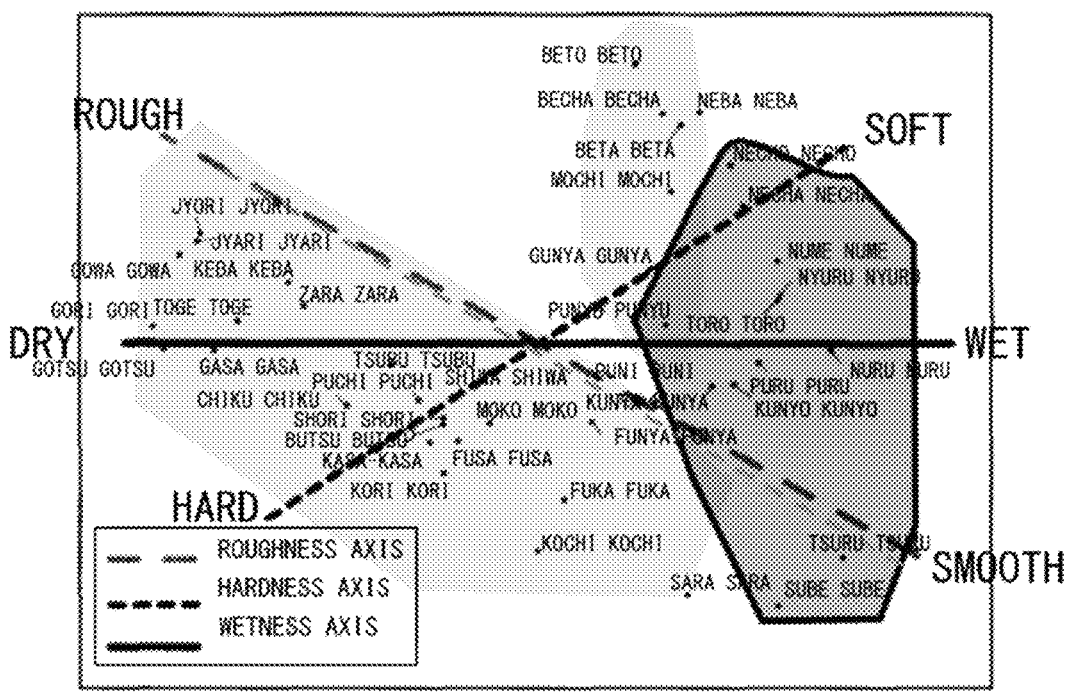
FIG. 32 is a diagram showing the range of the expression of tactile sensation reproduced by resistance force and temperature.

Next, an experiment was conducted regarding expression by resistance force and temperature. FIG. 32 is a diagram showing the range of the expression of tactile sensation reproduced by resistance force and temperature. The region to the right of the vertical dotted line in the figure was considered to be able to be expressed mainly by a combination of resistance force and temperature. The dryness-wetness axis can be expressed by temperature decrease, and even in the previous research by the present inventors, the moistness of a cloth is expressed by temperature decrease (Sato et al., 2016). Conversely, there is no receptor that perceives humidity itself. The hardness-softness axis can be mainly expressed by vibration, and, along the axis in the figure, the center frequency of vibration is low in the lower left region (for example, gotsu-gotsu (rugged)), and the center frequency becomes higher toward the upper right (for example, zara-zara (rough) and kasa-kasa (dry)).

The region indicated by the thick frame in FIG. 32 can be considered to be able to be expressed by presenting larger temperature decrease toward the right direction in the figure and presenting stronger resistance force or longer resistance force toward the upper left direction (the direction along the axis of resistance force). Based on this, an experiment was conducted as to whether, for example, "nume nume (slimy)", "nuru nuru (slimy and slippery)", "tsuru tsuru (slippery)", and "sube sube (smooth)" can be expressed in a distinguishing manner. It can be considered that larger temperature decrease is required toward the right in the region (e.g., nume nume (slimy) vs. nuru nuru (slimy and slippery). On the other hand, the left side on the outside the region is not involved in a temperature decrease. Since temperature decrease also represents the material (e.g., temperature decrease that occurs when touching a metal), the distinguishing thereof is also difficult for a human. For this reason, this axis is called a dryness and wetness axis for the time being; however, the expression of a material feeling is also included (e.g., "tsuru tsuru (slippery)" and "sara sara (dry)").

Figure 33:
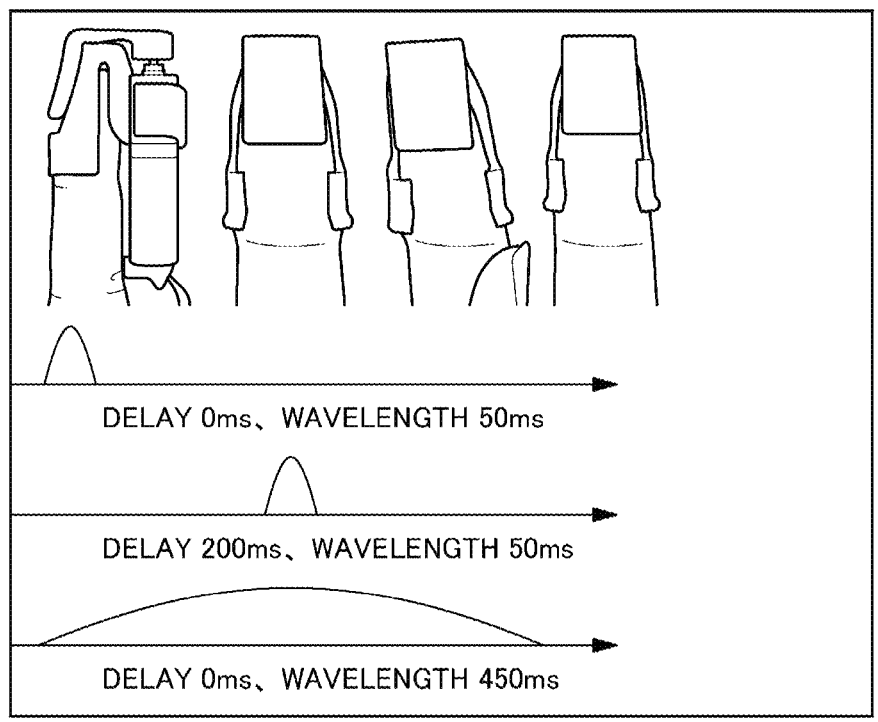
FIG. 33 is a diagram showing devices and vibration waveforms used for experiments.

As an example, "tsuru tsuru (slippery)", "sube sube (smooth)", "nume nume (slimy)", and "nuru nuru (slimy and slippery)" were considered to be able to be reproduced by expressions of having no resistance force but temperature decrease, having no resistance and no temperature decrease, having resistance force but no temperature decrease, having resistance force and temperature decrease, respectively. FIG. 33 is a diagram showing devices and vibration waveforms used for experiments.

Figure 34:
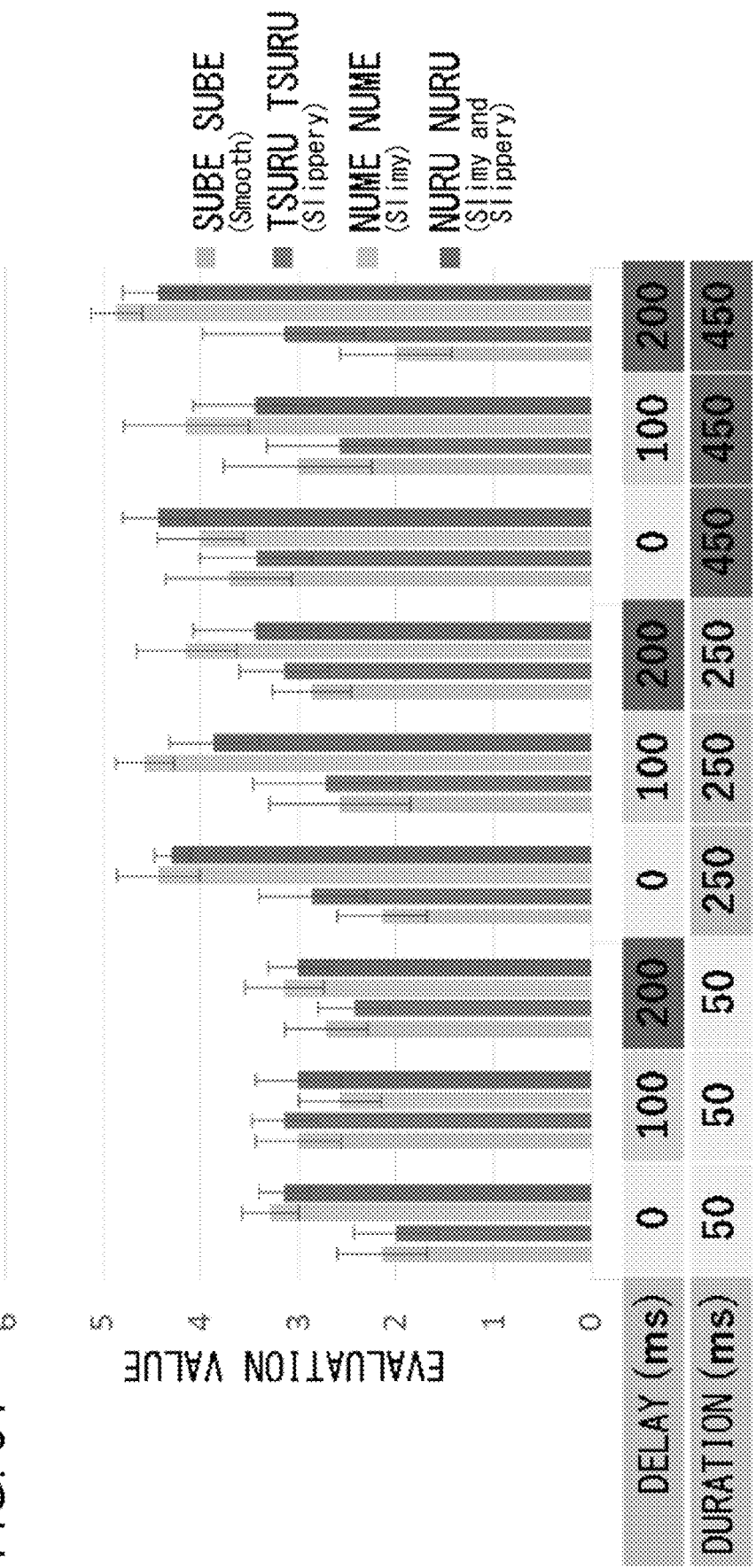
FIG. 34 is a diagram showing the results of an experiment of reproducing "sube sube (smooth)", "tsuru tsuru (slippery)", "nume nume (slimy)", and "nuru nuru (slimy and slippery)"

For preliminary examination, expressions were made by actual horizontal skin deformation presentation instead of electrical stimulation. Horizontal force presentation was performed by changing "delay (0, 100, 200 ms)" and "duration of stimulation (50, 250, 450 ms)" with respect to the movement of the finger. Then, for 3×3=9 conditions, nine subjects answered the realness of "sube sube (smooth)", "tsuru tsuru (slippery)", "nume nume (slimy)", and "nuru nuru (slimy and slippery)". FIG. 34 is a diagram showing the results of an experiment of reproducing "sube sube (smooth)", "tsuru tsuru (slippery)", "nume nume (slimy)", and "nuru nuru (slimy and slippery)".

Figure 35:
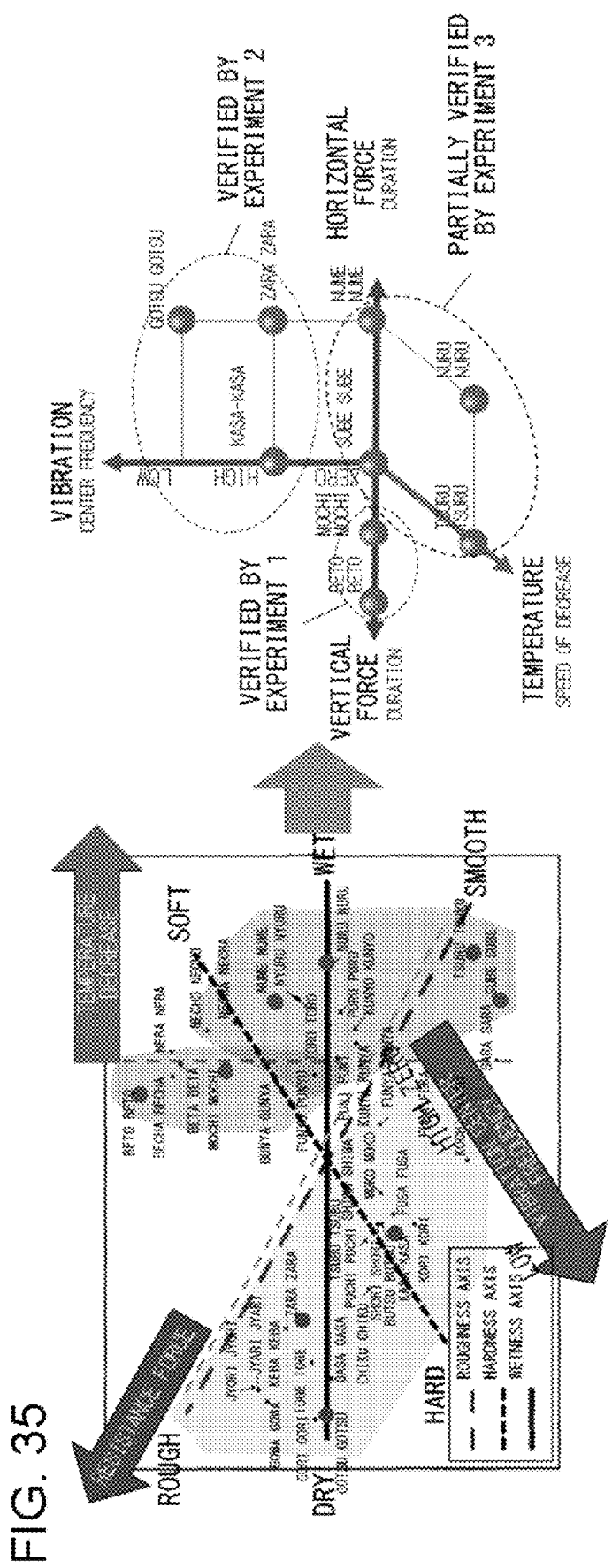
FIG. 35 is a diagram showing an onomatopoeia map that shows a psychological space and a stimulation map of a physical space expressed by three axes of force, vibration, and temperature.

As shown in FIG. 34, both a nume-nume (slimy) feeling and a nuru-nuru (slimy and slippery) feeling were found to occur strongly as the duration of the stimulation increased. For a sube-sube (smooth) feeling and a tsuru-tsuru (slippery) feeling, there was no change and constant low values were exhibited. In other words, it was found that "nume-nume (slimy)" and "nuru-nuru (slimy and slippery)" were able to be expressed in a distinguishing manner from "sube-sube (smooth)" and "tsuru-tsuru (slippery)" by resistance force presentation. In the preliminary examination, the tendency was observed where the subjects answered while distinguishing tsuru-tsuru (slippery) from sube-sube (smooth) according to temperature decrease. FIG. 35 is a diagram showing an onomatopoeia map that shows a psychological space and a stimulation map of a physical space expressed by three axes of force, vibration, and temperature.

Based on the above experiments, it was shown that the expression of a tactile feeling was possible in the entire region of the onomatopoeia map through three regions: "a region that can be expressed by the duration of force in the vertical direction"; "a region that can be expressed by a combination of resistance force and vibration"; and "a region that can be expressed by a combination of resistance force and temperature". It was shown that, as shown in the onomatopoeia map, this psychological axis was able to be divided mainly into the roughness and smoothness axis, the hardness and softness axis, and the dryness and wetness axis and, as shown on the right side of the figure, a tactile feeling expressed by the psychological space (onomatopoeia map) was able to be expressed by a physical space (combination of physical quantities) by combining roughness-smoothness expression according to "force", hardness-softness expression according to "vibration", and dryness-wetness expression according to "temperature" as physical stimulation.

In other words, it was experimentally verified that the roughness-smoothness axis, the hardness-softness axis, and the dryness-wetness axis of the onomatopoeia map was able to be expressed by resistance force (horizontal force and vertical force), vibration, and temperature. Based on the analysis of "onomatopoeia" expressed when touching various types of materials, the psychological space of a tactile feeling was found to be able to be mainly expressed by the roughness and smoothness axis, the hardness and softness axis, and the dryness and wetness axis. In particular, by using a vertical and horizontal force presentation means using electrical stimulation, advantages of not only compactness but also the naturalness of the spatial distribution of occurrence sensation were able to be achieved compared with mechanical stimulation.

Specifically, since beto-beto (sticky) and mochi-mochi (sticky and springy) can be expressed by vertical force, gotsu-gotsu (rugged)), kasa-kasa (dry), and zara-zara (rough) can be expressed by a combination of horizontal force and vibration, and sube-sube (smooth), tsuru-tsuru (slippery), nume-nume (slimy), and nuru-nuru (slimy and slippery) can be expressed by a combination of horizontal force and temperature, it was found that, the roughness-smoothness axis, the hardness-softness axis, and the dryness-wetness axis of the onomatopoeia map was able to be expressed by resistance force (horizontal force and vertical force), vibration, and temperature.

Second Exemplary Embodiment

The second exemplary embodiment using the tactile feeling presentation system according to the present embodiment will be explained in the following.

Temperature presentation tends to be delayed in the presentation due to the characteristics of the element and the nature of the heat. Also, there is a problem that the perception is difficult because the temporal and spatial two-point discrimination threshold of temperature stimulation is large due to the physiological characteristics of a human being. In the second exemplary embodiment, it was confirmed experimentally that a perception point was able to be clarified temporally and spatially mainly for temperature presentation.

Figure 36:
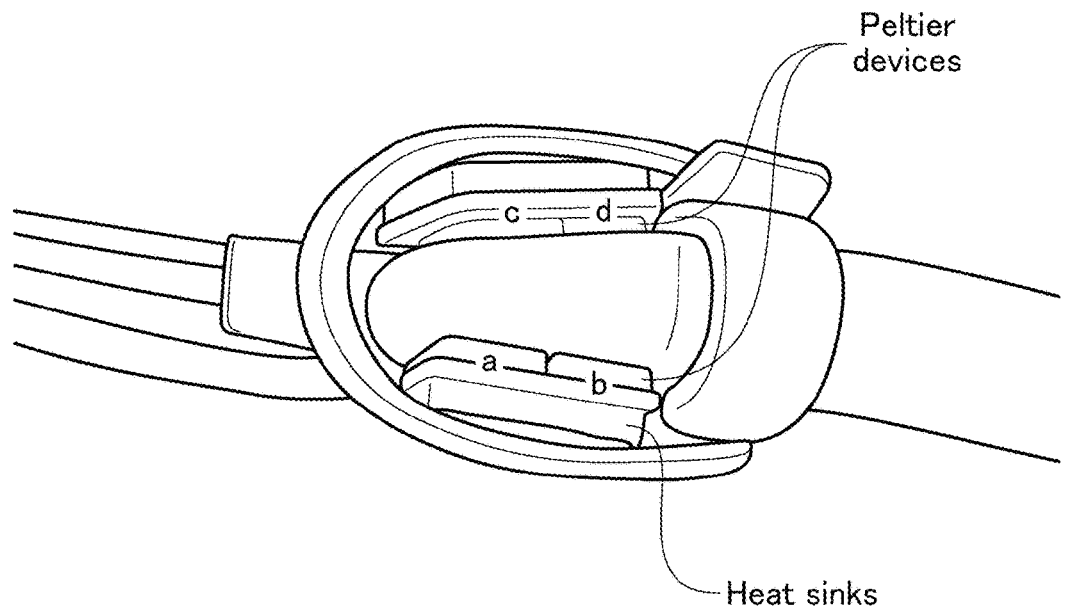
FIG. 36 is a diagram showing the configuration of an experimental device (Peltier element) according to the second exemplary embodiment.
Figure 37A:
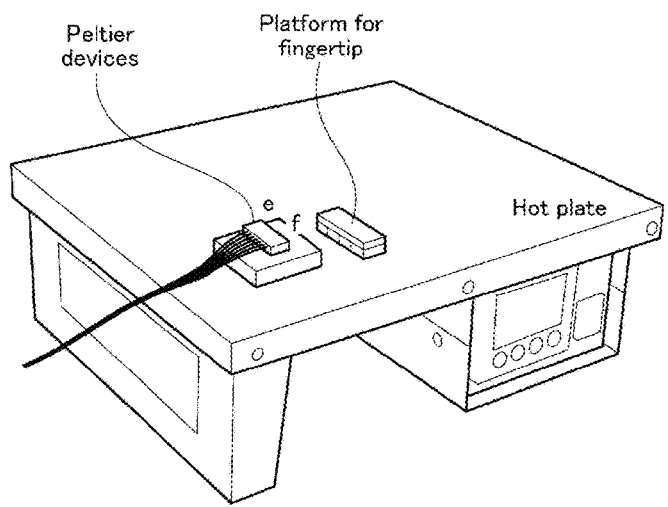
FIGS. 37A and 37B are diagrams respectively showing that the skin temperature was adjusted using a hot plate and that a Peltier element was attached to the finger side surface in an experimental environment according to the second exemplary embodiment and an example of how a Peltier element is attached.

That is, as the purpose of the second exemplary embodiment, it was confirmed whether a warm/cold feeling obtained from an object was changed so as to be able to realize the augmented reality of the warm/cold feeling by presenting the warm/cold stimulation to a finger side surface portion at the same time a finger pad touches the object. There were nine female subjects aged from 18 to 21 years old. No prior knowledge regarding the experimental hypothesis was provided to the subjects. The skin temperature of the finger pad was adjusted to 32 degrees, and the experiment was then conducted. FIG. 36 is a diagram showing the configuration of an experimental device (Peltier element) according to the second exemplary embodiment, and FIGS. 37A and 37B are diagrams respectively showing an experimental environment according to the second exemplary embodiment and an example of how a Peltier element is attached.

Figure 37B:
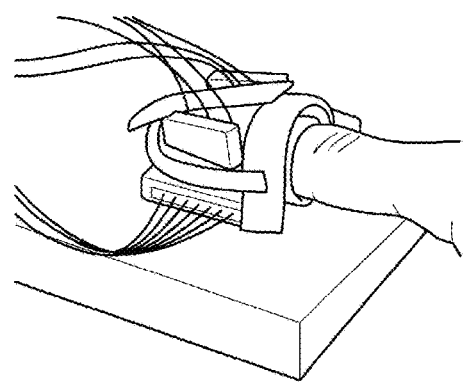

As shown in FIG. 36 and FIG. 37B, a Peltier element was attached to the finger side surface (parts indicated by a, b, c, and d). Also, as shown in FIG. 37A, the skin temperature was adjusted using a hot plate. On the hot plate, a Peltier element to be touched and an aluminum plate (Platform) for rest were placed.

As a method of the experiment according to the second exemplary embodiment, at intervals of 30 seconds, an object to be touched was touched at the same time a signal was provided. The subjects were asked to feel a randomly chosen stimulus when touching the object to be touched for two seconds and asked to answer the stimulus strength felt at the finger pad in a numerical number while setting the perceived strength with respect to a standard stimulus as 100. Three trials were conducted for each condition, and the average value was adopted as the perceived strength of the subject.

Figure 38:
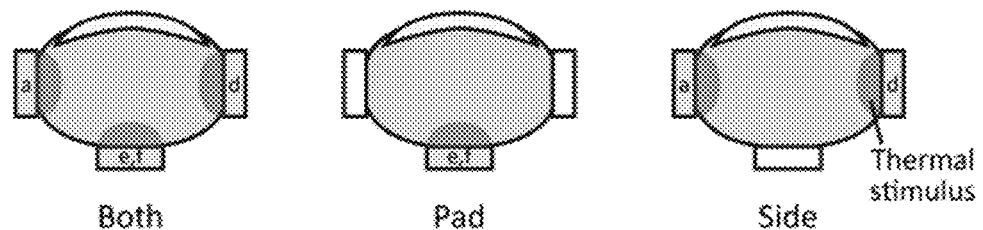
FIG. 38 is a diagram schematically showing a position at which a thermal stimulus is provided, when a finger is viewed from the fingertip side.

As the conditions for the second exemplary embodiment, the types of the stimulation were set to be two kinds: warm; and cold. Further, as shown in FIG. 38, there were three kinds of stimulus presentation sites, which were: Both (side and pad); Pad (pad only); and Side (side surface only). FIG. 38 is a diagram schematically showing a position at which a thermal stimulus is provided, when a finger is viewed from the fingertip side. Two Peltier elements were used for each of the pad and the side, and there were two kinds of stimulation strength: (warm and strong 4° C./s, warm and weak 3° C./s, cold and strong 3° C./s, and cold and weak 2° C./s). A strong stimulus to Pad (pad only) was used as the standard stimulus, and the strength of the standard stimulus was checked for every six trials.

Figure 39A:
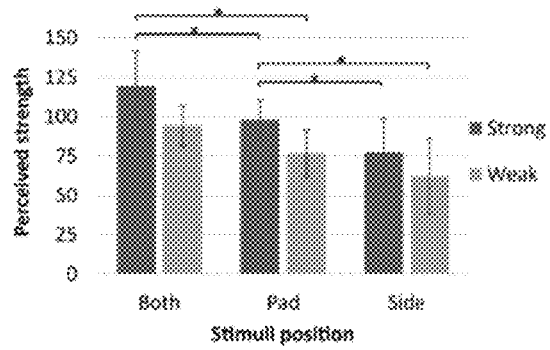
FIGS. 39A and 39B are graphic diagrams showing experimental results of the second exemplary embodiment.
Figure 39B:
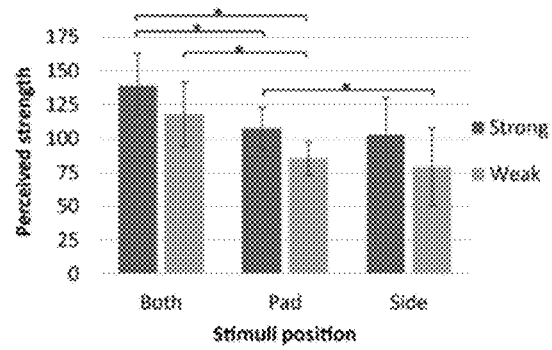

FIG. 39 are graphic diagrams showing experimental results of the second exemplary embodiment. FIG. 39A shows the case of a warm stimulus, and FIG. 39B shows the case of a cold stimulus, and the figures illustrate only significant differences from Pad (finger pad only) while having $p<0.05$ (multiple comparison by ANOVA and Ryan method).

As a result, as shown in FIG. 39, in Both (side and pad) and Pad (pad only), both warmth and coldness were perceived stronger in Both than in Pad. Also, in Pad (pad only) and Side (side only), Pad weak and Side strong were perceived to have equal strength under the warm stimulus. Also, under the cold stimulus, Pad weak and Side strong were also perceived to have equal strength.

As the consideration of Experiment 1 according to the second exemplary embodiment, it was confirmed that, by applying warm/cold stimulation to the finger side surface portion at the moment when the finger pad came into contact with the object, a finger cooling feeling that was equivalent to the feeling felt when the temperature of the finger pad was actually changed was able to be perceived.

Subsequently, as Experiment 2 according to the second exemplary embodiment, the presentation position of warm/cold stimulation and the presence or absence of a pressure/vibration stimulus were examined. The purpose of Experiment 2 was to evaluate a warm/cold feeling perceived at each of the finger pad and the side surface when the finger pad was in contact with the object in advance or was not in contact with the object, in other words, how the warm/cold feeling was affected by the presence or absence of a pressure stimulus was experimentally checked.

In the case where the pad was in contact with the object, the influence of the presentation position (one side and both sides) of the warm/cold stimulation on a side surface portion and the influence of the presence or absence of a vibration stimulus were evaluated. There were twelve female subjects aged from 19 to 21 years old, and no prior knowledge regarding the experimental hypothesis was provided to the subjects. The skin temperature of the finger pad was adjusted to 32 degrees in advance.

Figure 40:
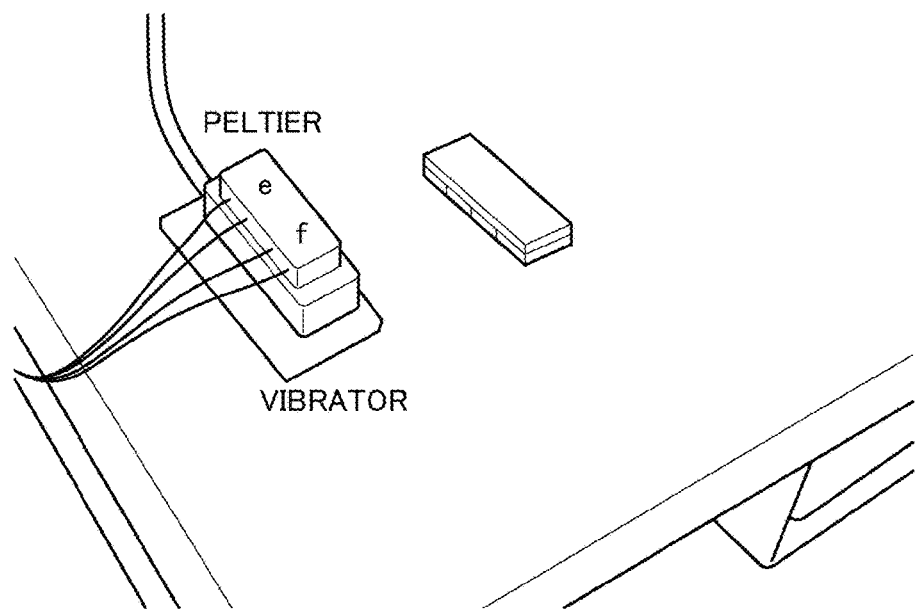
FIG. 40 is a diagram showing an experimental device for Experiment 2 according to the second exemplary embodiment.

FIG. 40 is a diagram showing an experimental device for Experiment 2 according to the second exemplary embodiment. As in Experiment 1, a Peltier element was attached to the side surface of the finger, and the skin temperature was adjusted using a hot plate. As shown in FIG. 40, on the hot plate, a Peltier element (parts indicated by e and b) to be touched and an aluminum plate for rest were placed. A vibrator (TECHTILE Toolkit) was provided under the Peltier element.

As an experimental method of Experiment 2 according to the second exemplary embodiment, at intervals of 30 seconds, the subjects touched an object to be touched at the same time a signal was provided or kept their fingers in the air. The subjects were asked to feel a randomly chosen stimulus for two seconds and asked to answer the stimulus strength felt at the pad and side surface portion of the finger in a numerical number while setting the perceived strength with respect to a standard stimulus as 100. The experiment was conducted for one trial for each condition.

Figure 41:
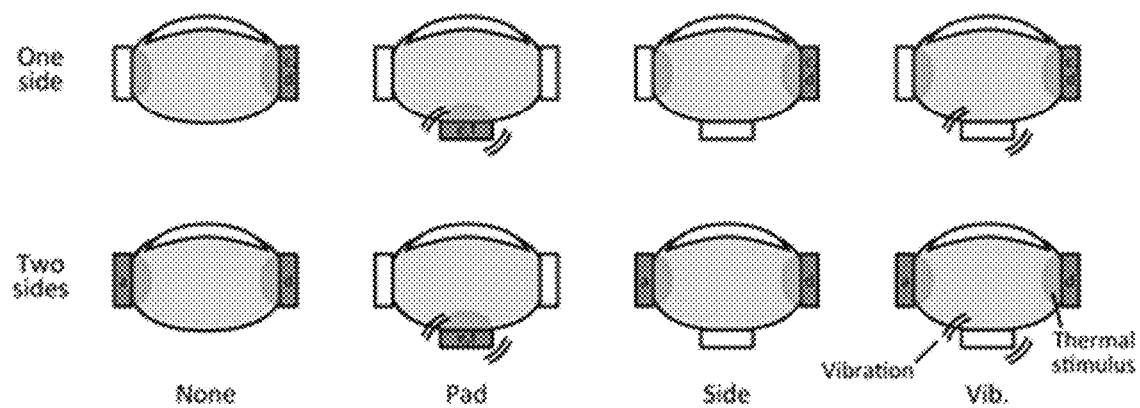
FIG. 41 is a diagram schematically showing a position at which a thermal stimulus is provided, when a finger is viewed from the fingertip side.

As the experimental conditions for Experiment 2 according to the second exemplary embodiment, the types of the stimulation were set to be two kinds: warm; and cold. Further, as shown in FIG. 41, there were four kinds of stimulation presentation conditions, which were: None (no pad contact); Pad (pad only); Side (side surface only without vibration); and Vib (side surface only with vibration). FIG. 41 is a diagram schematically showing a position at which a thermal stimulus is provided, when a finger is viewed from the fingertip side. As shown in FIG. 41, two Peltier elements were used for each of the pad and the side surface. There were two kinds of stimulation strength: warm and strong 4° C./s, warm and weak 3° C./s, cold and strong 3° C./s, and cold and weak 2° C./s. A vibration stimulus was applied to the finger pad at 200 Hz for 0.1 second immediately before the warm/cold stimulation. A strong stimulus to Pad (finger pad) was used as the standard stimulus, and the strength of the standard stimulus was checked for every eight trials.

Figure 42:
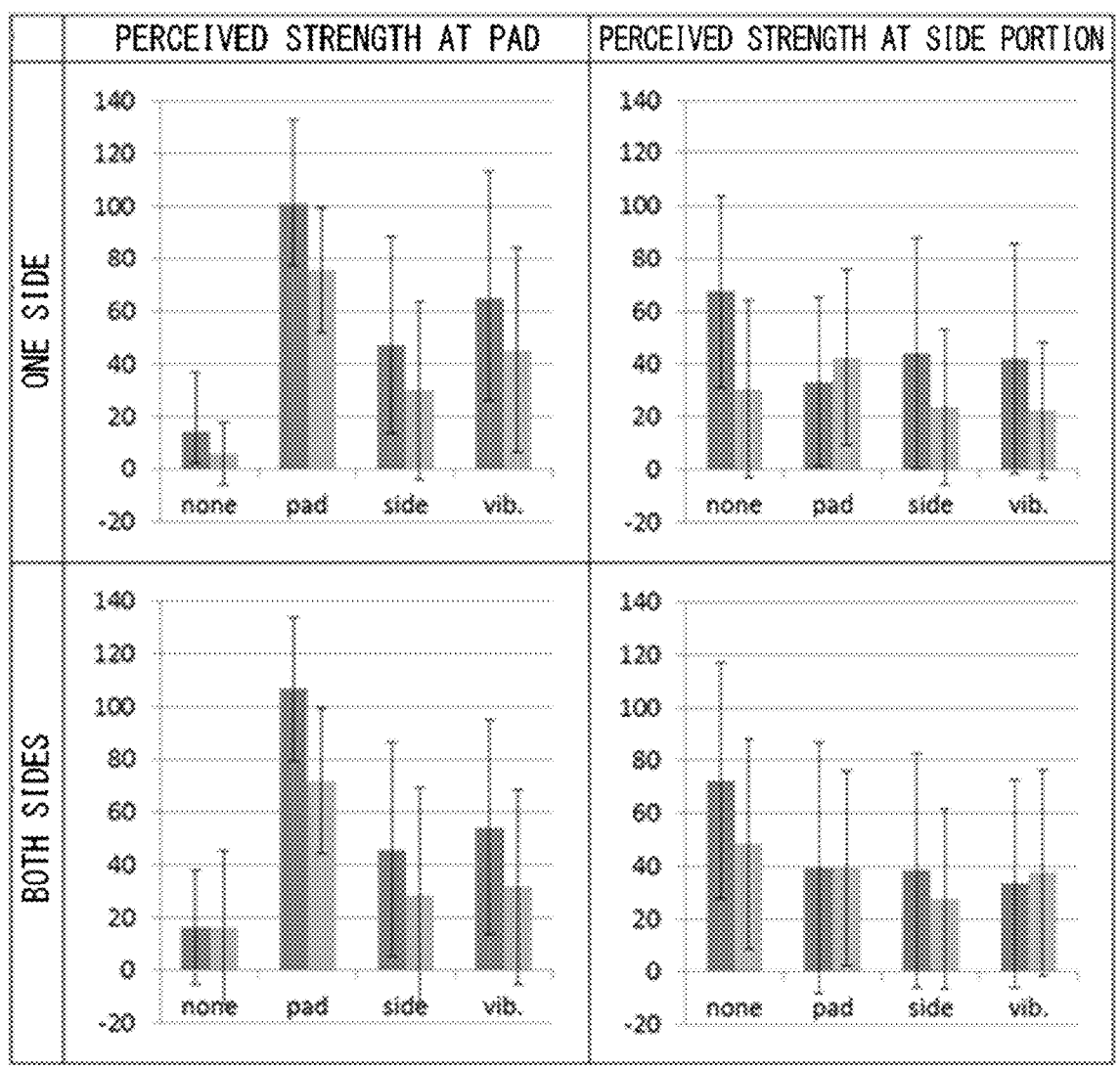
FIG. 42 is a graphic diagram showing experimental results of Experiment 2 according to the second exemplary embodiment in the case of a warm stimulus.
Figure 43:
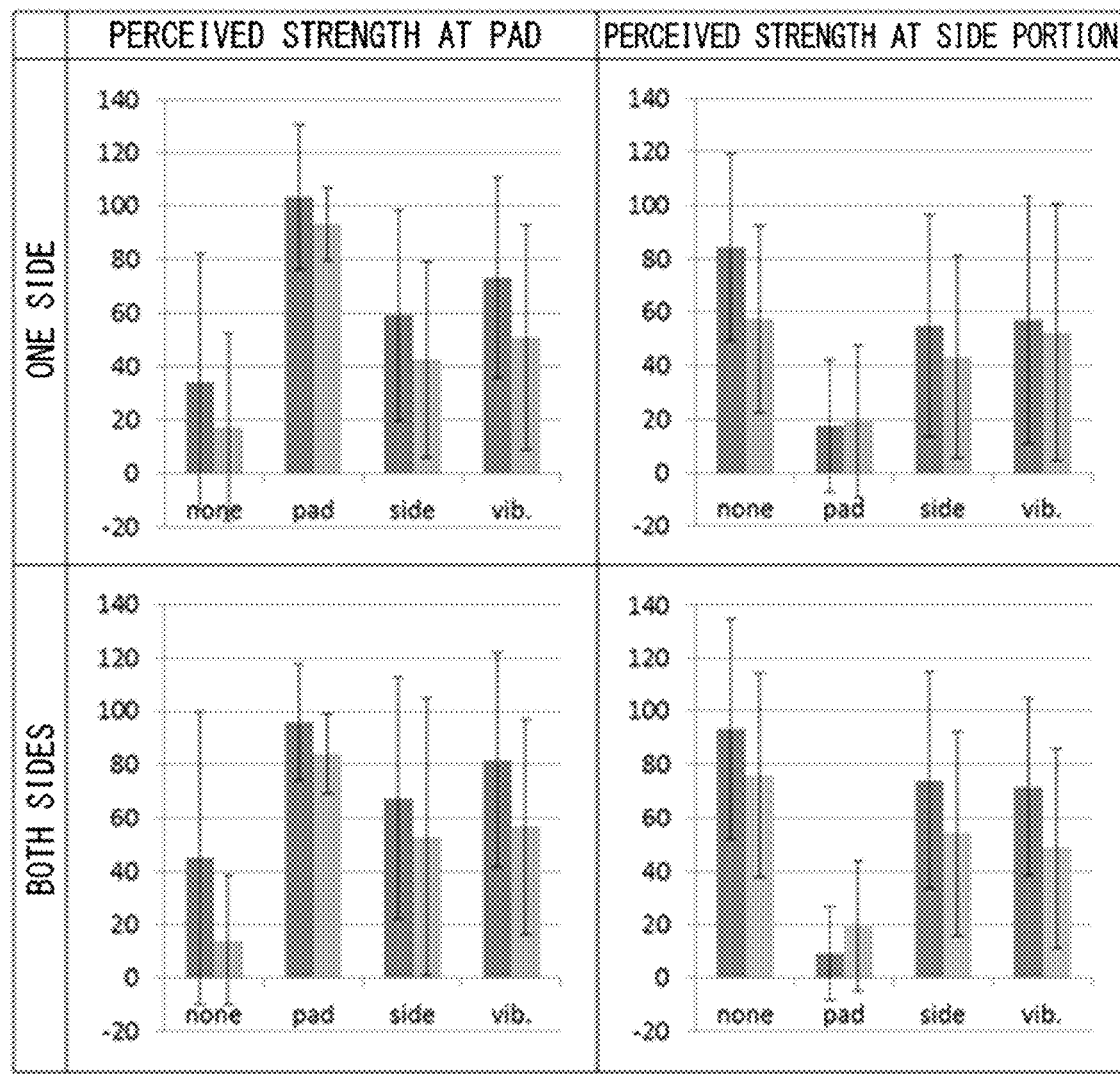
FIG. 43 is a graphic diagram showing experimental results of Experiment 2 according to the second exemplary embodiment in the case of a cold stimulus.

FIG. 42 is a graphic diagram showing experimental results of Experiment 2 according to the second exemplary embodiment in the case of a warm stimulus. FIG. 43 is a graphic diagram showing experimental results of Experiment 2 according to the second exemplary embodiment in the case of a cold stimulus. As in FIG. 39, the strong stimulus is shown by a thick bar graph, and the weak stimulus is shown by a light bar graph.

As shown in FIG. 42, in the case of the warm stimulus, no warm feeling was perceived at the pad without any contact with the stimulus to a side surface portion in both case of one side and both sides. When the stimulus was given only to the finger pad, a warm feeling was slightly perceived on a side portion. In the perceived strength at the pad, analysis of variance caused by the stimulation position on the side surface portion, the presence or absence of a vibration stimulus, and the stimulation strength was conducted, and the result shows a significant difference only in the main effect of the stimulation strength (F (1.95)=10.16, p<0.01). On the other hand, there was no significant difference in the main effect of the stimulation position and the presence or absence of the vibration stimulus (F (1.95)=0.80, p=0.39. F (1.95)=1.131, p<0.31).

In the perceived strength at the side portion, there was a significant difference in the interaction between the position and the strength (F (1.95)=4.85, p<0.05), and, as a result of multiple comparison, there was a significant difference in the strength in the case of one side stimulation (p<0.05).

As shown in FIG. 43, in the case of the cold stimulus, there was a case where a cold feeling was slightly perceived at the pad without any contact with the stimulus to a side surface portion in both cases of one side and both sides. On the other hand, when the stimulus was given only to the finger pad, no cold feeling was perceived on the side portion. In the perceived strength at the pad, analysis of variance caused by the stimulation position on the side surface portion, the presence or absence of a vibration stimulus, and the stimulation strength was conducted, and the result shows a significant difference only in the main effect of the presence or absence of the vibration stimulus and the stimulation strength (F (1.95)=5.55, p<0.05, F (1.95)=7.74, P<0.05). There was no significant difference in the main effect of the stimulation position (F (1.95)=0.76, p<0.40). Regarding the perceived strength at the side portion, there was a significant difference in the main effect of the strength (F (1.95)=10.45, p<0.01).

Based on Experiment 2 above, it was found that tactile stimulation to the finger pad was important in the presentation of a warm/cold feeling to the finger pad. Further, it was found that a warm/cold feeling was able to be presented to the pad even in the case of a pressure stimulus alone. Moreover, it was found that a warm/cold feeling was able to be presented to the pad even in the case of stimulation to one side of the side surface portion. In other words, since there was no difference between the case of one side and the case of both sides and there was no warm/cold feeling generated at the pad when there was no contact, it was considered that this phenomenon that was generated was not a phantom sensation phenomenon but a phenomenon similar to thermal referral. However, since there was a case where cold sensation was perceived at the pad even without any contact in the case of cold stimulation, there is a possibility that this is a completely new phenomenon different from thermal referral.

As a preliminary experiment (Experiment 3) of the second exemplary embodiment, basic checking was conducted on the following three items.
a. presence or absence of contact+thermal stimulus
b. presence or absence of vibration stimulus+thermal stimulus
c. pressure stimulus+vibration stimulus+thermal stimulus There were two female subjects, and the skin temperature of the finger was adjusted to 32 degrees. In the experimental device, as shown in FIG. 36, the Peltier element was attached on the side surface of the finger, and the stimulation strength was set to be about 3.5° C./s, and the stimulation time was set to be 2 seconds. As for the vibration stimulus, the TECHTILE Toolkit was used, and the frequency was set to be 200 Hz.

As an experiment method for Experiment 3 (a. presence or absence of contact+thermal stimulus) according to the second exemplary embodiment, a target object (plastic resin) was touched as soon as an alarm sounded, and a thermal stimulus was started at a specific time before and after the alarm (−2 seconds to +2 seconds, 9 types in increments of 0.5 seconds). Then, the subjects were asked to answer the thermal sensation felt at the finger pad using a numerical value (cold: −3 points to +3 points: warm). Two trials were conducted for each condition.

Figure 44:
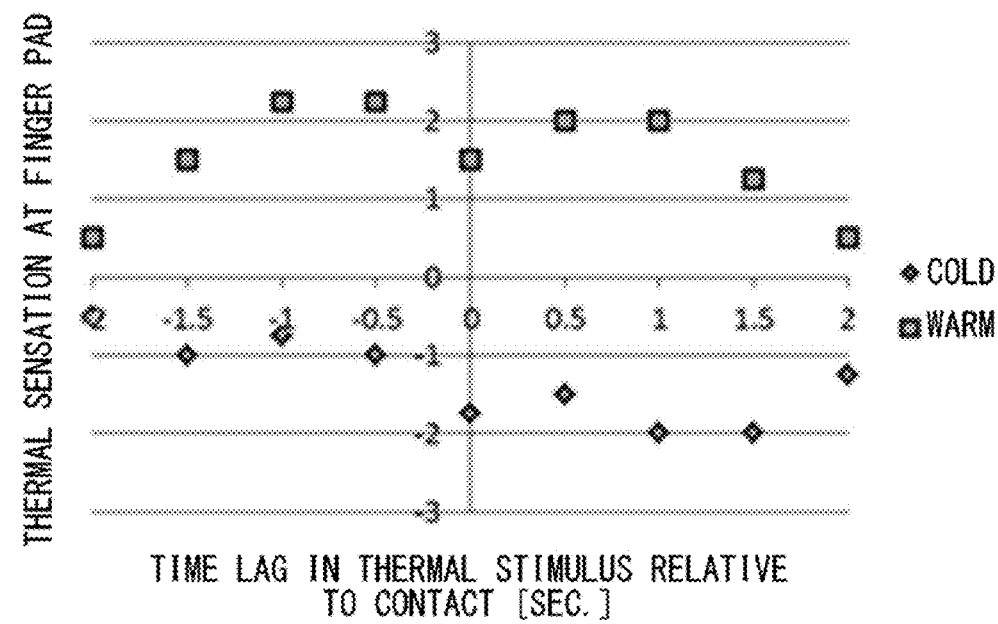
FIG. 44 is a diagram showing a time lag in thermal sensation relative to contact according to Experiment 3 (a. presence or absence of contact+thermal stimulus)

FIG. 44 is a diagram showing a time lag in thermal sensation relative to contact according to Experiment 3 (a. presence or absence of contact+thermal stimulus). As shown in FIG. 44, it was found that the thermal sensation at the finger pad did not occur when the time lag was about ±2 seconds. It is desirable to present a thermal stimulus earlier than a vibration stimulus in the case of warm sensation and to present a thermal stimulus and a vibration stimulus simultaneously in the case of cold sensation. Based on psychophysical knowledge, it is known that warm sensation is felt belatedly, and it is possible that this possibly had an effect. Also, as a subjective impression, the sensation was felt the strongest when the temperature of the skin changed at the same time as the contact, feeling that the subject was touching a warm (or cold) plastic resin.

Subsequently, an experiment was conducted regarding a time lag in thermal sensation relative to vibration through Experiment 3 (b. presence or absence of vibration stimulus+thermal stimulus). As the experimental method, the subjects were asked to wait while touching a plastic resin, and a stimulus was presented by vibrating the plastic. A thermal stimulus was started at a specific time before and after the vibration stimulus (−2 seconds to +2 seconds, 9 types in increments of 0.5 seconds). Then, the subjects were asked to answer the thermal sensation felt at the finger pad using a numerical value (cold: −3 points to +3 points: warm). Two trials were conducted for each condition.

Figure 45:
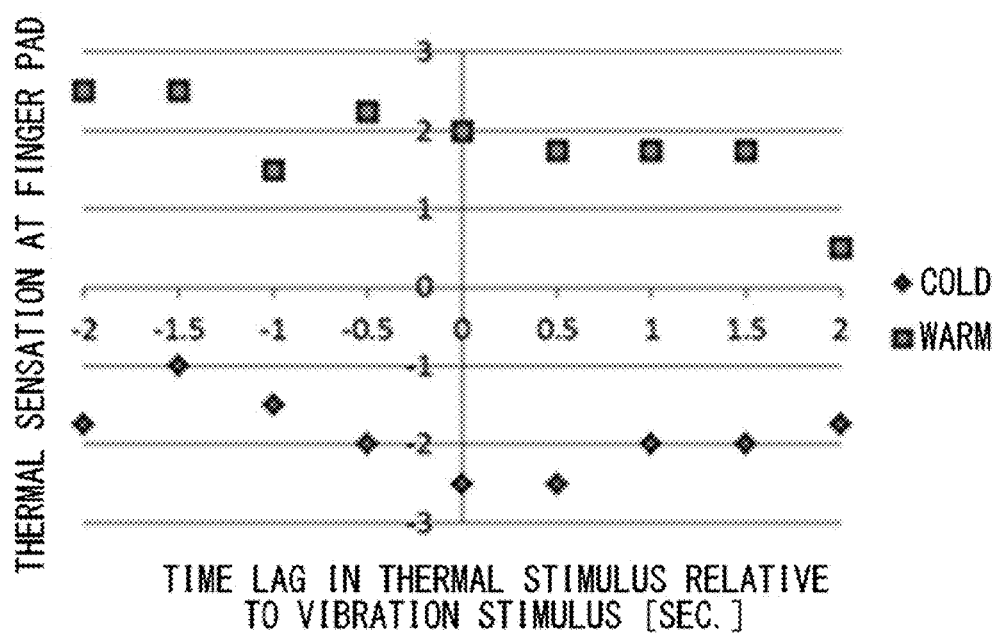
FIG. 45 is a diagram showing a time lag in thermal sensation relative to vibration according to Experiment 3 (b. presence or absence of vibration stimulus+thermal stimulus).

FIG. 45 is a diagram showing a time lag in thermal sensation relative to vibration according to Experiment 3 (b. presence or absence of vibration stimulus+thermal stimulus). As a result of the experiment, the change in thermal sensation due to time differences was small compared with Experiment a. Due to the influence of the contact pressure with the vibrator, there was a possibility that a certain degree of thermal sensation would be generated regardless of the presence or absence of a vibration stimulus. Strong sensation was able to be obtained when presenting a warm stimulus earlier and presenting a cold stimulus simultaneously as in the same way as in Experiment a.

Subsequently, a time lag in thermal perception due to the combination of a pressure stimulus and a vibration stimulus was examined through Experiment 3 (pressure stimulus+vibration stimulus+thermal stimulus). As the experimental method, the subjects touched a plastic resin with a force of about 20 g weight, about 100 g weight, or about 250 g weight, and a stimulus was presented by vibrating the plastic. A thermal stimulus was started at a specific time before and after the vibration stimulus (−2 seconds to +2 seconds, 9 types in increments of 0.5 seconds). Then, the subjects were asked to answer the thermal sensation felt at the finger pad using a numerical value (cold: −3 points to +3 points: warm). One trial was conducted for each condition.

TABLE 2

| | pressure stimulus + vibration stimulus + thermal stimulus (median, cold stimulus) | | |
|---|---|---|---|
| TIME DIFFERENCE [SEC.] | ABOUT 20 G WEIGHT | ABOUT 100 G WEIGHT | ABOUT 250 G WEIGHT |
| −2 | −0.5 | −0.75 | −0.75 |
| 0 | −2.25 | −1.75 | −1.5 |
| 2 | −1.25 | −0.5 | −1.25 |

Table 2 is a table showing the time lag in thermal perception due to the combination of a pressure stimulus and a vibration stimulus in the case of a cold stimulus. Table 3 is a table showing the time lag in thermal perception due to the combination of the pressure stimulus and the vibration stimulus in the case of a warm stimulus. The influence of the contact pressure was a little, and there was a possibility that the weaker the contact pressure, the easier it was to obtain the thermal sensation. In the same way as in Experiments a and b, it was considered that the sensation did not become so weak even if the warm stimulus was presented earlier.

TABLE 3

| | pressure stimulus + vibration stimulus + thermal stimulus (median, warm stimulus) | | |
|---|---|---|---|
| TIME DIFFERENCE [SEC.] | ABOUT 20 G WEIGHT | ABOUT 100 G WEIGHT | ABOUT 250 G WEIGHT |
| −2 | 1.75 | 2 | 1.5 |
| 0 | 2 | 2.25 | 2 |
| 2 | 1.5 | 1.25 | 1.25 |

Based on the second exemplary embodiment above, the following knowledge was obtained. Based on the second exemplary embodiment, it was found that the sensation obtained by shifting the timing for the cold stimulus relative to a tactile stimulus became weakened. Further, it was found that the sensation was difficult to obtain when the timing was shifted by around ±2 seconds. It was found that the timing for a heat stimulus relative to a tactile stimulus might depend on the time it takes to perceive the heat stimulus, and in the case of a warm stimulus, the sensation that could be obtained became stronger when the timing was advanced compared to when the timing was the same. However, when applying a vibration stimulus in a state where the finger is always in contact with the vibrator, not a little sensation will be generated. The need for providing a context indicating that the finger came into contact with the object when vibration started was considered. The strength of a pressure stimulus did not affect the sensation obtained.

As described above, according to the present embodiments including the second exemplary embodiment, while arranging the presentation elements of all of electricity, force, temperature, vibration, or any combination thereof in different parts on the human skin, it is possible to constitute a tactile sensation presentation device designed to feel a stimulus at one place, as an effect.

Further, according to the present embodiments, by arranging force presentation at the point of application of a stimulus and arranging an stimulator for any one of vibration, temperature, and an electrical stimulus or an arbitrary combination thereof at a place that is physically apart, the sensation for the stimulus can be localized at the point of application of force by a phenomenon such as phantom sensation. Further, clarification of an image localized by phantom sensation or the like through the presentation of force allows the presentation sites for the haptic primary colors of force, electricity, vibration, and temperature to coincide with one another.

Further, according to the present embodiments, by arranging force presentation at the point of application of a stimulus and arranging a stimulator for either one of vibration and temperature or both at a place that is physically apart, the sensation for the stimulus can be localized at the point of application of force by phantom sensation or the like. Further, clarification of an image localized by phantom sensation or the like through the presentation of force allows the presentation sites for the haptic primary colors of force, vibration, and temperature to coincide with one another.

Further, according to the present embodiments, by arranging electrical stimulus presentation at the point of application of a stimulus and arranging either one of vibration and temperature or both at a place that is physically apart, the sensation for the stimulus can be localized at the point of application of force by phantom sensation or the like. Further, clarification of an image localized by phantom sensation or the like through the presentation of an electrical stimulus allows the presentation sites for the haptic primary colors of electricity, vibration, and temperature to coincide with one another.

Further, according to the present embodiments, by arranging vibration presentation at the point of application of a stimulus and arranging temperature at a place that is physically apart, the sensation for the stimulus can be localized at the point of application of vibration by phantom sensation or the like. Further, clarification of an image localized by phantom sensation or the like through the presentation of vibration allows the presentation sites for the haptic primary colors of vibration and temperature to coincide with one another.

Described above is the explanation of the present embodiments including the first and second exemplary embodiments.

Another Embodiment

The embodiments of the present invention have been described thus far. However, the present invention may be realized in various different embodiments other than the above-described embodiments within the scope of the technical idea described in the scope of the claims.

For example, an example has been explained where the tactile information conversion device 100 includes the input unit 112 and the output unit 114. However, the present invention is not limited to this example, and the tactile information conversion device 100, without including the input unit 112 or the output unit 114, may be formed as an independent housing. In that case, the tactile information conversion device 100 may perform processing in response to a request from a client terminal such as the external device 200 and return the processing result to the client terminal.

Of all the processes explained in the embodiments, all or some of the processes explained as processes that are performed automatically can be also performed manually; alternatively, all or some of the processes explained as processes that are performed manually can be also performed automatically using a publicly-known method.

In addition to this, the processing procedures, control procedures, specific names, information including parameters such as registration data and search conditions of each processing, screen examples, and database configuration shown in the above documents and the figures can be changed arbitrarily unless otherwise specified.

With respect to the tactile feeling presentation system, the respective constituent elements shown in the figures are functionally conceptual and do not necessarily need to be physically configured as shown in the figures.

For example, all or some of the processing function of each device of the tactile information conversion device 100, particularly each processing function performed by the control unit 102, may be realized by a processor such as a CPU (Central Processing Unit) and a program interpreted and executed by the processor or may be realized as a hardware processor using wired logics. The program is recorded in a non-transitory computer readable recording medium including a programmed instruction for causing a computer to execute the method according to the present invention, which will be described later, and is mechanically read by the tactile information conversion device 100 and the external device 200, if necessary. In other words, in the storage unit 106 such as ROM or HDD (Hard Disk Drive), etc., a computer program for giving instructions to the CPU in cooperation with the OS (Operating System) and performing various processes is recorded. This computer program is executed by being loaded into the RAM and cooperates with the CPU so as to constitute a control unit.

Furthermore, this computer program may be stored in an application program server connected to the tactile information conversion device 100, the external device 200, the external input device 120, and the external output device 140 via an arbitrary network 300, and all or a part of the computer program can be downloaded, if necessary.

Furthermore, the program according to the present invention may be stored in a computer-readable recording medium and can be configured as a program product. This "recording medium" includes an arbitrary "portable physical medium" such as a memory card, a USB memory, an SD card, a flexible disk, a magneto-optical disk, a ROM, an EPROM, an EEPROM, a CD-ROM, an MO, a DVD, and a Blu-ray (registered trademark) Disc, etc.

Also, the "program" is a data processing method described in an arbitrary language and by a description method, regardless of the form of the source code, the binary code, etc. The "program" is not necessarily limited to those constituted in a single manner and may include those constituted in a distributed manner as a plurality of modules or libraries and those that achieve the functions thereof in cooperation with a separate program represented by an OS (Operating System). For a specific configuration for reading the recording medium in each of the devices shown in the embodiments, the procedure for the reading, an installation procedure after the reading, and the like, well-known configuration and procedures can be used. The present invention may be configured as a program product in which the program is recorded in a non-transitory computer-readable recording medium.

Various databases and the like (the tactile sensation definition file 106a, the object tactile feeling database 106b, etc.) stored in the storage unit 106 are memory devices such as RAM or ROM, fixed disk devices such as hard disks, flexible disks, and storage means such as optical disks and store various programs, tables, databases, files for web pages, etc., used for various processes and for providing websites.

Further, the tactile information conversion device 100, the external device 200, the external input device 120, and the external output device 140 may be configured as information processing devices such as known personal computers, workstations, etc., and may be configured by connecting an arbitrary peripheral device to the information processing devices. Further, the tactile information conversion device 100, the external device 200, the external input device 120, and the external output device 140 may be realized by mounting software (including programs, data, and the like) for realizing the method according to the present invention in the information processing devices.

Furthermore, specific forms of device distribution and integration are not limited to those shown in the figures, and all or a part thereof may be configured in a functionally or physically distributed and integrated manner in arbitrary units in accordance with the function load. In other words, the above-described embodiments may be arbitrarily combined for implementation, or the embodiments may be selectively implemented.

Additional Statement 1

A tactile information conversion device comprising at least a control unit in order to provide tactile information to an output unit capable of outputting physical quantities including at least electricity and including force, temperature, vibration, and/or time and space, wherein the control unit includes:

a generation unit that selects at least two or more of the physical quantities according to a tactile feeling to be presented and also generates tactile information for presenting the predetermined tactile feeling based on the physical quantities that have been selected; and an output control unit that outputs the tactile information generated by the generation unit to the output unit.

Additional Statement 2

The tactile information conversion device according to Additional Statement 1, wherein the outputting of electricity among the physical quantities is the presentation of an electrical stimulus to a tactile receptor.

Additional Statement 3

The tactile information conversion device according to Additional Statement 1 or 2, wherein the tactile feeling represents a psychological texture.

Additional Statement 4

The tactile information conversion device according to any one of Additional Statements 1 through 3, wherein, when presenting a tactile feeling due to a temporal change in force, the generation unit selects at least the electricity and time and space physical quantities and generates tactile information for presenting the predetermined tactile feeling based on the physical quantities that have been selected.

Additional Statement 5

The tactile information conversion device according to any one of Additional Statements 1 through 4, wherein the generation unit generates the tactile information such that a stimulus by electricity, force, or vibration that is stronger than that in the case of a hard surface or a stimulus by electricity, force, or vibration in an area wider than that in the case of a hard surface is applied in the process of transition or the process of body displacement from a non-contact state to a contact state, and wherein the output control unit presents a soft psychological texture based on the tactile information generated by the generation unit.

Additional Statement 6

The tactile information conversion device according to any one of Additional Statements 1 through 5, wherein the generation unit generates the tactile information such that a stimulus by electricity, force, or vibration that is stronger than that in the case of a hard surface or a stimulus by electricity, force, or vibration in an area wider than that in the case of a hard surface is applied in the process of transition or the process of body displacement from a contact state to a non-contact state, and wherein the output control unit presents a sticky psychological texture based on the tactile information generated by the generation unit.

As described in detail in the above, according to the present invention, a tactile information conversion device, a tactile information conversion method, and a tactile information conversion program, which are usable for general purposes by presenting or an arbitrary tactile feeling, and a recording medium can be provided, and the present invention is thus industrially useful.

For example, by using the present invention, for example, by moving a robot in a remote place as the own body so as to obtain experience, the present invention can be used in industrial fields such as remote operation and remote work fields, nursing care and health fields, communication and learning fields for skillful technology, media and broadcast technology, virtual sports, entertainment fields, mobile, wearable fields, etc.

What is claimed is:

1. An input device comprising a tactile information conversion device,
    the tactile information conversion device comprising:
        at least a control unit in order to provide tactile information to an output unit capable of outputting physical quantities including at least electricity and including force, temperature, vibration, and/or temporal and/or spatial changes in the electricity, force, temperature and vibration,
        wherein the control unit includes:
            a generation unit that selects at least two or more of the physical quantities according to a tactile feeling to be presented and also generates tactile information for presenting the predetermined tactile feeling based on the physical quantities that have been selected; and
            an output control unit that outputs the tactile information generated by the generation unit to the output unit,
        wherein the outputting of electricity among the physical quantities is the presentation of an electrical stimulus to a tactile receptor,
        wherein the electrical stimulus is applied by a stimulating electrode through skin,
        the input device comprising at least:
            a multipoint distribution type pressure sensation measurement sensor on a surface layer;
            a warm/cold feeling measurement sensor in an intermediate layer; and
            a vibration feeling measurement sensor in a lower layer.

2. An output device comprising a tactile information conversion device,
    the tactile information conversion device comprising:
        at least a control unit in order to provide tactile information to an output unit capable of outputting physical quantities including at least electricity and including force, temperature, vibration, and/or temporal and/or spatial changes in the electricity, force, temperature and vibration,
        wherein the control unit includes:
            a generation unit that selects at least two or more of the physical quantities according to a tactile feeling to be presented and also generates tactile information for presenting the predetermined tactile feeling based on the physical quantities that have been selected; and
            an output control unit that outputs the tactile information generated by the generation unit to the output unit,
        wherein the outputting of electricity among the physical quantities is the presentation of an electrical stimulus to a tactile receptor,
        wherein the electrical stimulus is applied by a stimulating electrode through skin,
        the output device comprising at least:
            a distribution-type pressure presentation unit using a multipoint electrical tactile sensation stimulus on a surface layer;
            a high-speed driving type warm/cold feeling presentation unit using a Peltier element in an intermediate layer; and
            a vibration presentation unit in a lower layer.

3. An interaction operation system that teaches motion to a robot by using a robot teaching device operated by an operator, the interaction operation system comprising a tactile information conversion device,
    the tactile information conversion device comprising:
        at least a control unit in order to provide tactile information to an output unit capable of outputting physical quantities including at least electricity and including force, temperature, vibration, and/or temporal and/or spatial changes in the electricity, force, temperature and vibration,
        wherein the control unit includes:
            a generation unit that selects at least two or more of the physical quantities according to a tactile feeling to be presented and also generates tactile information for presenting the predetermined tactile feeling based on the physical quantities that have been selected; and
            an output control unit that outputs the tactile information generated by the generation unit to the output unit,
        wherein the outputting of electricity among the physical quantities is the presentation of an electrical stimulus to a tactile receptor,
        wherein the electrical stimulus is applied by a stimulating electrode through skin,
        wherein the robot has:
            a finger portion for holding an object;

an object detection unit that detects the object or the characteristics of the object and generates object detection information and that is arranged in the finger portion; and a robot driving device that drives the robot, and wherein the robot teaching device has:

an object detection sensation providing unit that provides a corresponding tactile feeling to the operator in accordance with tactile information converted by the tactile information conversion device based on the object detection information transmitted from the robot.

4. A tactile information conversion device comprising:

at least a control unit in order to provide tactile information to an output unit capable of outputting physical quantities including at least electricity and including force, temperature, vibration, and/or temporal and/or spatial changes in the electricity, force, temperature and vibration, wherein the control unit includes:

a generation unit that selects at least two or more of the physical quantities according to a tactile feeling to be presented and also generates tactile information for presenting the predetermined tactile feeling based on the physical quantities that have been selected; and an output control unit that outputs the tactile information generated by the generation unit to the output unit, wherein the outputting of electricity among the physical quantities is the presentation of an electrical stimulus to a tactile receptor, wherein the electrical stimulus is applied by a stimulating electrode through skin, wherein the generation unit generates the tactile information such that a stimulus by electricity, force, or vibration that is stronger than that in the case of a hard surface or a stimulus by electricity, force, or vibration in an area wider than that in the case of a hard surface is applied in the process of transition or the process of body displacement from a non-contact state to a contact state, and wherein the output control unit presents a soft psychological texture based on the tactile information generated by the generation unit.

5. A tactile information conversion device comprising:

at least a control unit in order to provide tactile information to an output unit capable of outputting physical quantities including at least electricity and including force, temperature, vibration, and/or temporal and/or spatial changes in the electricity, force, temperature and vibration, wherein the control unit includes:

a generation unit that selects at least two or more of the physical quantities according to a tactile feeling to be presented and also generates tactile information for presenting the predetermined tactile feeling based on the physical quantities that have been selected; and an output control unit that outputs the tactile information generated by the generation unit to the output unit, wherein the outputting of electricity among the physical quantities is the presentation of an electrical stimulus to a tactile receptor, wherein the electrical stimulus is applied by a stimulating electrode through skin, wherein the generation unit generates the tactile information such that a stimulus by electricity, force, or vibration that is stronger than that in the case of a hard surface or a stimulus by electricity, force, or vibration in an area wider than that in the case of a hard surface is applied in the process of transition or the process of body displacement from a contact state to a non-contact state, and wherein the output control unit presents a sticky psychological texture based on the tactile information generated by the generation unit.

6. A tactile information conversion device, comprising at least a detection unit and a control unit in order to provide tactile information to an output unit capable of outputting physical quantities including electricity, force, temperature, vibration, and/or temporal and/or spatial changes in the electricity, force, temperature and vibration, wherein the detection unit is capable of detecting physical quantities including force, temperature, vibration, and/or temporal and/or spatial changes in force, temperature, and vibration, wherein the control unit includes:

a generation unit that selects at least one of the physical quantities in accordance with a tactile feeling to be presented and also generates tactile information for presenting the predetermined tactile feeling based on the physical quantities that have been selected; and an output control unit that outputs the tactile information generated by the generation unit to the output unit, wherein the outputting of electricity among the physical quantities is the presentation of an electrical stimulus to a tactile receptor, wherein the electrical stimulus is applied by a stimulating electrode through skin, wherein the generation unit selects the physical quantity in association with at least two axes among a roughness and smoothness axis according to force, a hardness and softness axis according to vibration, and a dryness and wetness axis according to temperature in accordance with the tactile feeling to be presented, wherein the generation unit conducts learning by updating a map of the at least two axes in which a physical quantity detected by the detection unit for a sample with an already-known tactile feeling and the tactile feeling are associated with each other.

7. A tactile information conversion device comprising at least a detection unit and a control unit in order to obtain tactile information, wherein the detection unit is capable of detecting physical quantities including electricity, temperature, vibration, and/or temporal and/or spatial changes in the electricity, force, temperature, and vibration, and wherein the control unit acquires the tactile information for presenting a corresponding tactile feeling by making association with at least two axes among a roughness and smoothness axis according to force, a hardness and softness axis according to vibration, and a dryness and wetness axis according to temperature based on the physical quantities detected by the detection unit.

8. The tactile information conversion device according to claim 7, wherein the control unit conducts learning by updating a map of the at least two axes in which a physical quantity detected by the detection unit for a sample with an already-known tactile feeling and the tactile feeling are associated with each other.

* * * * *